US007885358B2

(12) United States Patent
Kim et al.

(10) Patent No.: US 7,885,358 B2
(45) Date of Patent: Feb. 8, 2011

(54) DIGITAL BROADCASTING SYSTEM AND METHOD OF PROCESSING DATA

(75) Inventors: Jong Moon Kim, Gyeonggi-do (KR); In Hwan Choi, Gyeonggi-do (KR); Kook Yeon Kwak, Gyeonggi-do (KR); Byoung Gill Kim, Seoul (KR); Won Gyu Song, Seoul (KR); Jin Woo Kim, Seoul (KR); Hyoung Gon Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 456 days.

(21) Appl. No.: 12/061,574

(22) Filed: Apr. 2, 2008

(65) Prior Publication Data

US 2008/0304602 A1 Dec. 11, 2008

Related U.S. Application Data

(60) Provisional application No. 60/911,508, filed on Apr. 12, 2007.

(30) Foreign Application Priority Data

Apr. 2, 2007 (KR) ...................... 10-2007-0032439

(51) Int. Cl.
*H04L 27/06* (2006.01)
(52) U.S. Cl. .................. 375/316; 375/240.27; 375/265; 714/746
(58) Field of Classification Search ................. 375/265, 375/232, 316, 240.28, 240.27; 714/755, 714/784, 790, 746; 348/406.1
See application file for complete search history.

(56) References Cited

U.S. PATENT DOCUMENTS 6,553,538 B2    4/2003    Zehavi (Continued)

FOREIGN PATENT DOCUMENTS

WO    03069885 A2    8/2003

(Continued)

OTHER PUBLICATIONS

ATSC "Recommended practice: Guide to the Use of the ATSC Digital Television Standard, including Corrigendum No. 1" ATSC Doc. A/54A, Dec. 4, 2003.

(Continued)

*Primary Examiner*—Chieh M Fan
*Assistant Examiner*—Aristocratis Fotakis
(74) *Attorney, Agent, or Firm*—Lee, Hong, Degerman, Kang & Waimey

(57) ABSTRACT

A digital broadcast system including a broadcast receiving system and data processing method are disclosed. In the broadcast receiving system receiving broadcast signals, the broadcast receiving system includes a transmission parameter decoding unit, a known sequence detector, and a burst controller. The transmission parameter decoding unit detects information on a burst of a received signal from broadcast data having main service data and mobile service data multiplexed therein within a field of the received signal and outputs the detected information on the burst. The known sequence detector receives burst information from the transmission parameter decoding unit and uses the received burst information and known data position information included in the received data, so as to output burst control information. The burst controller uses the burst control information to control power supply of the broadcast receiving system.

10 Claims, 32 Drawing Sheets

U.S. PATENT DOCUMENTS

| | | |
|---|---|---|
| 7,030,935 B2 | 4/2006 | Choi |
| 2002/0172277 A1* | 11/2002 | Choi et al. ............. 375/240.01 |
| 2004/0260985 A1 | 12/2004 | Krieger |
| 2005/0162886 A1* | 7/2005 | Jeong et al. .................... 365/63 |
| 2005/0249301 A1* | 11/2005 | Jeong et al. ................. 375/265 |
| 2007/0019579 A1* | 1/2007 | Xu et al. ....................... 370/312 |
| 2007/0033475 A1* | 2/2007 | Park et al. .................... 714/746 |
| 2007/0253502 A1* | 11/2007 | Park et al. .................... 375/265 |
| 2008/0301477 A1* | 12/2008 | Gade et al. .................. 713/320 |

FOREIGN PATENT DOCUMENTS

| | | |
|---|---|---|
| WO | 2005109878 A1 | 11/2005 |

OTHER PUBLICATIONS

ETSI "Digital Video Broadcasting (DVB); DVB-H Implementation Guidelines", ETSI TR 102 377 V1.2.1, Nov. 2001.

* cited by examiner

FIG. 26
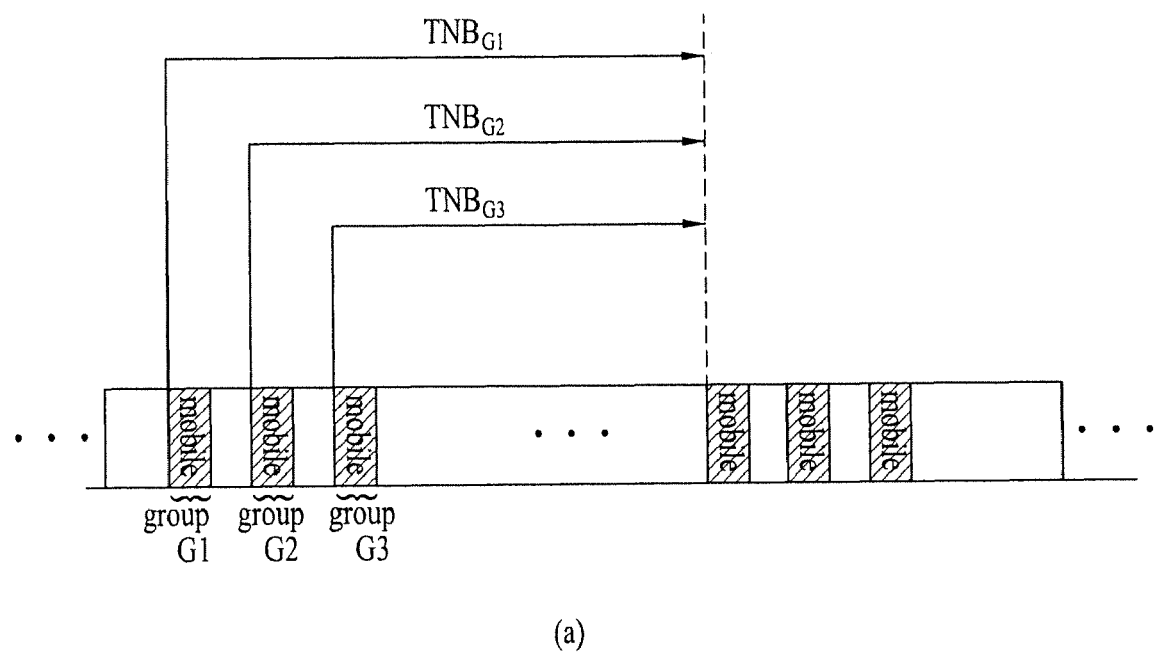
(a)
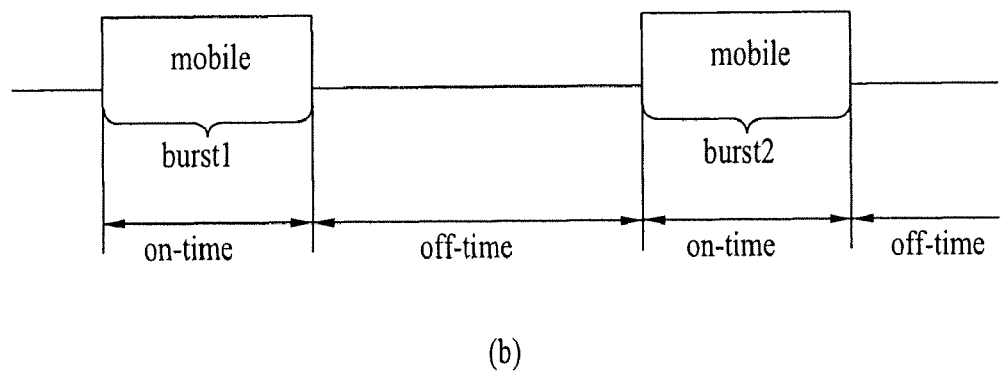
(b)

FIG. 27
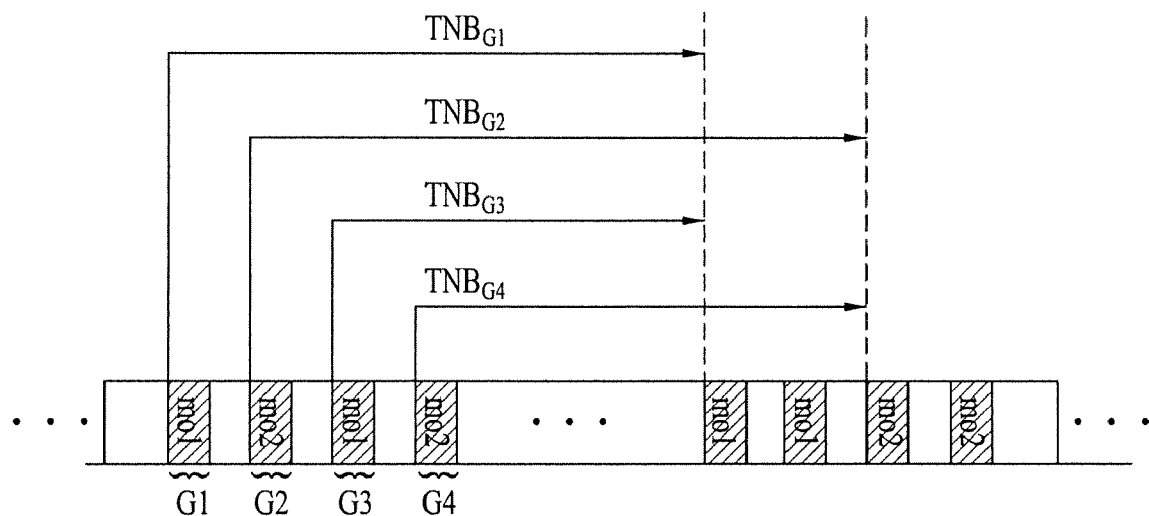
(a)
(b)
(c)

DIGITAL BROADCASTING SYSTEM AND METHOD OF PROCESSING DATA

This application claims the benefit of the Korean Patent Application No. 10-2007-0032439, filed on Apr. 2, 2007, which is hereby incorporated by reference as if fully set forth herein. Also, this application also claims the benefit of U.S. Provisional Application No. 60/911,508, filed on Apr. 12, 2007, which is hereby incorporated by reference.

BACKGROUND OF THE INVENTION

1. Field of the Invention

The present invention relates to a digital broadcasting system for transmitting and receiving digital broadcast signals, and more particularly, to a digital broadcasting system and a method of processing data.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receiving systems, the receiving performance may be even more deteriorated when transmitting mobile service data by the VSB transmission mode.

SUMMARY OF THE INVENTION

Accordingly, the present invention is directed to a digital broadcasting system and a method of processing data that substantially obviate one or more problems due to limitations and disadvantages of the related art.

An object of the present invention is to provide a digital broadcasting system and a method of processing data that are highly resistant to channel changes and noise.

Another object of the present invention is to provide a digital broadcasting system and a method of processing data that can enhance the receiving performance of a digital broadcast receiving system by performing additional encoding on mobile service data and by transmitting the processed data to the receiving system.

A further object of the present invention is to provide a digital broadcasting system and a method of processing data that can also enhance the receiving performance of a digital broadcast receiving system by inserting known data already known in accordance with a pre-agreement between the receiving system and the transmitting system in a predetermined area within a data area.

A further object of the present invention is to provide a digital broadcasting system and a method of processing data that can reduce power consumption.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital broadcast transmitting system includes a service multiplexer and a transmitter. The service multiplexer multiplexes mobile service data and main service data at pre-determined data rates and, then, transmits the multiplexed service data to the transmitter. The transmitter performs additional encoding on the mobile service data transmitted from the service multiplexer and, also, groups a plurality of mobile service data packets having encoding performed thereon so as to configure a data group.

Herein, the transmitter may multiplex a mobile service data packet including the mobile service data and a main service data packet including the main service data in packet units and may transmit the multiplexed data packets to a digital broadcast receiving system. Herein, the transmitter may multiplex the data group and the main service data packet in a burst structure, wherein the burst section may be divided in a burst-on section including the data group, and a burst-off section that does not include the data group. The data group may be divided into a plurality of regions based upon a degree of interference of the main service data. A long known data sequence may be periodically inserted in the region having no interference with the main service data.

In another aspect of the present invention, a digital broadcast receiving system may use the known data sequence for demodulating and channel equalizing processes. When receiving only the mobile service data, the digital broadcast receiving system turns power on only during the burst-on section so as to process the mobile service data.

In another aspect of the present invention, a broadcast receiving system includes a transmission parameter decoding unit, a known sequence detector, and a burst controller. The transmission parameter decoding unit detects information on a burst from broadcast data having main service data and mobile service data multiplexed therein within a field and outputs the detected information on the burst. The known sequence detector receives burst information from the transmission parameter decoding unit and uses the received burst information and known data position information included in the received data, so as to output burst control information. The burst controller uses the burst control information to control power supply of the broadcast receiving system.

In another aspect of the present invention, in a method of processing data of a broadcast receiving system, the method of processing data includes the steps of obtaining a transmission parameter from signaling information of a received data, detecting information on a burst from the transmission parameter, detecting burst control information from a correlation value of the received data, and calculating power on/off information of the broadcast receiving system from the detected burst control information and the detected burst information, and controlling power supply of the broadcast receiving system based upon the calculated power on/off information.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 26 illustrates an example of acquiring mobile service data included in a particular data group within a burst according to the present invention;

FIG. 27 illustrates another example of FIG. 26;

DETAILED DESCRIPTION OF THE INVENTION

Figure 1:
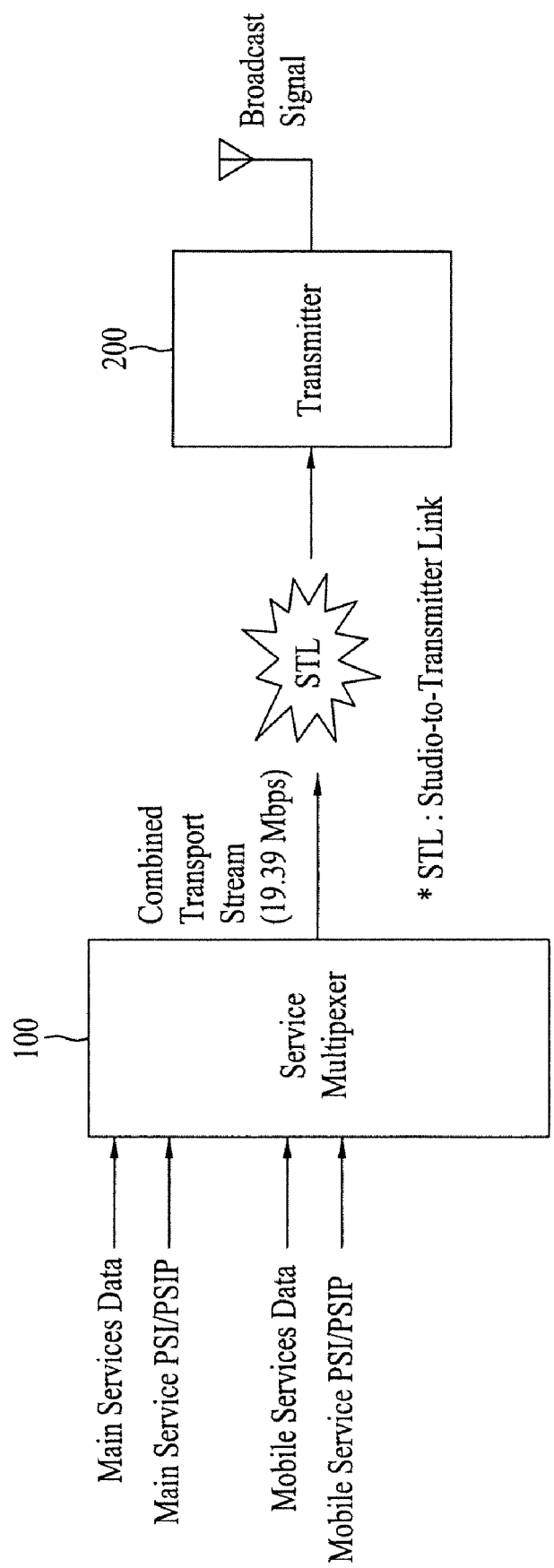
FIG. 1 illustrates a block diagram showing a general structure of a digital broadcasting system according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system. Additionally, in the present invention, mobile service data may include at least one of mobile service data, pedestrian service data, and handheld service data, and are collectively referred to as mobile service data for simplicity. Herein, the mobile service data not only correspond to mobile/pedestrian/handheld service data (M/P/H service data) but may also include any type of service data with mobile or portable characteristics. Therefore, the mobile service data according to the present invention are not limited only to the M/P/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be serviced as the main service data.

Also, a data service using the mobile service data may include weather forecast services, traffic information services, stock information services, viewer participation quiz programs, real-time polls & surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above. In the present invention, the transmitting system provides backward compatibility in the main service data so as to be received by the conventional receiving system. Herein, the main service data and the mobile service data are multiplexed to the same physical channel and then transmitted.

The transmitting system according to the present invention performs additional encoding on the mobile service data and inserts the data already known by the receiving system and transmitting system (i.e., known data), thereby transmitting the processed data. Therefore, when using the transmitting system according to the present invention, the receiving system may receive the mobile service data during a mobile state and may also receive the mobile service data with stability despite various distortion and noise occurring within the channel.

General Description of a Transmitting System

FIG. 1 illustrates a block diagram showing a general structure of a digital broadcast transmitting system according to an embodiment of the present invention. Herein, the digital broadcast transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. Accordingly, in the receiving system, a channel equalizer may compensate signal distortion, which is caused by a reflected wave, so as to recover the original signal. In another example, the plurality of transmitters may have different frequencies with respect to the same channel.

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8 VSB mode, the output data rate is 19.39 Mbps, and, in case of the 16 VSB mode, the output data rate is 38.78 Mbps. Furthermore, in the conventional 8 VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of mobile service data and program specific information (PSI)/program and system information protocol (PSIP) table data for each mobile service and encapsulates the received data to each transport stream (TS) packet. Also, the service multiplexer 100 receives at least one type of main service data and PSI/PSIP table data for each main service so as to encapsulate the received data to a TS packet. Subsequently, the TS packets are multiplexed according to a predetermined multiplexing rule and outputs the multiplexed packets to the transmitter 200.

Service Multiplexer

Figure 2:
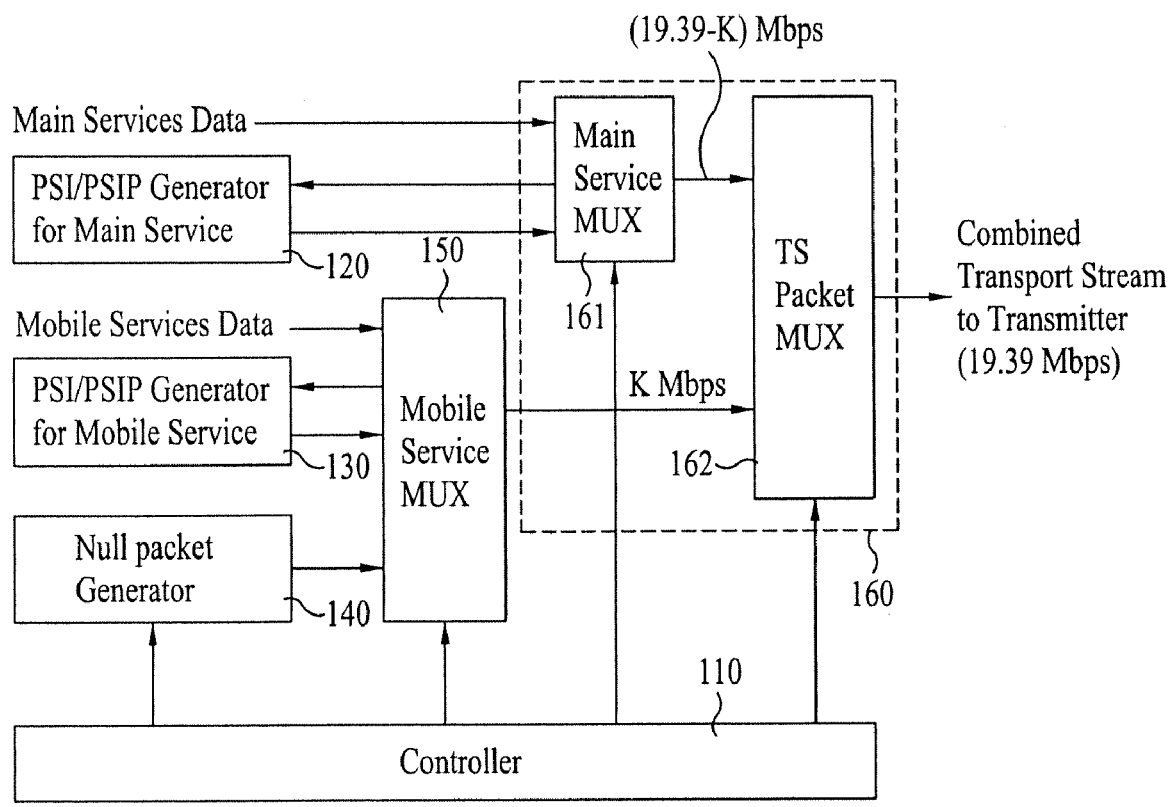
FIG. 2 illustrates a block diagram showing an example of a service multiplexer of FIG. 1.

FIG. 2 illustrates a block diagram showing an example of the service multiplexer. The service multiplexer includes a controller 110 for controlling the overall operations of the service multiplexer, a PSI/PSIP generator 120 for the main service, a PSI/PSIP generator 130 for the mobile service, a null packet generator 140, a mobile service multiplexer 150, and a transport multiplexer 160. The transport multiplexer 160 may include a main service multiplexer 161 and a transport stream (TS) packet multiplexer 162. Referring to FIG. 2, at least one type of compression encoded main service data and the PSI/PSIP table data generated from the PSI/PSIP generator 120 for the main service are inputted to the main service multiplexer 161 of the transport multiplexer 160. The main service multiplexer 161 encapsulates each of the inputted main service data and PSI/PSIP table data to MPEG-2 TS packet forms. Then, the MPEG-2 TS packets are multiplexed and outputted to the TS packet multiplexer 162. Herein, the data packet being outputted from the main service multiplexer 161 will be referred to as a main service data packet for simplicity.

Thereafter, at least one type of the compression encoded mobile service data and the PSI/PSIP table data generated from the PSI/PSIP generator 130 for the mobile service are inputted to the mobile service multiplexer 150. The mobile service multiplexer 150 encapsulates each of the inputted mobile service data and PSI/PSIP table data to MPEG-2 TS packet forms. Then, the MPEG-2 TS packets are multiplexed and outputted to the TS packet multiplexer 162. Herein, the data packet being outputted from the mobile service multiplexer 150 will be referred to as a mobile service data packet for simplicity. At this point, the transmitter 200 requires identification information in order to identify and process the main service data packet and the mobile service data packet. Herein, the identification information may use values pre-decided in accordance with an agreement between the transmitting system and the receiving system, or may be configured of a separate set of data, or may modify predetermined location value with in the corresponding data packet. As an example of the present invention, a different packet identifier (PID) may be assigned to identify each of the main service data packet and the mobile service data packet.

In another example, by modifying a synchronization data byte within a header of the mobile service data, the service data packet may be identified by using the synchronization data byte value of the corresponding service data packet. For example, the synchronization byte of the main service data packet directly outputs the value decided by the ISO/IEC13818-1 standard (i.e., 0x47) without any modification. The synchronization byte of the mobile service data packet modifies and outputs the value, thereby identifying the main service data packet and the mobile service data packet. Conversely, the synchronization byte of the main service data packet is modified and outputted, whereas the synchronization byte of the mobile service data packet is directly outputted without being modified, thereby enabling the main service data packet and the mobile service data packet to be identified.

A plurality of methods may be applied in the method of modifying the synchronization byte. For example, each bit of the synchronization byte may be inversed, or only a portion of the synchronization byte may be inversed. As described above, any type of identification information may be used to identify the main service data packet and the mobile service data packet. Therefore, the scope of the present invention is not limited only to the example set forth in the description of the present invention.

Meanwhile, a transport multiplexer used in the conventional digital broadcasting system may be used as the transport multiplexer 160 according to the present invention. More specifically, in order to multiplex the mobile service data and the main service data and to transmit the multiplexed data, the data rate of the main service is limited to a data rate of (19.39-K) Mbps. Then, K Mbps, which corresponds to the remaining data rate, is assigned as the data rate of the mobile service. Thus, the transport multiplexer which is already being used may be used as it is without any modification. Herein, the transport multiplexer 160 multiplexes the main service data packet being outputted from the main service multiplexer 161 and the mobile service data packet being outputted from the mobile service multiplexer 150. Thereafter, the transport multiplexer 160 transmits the multiplexed data packets to the transmitter 200.

However, in some cases, the output data rate of the mobile service multiplexer 150 may not be equal to K Mbps. In this case, the mobile service multiplexer 150 multiplexes and outputs null data packets generated from the null packet generator 140 so that the output data rate can reach K Mbps. More specifically, in order to match the output data rate of the mobile service multiplexer 150 to a constant data rate, the null packet generator 140 generates null data packets, which are then outputted to the mobile service multiplexer 150. For example, when the service multiplexer 100 assigns K Mbps of the 19.39 Mbps to the mobile service data, and when the remaining (19.39-K) Mbps is, therefore, assigned to the main service data, the data rate of the mobile service data that are multiplexed by the service multiplexer 100 actually becomes lower than K Mbps. This is because, in case of the mobile service data, the pre-processor of the transmitting system performs additional encoding, thereby increasing the amount of data. Eventually, the data rate of the mobile service data, which may be transmitted from the service multiplexer 100, becomes smaller than K Mbps.

For example, since the pre-processor of the transmitter performs an encoding process on the mobile service data at a coding rate of at least ½, the amount of the data outputted from the pre-processor is increased to more than twice the amount of the data initially inputted to the pre-processor. Therefore, the sum of the data rate of the main service data and the data rate of the mobile service data, both being multiplexed by the service multiplexer 100, becomes either equal to or smaller than 19.39 Mbps. Therefore, in order to match the data rate of the data that are finally outputted from the service multiplexer 100 to a constant data rate (e.g., 19.39 Mbps), an amount of null data packets corresponding to the amount of lacking data rate is generated from the null packet generator 140 and outputted to the mobile service multiplexer 150.

Accordingly, the mobile service multiplexer 150 encapsulates each of the mobile service data and the PSI/PSIP table data that are being inputted to a MPEG-2 TS packet form. Then, the above-described TS packets are multiplexed with the null data packets and, then, outputted to the TS packet multiplexer 162. Thereafter, the TS packet multiplexer 162 multiplexes the main service data packet being outputted from the main service multiplexer 161 and the mobile service data packet being outputted from the mobile service multiplexer 150 and transmits the multiplexed data packets to the transmitter 200 at a data rate of 19.39 Mbps.

According to an embodiment of the present invention, the mobile service multiplexer 150 receives the null data packets. However, this is merely exemplary and does not limit the scope of the present invention. In other words, according to another embodiment of the present invention, the TS packet multiplexer 162 may receive the null data packets, so as to match the data rate of the finally outputted data to a constant data rate. Herein, the output path and multiplexing rule of the null data packet is controlled by the controller 110. The controller 110 controls the multiplexing processed performed by the mobile service multiplexer 150, the main service multiplexer 161 of the transport multiplexer 160, and the TS packet multiplexer 162, and also controls the null data packet generation of the null packet generator 140. At this point, the transmitter 200 discards the null data packets transmitted from the service multiplexer 100 instead of transmitting the null data packets.

Further, in order to allow the transmitter 200 to discard the null data packets transmitted from the service multiplexer 100 instead of transmitting them, identification information for identifying the null data packet is required. Herein, the identification information may use values pre-decided in accordance with an agreement between the transmitting system and the receiving system. For example, the value of the synchronization byte within the header of the null data packet may be modified so as to be used as the identification information. Alternatively, a transport_error_indicator flag may also be used as the identification information.

In the description of the present invention, an example of using the transport_error_indicator flag as the identification information will be given to describe an embodiment of the present invention. In this case, the transport_error_indicator flag of the null data packet is set to '1', and the transport_error_indicator flag of the remaining data packets are reset to '0', so as to identify the null data packet. More specifically, when the null packet generator 140 generates the null data packets, if the transport_error_indicator flag from the header field of the null data packet is set to '1' and then transmitted, the null data packet may be identified and, therefore, be discarded. In the present invention, any type of identification information for identifying the null data packets may be used. Therefore, the scope of the present invention is not limited only to the examples set forth in the description of the present invention.

According to another embodiment of the present invention, a transmission parameter may be included in at least a portion of the null data packet, or at least one table or an operations and maintenance (OM) packet (or OMP) of the PSI/PSIP table for the mobile service. In this case, the transmitter 200 extracts the transmission parameter and outputs the extracted transmission parameter to the corresponding block and also transmits the extracted parameter to the receiving system if required. More specifically, a packet referred to as an OMP is defined for the purpose of operating and managing the transmitting system. For example, the OMP is configured in accordance with the MPEG-2 TS packet format, and the corresponding PID is given the value of 0x1FFA. The OMP is configured of a 4-byte header and a 184-byte payload. Herein, among the 184 bytes, the first byte corresponds to an OM_type field, which indicates the type of the OM packet.

In the present invention, the transmission parameter may be transmitted in the form of an OMP. And, in this case, among the values of the reserved fields within the OM_type field, a pre-arranged value is used, thereby indicating that the transmission parameter is being transmitted to the transmitter 200 in the form of an OMP. More specifically, the transmitter 200 may find (or identify) the OMP by referring to the PID. Also, by parsing the OM_type field within the OMP, the transmitter 200 can verify whether a transmission parameter is included after the OM_type field of the corresponding packet. The transmission parameter corresponds to supplemental data required for processing mobile service data from the transmitting system and the receiving system.

Herein, the transmission parameter may include data group information, region information within the data group, RS frame information, super frame information, burst information, turbo code information, and RS code information. The burst information may include burst size information, burst period information, and time information to next burst. The burst period signifies the period at which the burst transmitting the same mobile service is repeated. The data group includes a plurality of mobile service data packets, and a plurality of such data groups is gathered (or grouped) to form a burst. A burst section signifies the beginning of a current burst to the beginning of a next burst. Herein, the burst section is classified as a section that includes the data group (also referred to as a burst-on section), and a section that does not include the data group (also referred to as a burst-off section). A burst-on section is configured of a plurality of fields, wherein one field includes one data group.

The transmission parameter may also include information on how signals of a symbol domain are encoded in order to transmit the mobile service data, and multiplexing information on how the main service data and the mobile service data or various types of mobile service data are multiplexed. The information included in the transmission parameter is merely exemplary to facilitate the understanding of the present invention. And, the adding and deleting of the information included in the transmission parameter may be easily modified and changed by anyone skilled in the art. Therefore, the present invention is not limited to the examples proposed in the description set forth herein. Furthermore, the transmission parameters may be provided from the service multiplexer 100 to the transmitter 200. Alternatively, the transmission parameters may also be set up by an internal controller (not shown) within the transmitter 200 or received from an external source.

Transmitter

Figure 3:
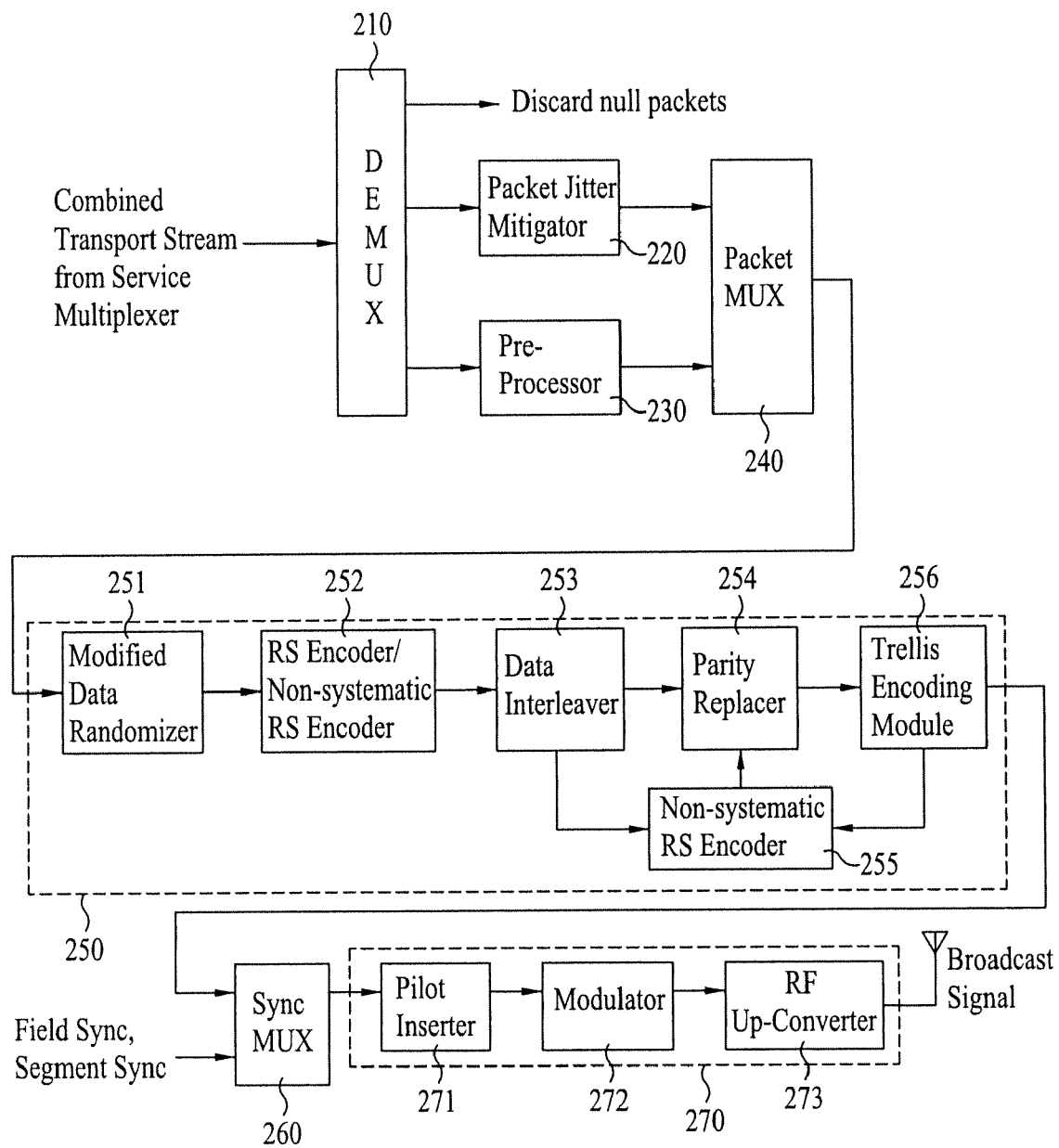
FIG. 3 illustrates a block diagram showing an example of a transmitter of FIG. 1.

FIG. 3 illustrates a block diagram showing an example of the transmitter 200 according to an embodiment of the present invention. Herein, the transmitter 200 includes a demultiplexer 210, a packet jitter mitigator 220, a pre-processor 230, a packet multiplexer 240, a post-processor 250, a synchronization (sync) multiplexer 260, and a transmission unit 270. Herein, when a data packet is received from the service multiplexer 100, the demultiplexer 210 should identify whether the received data packet corresponds to a main service data packet, a mobile service data packet, or a null data packet. For example, the demultiplexer 210 uses the PID within the received data packet so as to identify the main service data packet and the mobile service data packet. Then, the demultiplexer 210 uses a transport_error_indicator field to identify the null data packet. The main service data packet identified by the demultiplexer 210 is outputted to the packet jitter mitigator 220, the mobile service data packet is outputted to the pre-processor 230, and the null data packet is discarded. If a transmission parameter is included in the null data packet, then the transmission parameter is first extracted and outputted to the corresponding block. Thereafter, the null data packet is discarded.

The pre-processor 230 performs an additional encoding process of the mobile service data included in the service data packet, which is demultiplexed and outputted from the demultiplexer 210. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes. The pre-processor 230 may also refer to the transmission parameter when performing the additional encoding process. Also, the pre-processor 230 groups a plurality of mobile service data packets to configure a data group. Thereafter, known data, mobile service data, RS parity data, and MPEG header are allocated to pre-determined areas within the data group.

Pre-Processor within Transmitter

Figure 4:
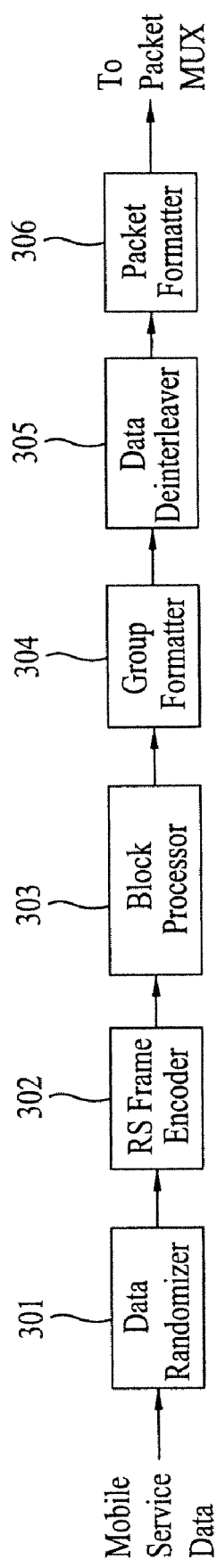
FIG. 4 illustrates a block diagram showing an example of a pre-processor of FIG. 3.

FIG. 4 illustrates a block diagram showing an example of the pre-processor 230 according to the present invention. The pre-processor 230 includes a data randomizer 301, a RS frame encoder 302, a block processor 303, a group formatter 304, a data deinterleaver 305, a packet formatter 306. The data randomizer 301 within the above-described pre-processor 230 randomizes the mobile service data packet including the mobile service data that is inputted through the demultiplexer 210. Then, the data randomizer 301 outputs the randomized mobile service data packet to the RS frame encoder 302. At this point, since the data randomizer 301 performs the randomizing process on the mobile service data, the randomizing process that is to be performed by the data randomizer 251 of the post-processor 250 on the mobile service data may be omitted. The data randomizer 301 may also discard the synchronization byte within the mobile service data packet and perform the randomizing process. This is an option that may be chosen by the system designer. In the example given in the present invention, the randomizing process is performed without discarding the synchronization byte within the mobile service data packet.

The RS frame encoder 302 groups a plurality of mobile the synchronization byte within the mobile service data packets that is randomized and inputted, so as to create a RS frame. Then, the RS frame encoder 302 performs at least one of an error correction encoding process and an error detection encoding process in RS frame units. Accordingly, robustness may be provided to the mobile service data, thereby scattering group error that may occur during changes in a frequency environment, thereby enabling the mobile service data to respond to the frequency environment, which is extremely vulnerable and liable to frequent changes. Also, the RS frame encoder 302 groups a plurality of RS frame so as to create a super frame, thereby performing a row permutation process in super frame units. The row permutation process may also be referred to as a row interleaving process. Hereinafter, the process will be referred to as row permutation for simplicity.

More specifically, when the RS frame encoder 302 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process. When performing the RS-encoding, parity data that are used for the error correction are generated. And, when performing the CRC encoding, CRC data that are used for the error detection are generated. The RS encoding is one of forward error correction (FEC) methods. The FEC corresponds to a technique for compensating errors that occur during the transmission process. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system. Herein, the RS frame encoder 302 refers to a pre-determined transmission parameter and/or the transmission parameter provided from the service multiplexer 100 so as to perform operations including RS frame configuration, RS encoding, CRC encoding, super frame configuration, and row permutation in super frame units.

RS Frame Encoder within Pre-Processor

Figure 5:
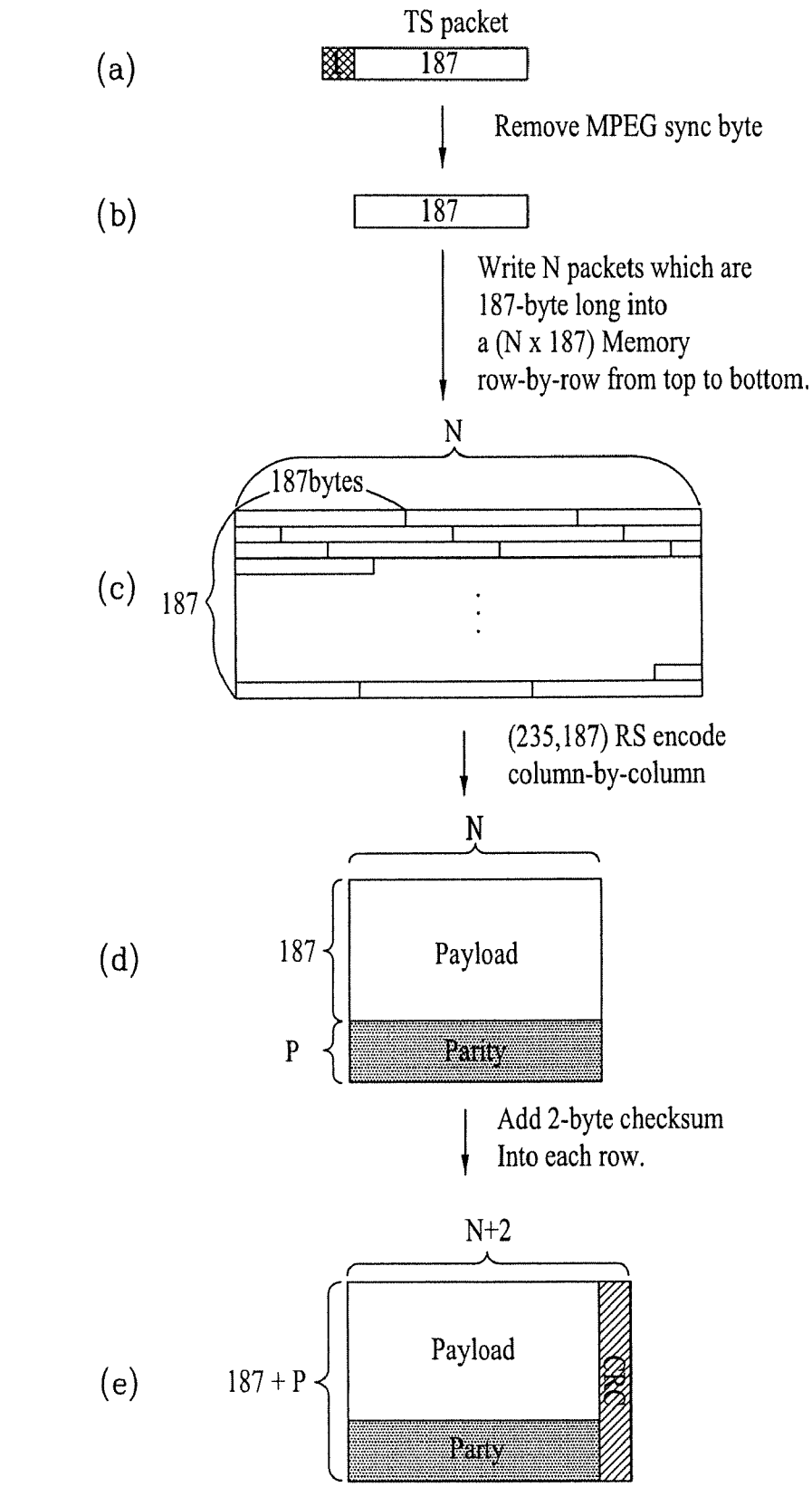
FIG. 5(a) to FIG. 5(e) illustrate error correction encoding and error detection encoding processed according to an embodiment of the present invention.

FIG. 5(a) to FIG. 5(e) illustrate error correction encoding and error detection encoding processed according to an embodiment of the present invention. More specifically, the RS frame encoder 302 first divides the inputted mobile service data bytes to units of a predetermined length. The predetermined length is decided by the system designer. And, in the example of the present invention, the predetermined length is equal to 187 bytes, and, therefore, the 187-byte unit will be referred to as a packet for simplicity. For example, when the mobile service data that are being inputted, as shown in FIG. 5(a), correspond to a MPEG transport packet stream configured of 188-byte units, the first synchronization byte is removed, as shown in FIG. 5(b), so as to configure a 187-byte unit. Herein, the synchronization byte is removed because each mobile service data packet has the same value.

Herein, the process of removing the synchronization byte may be performed during a randomizing process of the data randomizer 301 in an earlier process. In this case, the process of the removing the synchronization byte by the RS frame encoder 302 may be omitted. Moreover, when adding synchronization bytes from the receiving system, the process may be performed by the data derandomizer instead of the RS frame decoder. Therefore, if a removable fixed byte (e.g., synchronization byte) does not exist within the mobile service data packet that is being inputted to the RS frame encoder 302, or if the mobile service data that are being inputted are not configured in a packet format, the mobile service data that are being inputted are divided into 187-byte units, thereby configuring a packet for each 187-byte unit.

Subsequently, as shown in FIG. 5(c), N number of packets configured of 187 bytes is grouped to configure a RS frame. At this point, the RS frame is configured as a RS frame having the size of N(row)*187(column) bytes, in which 187-byte packets are sequentially inputted in a row direction. In order to simplify the description of the present invention, the RS frame configured as described above will also be referred to as a first RS frame. More specifically, only pure mobile service data are included in the first RS frame, which is the same as the structure configured of 187 N-byte rows. Thereafter, the mobile service data within the RS frame are divided into an equal size. Then, when the divided mobile service data are transmitted in the same order as the input order for configuring the RS frame, and when one or more errors have occurred at a particular point during the transmitting/receiving process, the errors are clustered (or gathered) within the RS frame as well. In this case, the receiving system uses a RS erasure decoding method when performing error correction decoding, thereby enhancing the error correction ability. At this point, the N number of columns within the N number of RS frame includes 187 bytes, as shown in FIG. 5(c).

In this case, a (Nc,Kc)-RS encoding process is performed on each column, so as to generate Nc−Kc(=P) number of parity bytes. Then, the newly generated P number of parity bytes is added after the very last byte of the corresponding column, thereby creating a column of (187+P) bytes. Herein, as shown in FIG. 5(c), Kc is equal to 187 (i.e., Kc=187), and Nc is equal to 187+P (i.e., Nc=187+P). For example, when P is equal to 48, (235,187)-RS encoding process is performed so as to create a column of 235 bytes. When such RS encoding process is performed on all N number of columns, as shown in FIG. 5(c), a RS frame having the size of N(row)*(187+P) (column) bytes may be created, as shown in FIG. 5(d). In order to simplify the description of the present invention, the RS frame having the RS parity inserted therein will be referred to as s second RS frame. More specifically, the second RS frame having the structure of (187+P) rows configured of N bytes may be configured.

As shown in FIG. 5(c) or FIG. 5(d), each row of the RS frame is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit. The RS frame encoder 302 may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system. FIG. 5(e) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 1 below corresponds to an exemplary equation for generating a 2-byte CRC checksum for each row being configured of N number of bytes.

$$g(x)=x^{16}+x^{12}+x+1 \quad\quad\quad\quad \text{Equation 1}$$

The process of adding a 2-byte checksum in each row is only exemplary. Therefore, the present invention is not limited only to the example proposed in the description set forth herein. In order to simplify the understanding of the present invention, the RS frame having the RS parity and CRC checksum added therein will hereinafter be referred to as a third RS frame. More specifically, the third RS frame corresponds to (187+P) number of rows each configured of (N+2) number of bytes. As described above, when the process of RS encoding and CRC encoding are completed, the (N*187)-byte RS frame is expanded to a (N+2)*(187+P)-byte RS frame. Furthermore, the RS frame that is expanded, as shown in FIG. 5(e), is inputted to the block processor 303.

As described above, the mobile service data encoded by the RS frame encoder 302 are inputted to the block processor 303. The block processor 303 then encodes the inputted mobile service data at a coding rate of G/H (wherein, G is smaller than H (i.e., G<H)) and then outputted to the group formatter 304. More specifically, the block processor 303 divides the mobile service data being inputted in byte units into bit units. Then, the G number of bits is encoded to H number of bits. Thereafter, the encoded bits are converted back to byte units and then outputted. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). Hereinafter, the former coding rate will be referred to as a coding rate of ½ (½-rate coding), and the latter coding rate will be referred to as a coding rate of ¼ (¼-rate coding), for simplicity.

Herein, when using the ¼ coding rate, the coding efficiency is greater than when using the ½ coding rate, and may, therefore, provide greater and enhanced error correction ability. For such reason, when it is assumed that the data encoded at a ¼ coding rate in the group formatter 304, which is located near the end portion of the system, are allocated to an area in which the receiving performance may be deteriorated, and that the data encoded at a ½ coding rate are allocated to an area having excellent receiving performance, the difference in performance may be reduced. At this point, the block processor 303 may also receive signaling information including transmission parameters. Herein, the signaling information may also be processed with either ½-rate coding or ¼-rate coding as in the step of processing mobile service data. Thereafter, the signaling information is also considered the same as the mobile service data and processed accordingly.

Meanwhile, the group formatter inserts mobile service data that are outputted from the block processor 303 in corresponding areas within a data group, which is configured in accordance with a pre-defined rule. Also, with respect to the data deinterleaving process, each place holder or known data (or known data place holders) are also inserted in corresponding areas within the data group. At this point, the data group may be divided into at least one hierarchical area. Herein, the type of mobile service data being inserted in each area may vary depending upon the characteristics of each hierarchical area. Additionally, each area may, for example, be divided based upon the receiving performance within the data group. Furthermore, one data group may be configured to include a set of field synchronization data.

Figure 6A:
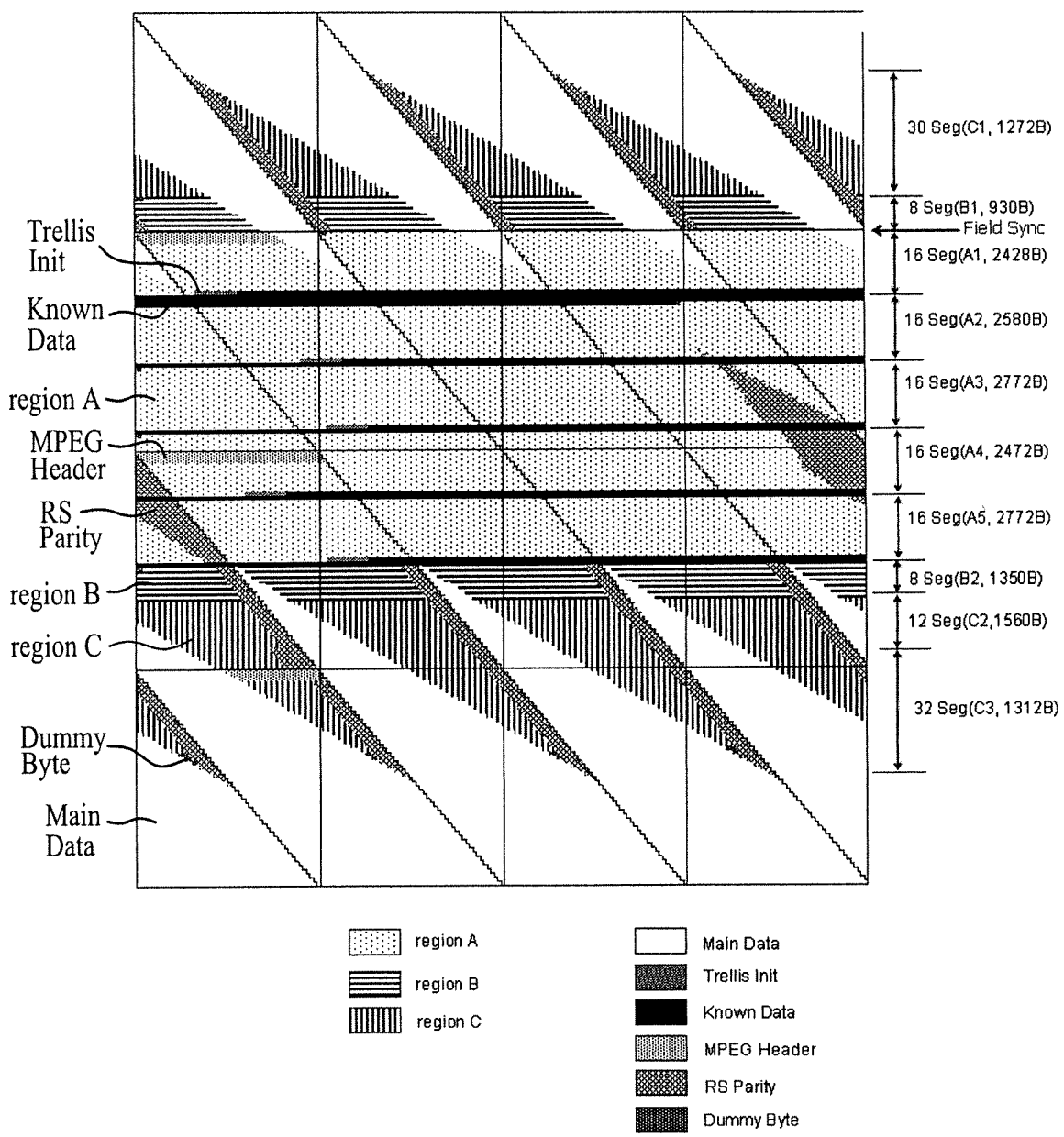
FIG. 6A and FIG. 6B illustrate data configuration before and after a data deinterleaver in a digital broadcast transmitting system according to the present invention.
Figure 6B:
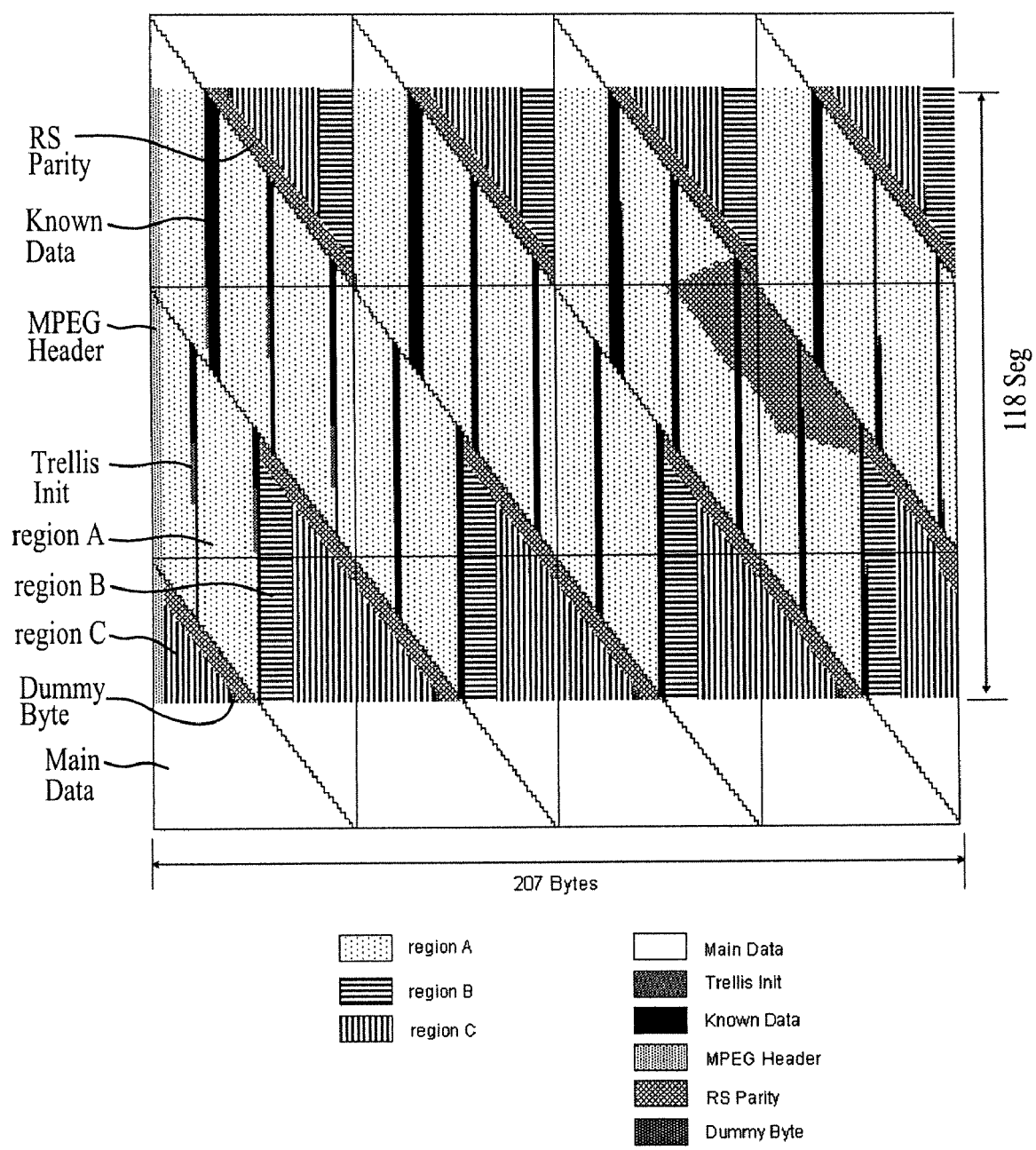

In an example given in the present invention, a data group is divided into A, B, and C regions in a data configuration prior to data deinterleaving. At this point, the group formatter 304 allocates the mobile service data, which are inputted after being RS encoded and block encoded, to each of the corresponding regions by referring to the transmission parameter. FIG. 6A illustrates an alignment of data after being data interleaved and identified, and FIG. 6B illustrates an alignment of data before being data interleaved and identified. More specifically, a data structure identical to that shown in FIG. 6A is transmitted to a receiving system. Also, the data group configured to have the same structure as the data structure shown in FIG. 6A is inputted to the data deinterleaver 305.

As described above, FIG. 6A illustrates a data structure prior to data deinterleaving that is divided into 3 regions, such as region A, region B, and region C. Also, in the present invention, each of the regions A to C is further divided into a plurality of regions. Referring to FIG. 6A, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of mobile service data, which are inputted, may also vary depending upon the characteristic of each region.

In the example of the present invention, the data structure is divided into regions A to C based upon the level of interference of the main service data. Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the mobile service data, the known data having a predetermined length may be periodically inserted in the region having no interference from the main service data (e.g., region A). However, due to interference from the main service data, it is difficult to periodically insert known data and also to insert consecutively long known data to a region having interference from the main service data (e.g., region B and region C).

Hereinafter, examples of allocating data to region A (A1 to A5), region B (B1 and B2), and region C (C1 to C3) will now be described in detail with reference to FIG. 6A. The data group size, the number of hierarchically divided regions within the data group and the size of each region, and the number of mobile service data bytes that can be inserted in each hierarchically divided region of FIG. 6A are merely examples given to facilitate the understanding of the present invention. Herein, the group formatter 304 creates a data group including places in which field synchronization data bytes are to be inserted, so as to create the data group that will hereinafter be described in detail.

More specifically, region A is a region within the data group in which a long known data sequence may be periodically inserted, and in which includes regions wherein the main service data are not mixed (e.g., A2 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 6A, 2428 bytes of the mobile service data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the mobile service data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 930 bytes of the mobile service data may be inserted in the region B1, and 1350 bytes may be inserted in region B2. Similarly, trellis initialization data or known data, MPEG header, and RS parity are not included in the mobile service data. In case of region B, the receiving system may perform equalization by using channel information obtained from the field synchronization region. Alternatively, the receiving system may also perform equalization by using channel information that may be obtained from the last known data sequence, thereby enabling the system to respond to the channel changes.

Region C includes a region located within 30 segments including and preceding the $9^{th}$ segment of the field synchronization region (chronologically located before region A) (e.g., region C1), a region located within 12 segments including and following the $9^{th}$ segment of the very last known data sequence within the data group (chronologically located after region A) (e.g., region C2), and a region located in 32 segments after the region C2 (e.g., region C3). For example, 1272 bytes of the mobile service data may be inserted in the region C1, 1560 bytes may be inserted in region C2, and 1312 bytes may be inserted in region C3. Similarly, trellis initialization data or known data, MPEG header, and RS parity are not included in the mobile service data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 303 may encode the mobile service data, which are to be inserted to each region based upon the characteristic of each hierarchical region, at a different coding rate. For example, the block processor 303 may encode the mobile service data, which are to be inserted in regions A1 to A5 of region A, at a coding rate of ½. Then, the group formatter 304 may insert the ½-rate encoded mobile service data to regions A1 to A5.

The block processor 303 may encode the mobile service data, which are to be inserted in regions B1 and B2 of region B, at a coding rate of ¼ having higher error correction ability as compared to the ½-coding rate. Then, the group formatter 304 inserts the ¼-rate coded mobile service data in region B1 and region B2. Furthermore, the block processor 303 may encode the mobile service data, which are to be inserted in regions C1 to C3 of region C, at a coding rate of ¼ or a coding rate having higher error correction ability than the ¼-coding rate. Then, the group formatter 304 may either insert the encoded mobile service data to regions C1 to C3, as described above, or leave the data in a reserved region for future usage.

In addition, the group formatter 304 also inserts supplemental data, such as signaling information that notifies the overall transmission information, other than the mobile service data in the data group. Also, apart from the encoded mobile service data outputted from the block processor 303, the group formatter 304 also inserts MPEG header place holders, non-systematic RS parity place holders, main service data place holders, which are related to data deinterleaving in a later process, as shown in FIG. 6A. Herein, the main service data place holders are inserted because the mobile service data bytes and the main service data bytes are alternately mixed with one another in regions B and C based upon the input of the data deinterleaver, as shown in FIG. 6A. For example, based upon the data outputted after data deinterleaving, the place holder for the MPEG header may be allocated at the very beginning of each packet.

Furthermore, the group formatter 304 either inserts known data generated in accordance with a pre-determined method or inserts known data place holders for inserting the known data in a later process. Additionally, place holders for initializing the trellis encoding module 256 are also inserted in the corresponding regions. For example, the initialization data place holders may be inserted in the beginning of the known data sequence. Herein, the size of the mobile service data that can be inserted in a data group may vary in accordance with the sizes of the trellis initialization place holders or known data (or known data place holders), MPEG header place holders, and RS parity place holders.

The output of the group formatter 304 is inputted to the data deinterleaver 305. And, the data deinterleaver 305 deinterleaves data by performing an inverse process of the data interleaver on the data and place holders within the data group, which are then outputted to the packet formatter 306. More specifically, when the data and place holders within the data group configured, as shown in FIG. 6A, are deinterleaved by the data deinterleaver 305, the data group being outputted to the packet formatter 306 is configured to have the structure shown in FIG. 6B.

The packet formatter 306 removes the main service data place holders and the RS parity place holders that were allocated for the deinterleaving process from the deinterleaved data being inputted. Then, the packet formatter 306 groups the remaining portion and replaces the 4-byte MPEG header place holder with an MPEG header having a null packet PID (or an unused PID from the main service data packet). Also, when the group formatter 304 inserts known data place holders, the packet formatter 306 may insert actual known data in the known data place holders, or may directly output the known data place holders without any modification in order to make replacement insertion in a later process. Thereafter, the packet formatter 306 identifies the data within the packet-formatted data group, as described above, as a 188-byte unit mobile service data packet (i.e., MPEG TS packet), which is then provided to the packet multiplexer 240.

The packet multiplexer 240 multiplexes the mobile service data packet outputted from the pre-processor 230 and the main service data packet outputted from the packet jitter mitigator 220 in accordance with a pre-defined multiplexing method. Then, the packet multiplexer 240 outputs the multiplexed data packets to the data randomizer 251 of the post-processor 250. Herein, the multiplexing method may vary in accordance with various variables of the system design. One of the multiplexing methods of the packet formatter 240 consists of providing a burst section along a time axis, and, then, transmitting a plurality of data groups during a burst-on section within the burst section, and transmitting only the main service data during the burst-off section within the burst section. Herein, the burst section indicates the section starting from the beginning of the current burst until the beginning of the next burst.

At this point, the main service data may be transmitted during the burst-on section. The packet multiplexer 240 refers to the transmission parameter, such as information on the burst size or the burst period, so as to be informed of the number of data groups and the period of the data groups included in a single burst. Herein, the mobile service data and the main service data may co-exist in the burst-on section, and only the main service data may exist in the burst-off section. Therefore, a main service data section transmitting the main service data may exist in both burst-on and burst-off sections. At this point, the main service data section within the burst-on section and the number of main service data packets included in the burst-off section may either be different from one another or be the same.

When the mobile service data are transmitted in a burst structure, in the receiving system receiving only the mobile service data turns the power on only during the burst section, thereby receiving the corresponding data. Alternatively, in the section transmitting only the main service data, the power is turned off so that the main service data are not received in this section. Thus, the power consumption of the receiving system may be reduced.

Detailed Embodiments of the RS Frame Structure and Packet Multiplexing

Hereinafter, detailed embodiments of the pre-processor 230 and the packet multiplexer 240 will now be described. According to an embodiment of the present invention, the N value corresponding to the length of a row, which is included in the RS frame that is configured by the RS frame encoder 302, is set to 538. Accordingly, the RS frame encoder 302 receives 538 transport stream (TS) packets so as to configure a first RS frame having the size of 538*187 bytes. Thereafter, as described above, the first RS frame is processed with a (235,187)-RS encoding process so as to configure a second RS frame having the size of 538*235 bytes. Finally, the second RS frame is processed with generating a 16-bit checksum so as to configure a third RS frame having the sizes of 540*235.

Meanwhile, as shown in FIG. 6A, the sum of the number of bytes of regions A1 to A5 of region A, in which ½-rate encoded mobile service data are to be inserted, among the plurality of regions within the data group is equal to 13024 bytes (=2428+2580+2772+2472+2772 bytes). Herein, the number of byte prior to performing the ½-rate encoding process is equal to 6512 (=13024/2). On the other hand, the sum of the number of bytes of regions B1 and B2 of region B, in which ¼-rate encoded mobile service data are to be inserted, among the plurality of regions within the data group is equal to 2280 bytes (=930+1350 bytes). Herein, the number of byte prior to performing the ¼-rate encoding process is equal to 570 (=228/4).

In other words, when 7082 bytes of mobile service data are inputted to the block processor 303, 6512 byte are expanded to 13024 bytes by being ½-rate encoded, and 570 bytes are expanded to 2280 bytes by being ¼-rate encoded. Thereafter, the block processor 303 inserts the mobile service data expanded to 13024 bytes in regions A1 to A5 of region A and, also, inserts the mobile service data expanded to 2280 bytes in regions B1 and B2 of region B. Herein, the 7082 bytes of mobile service data being inputted to the block processor 303 may be divided into an output of the RS frame encoder 302 and signaling information. In the present invention, among the 7082 bytes of mobile service data, 7050 bytes correspond to the output of the RS frame encoder 302, and the remaining 32 bytes correspond to the signaling information data. Then, ½-rate encoding or ¼-rate encoding is performed on the corresponding data bytes.

Meanwhile, a RS frame being processed with RS encoding and CRC encoding from the RS frame encoder 302 is configured of 540*235 bytes, in other words, 126900 bytes. The 126900 bytes are divided by 7050-byte units along the time axis, so as to produce 18 7050-byte units. Thereafter, a 32-byte unit of signaling information data is added to the 7050-byte unit mobile service data being outputted from the RS frame encoder 302. Subsequently, the RS frame encoder 302 performs ½-rate encoding or ¼-rate encoding on the corresponding data bytes, which are then outputted to the group formatter 304. Accordingly, the group formatter 304 inserts the ½-rate encoded data in region A and the ¼-rate encoded data in region B.

The process of deciding an N value that is required for configuring the RS frame from the RS frame encoder 302 will now be described in detail. More specifically, the size of the final RS frame (i.e., the third RS frame), which is RS encoded and CRC encoded from the RS frame encoder 302, which corresponds to (N+2)*235 bytes should be allocated to X number of groups, wherein X is an integer. Herein, in a single data group, 7050 data bytes prior to being encoded are allocated. Therefore, if the (N+2)*235 bytes are set to be the exact multiple of 7050(=30*235), the output data of the RS frame encoder 302 may be efficiently allocated to the data group. According to an embodiment of the present invention, the value of N is decided so that (N+2) becomes a multiple of 30. For example, in the present invention, N is equal to 538, and (N+2)(=540) divided by 30 is equal to 18. This indicates that the mobile service data within one RS frame are processed with either ½-rate encoding or ¼-rate encoding. The encoded mobile service data are then allocated to 18 data groups.

Figure 7:
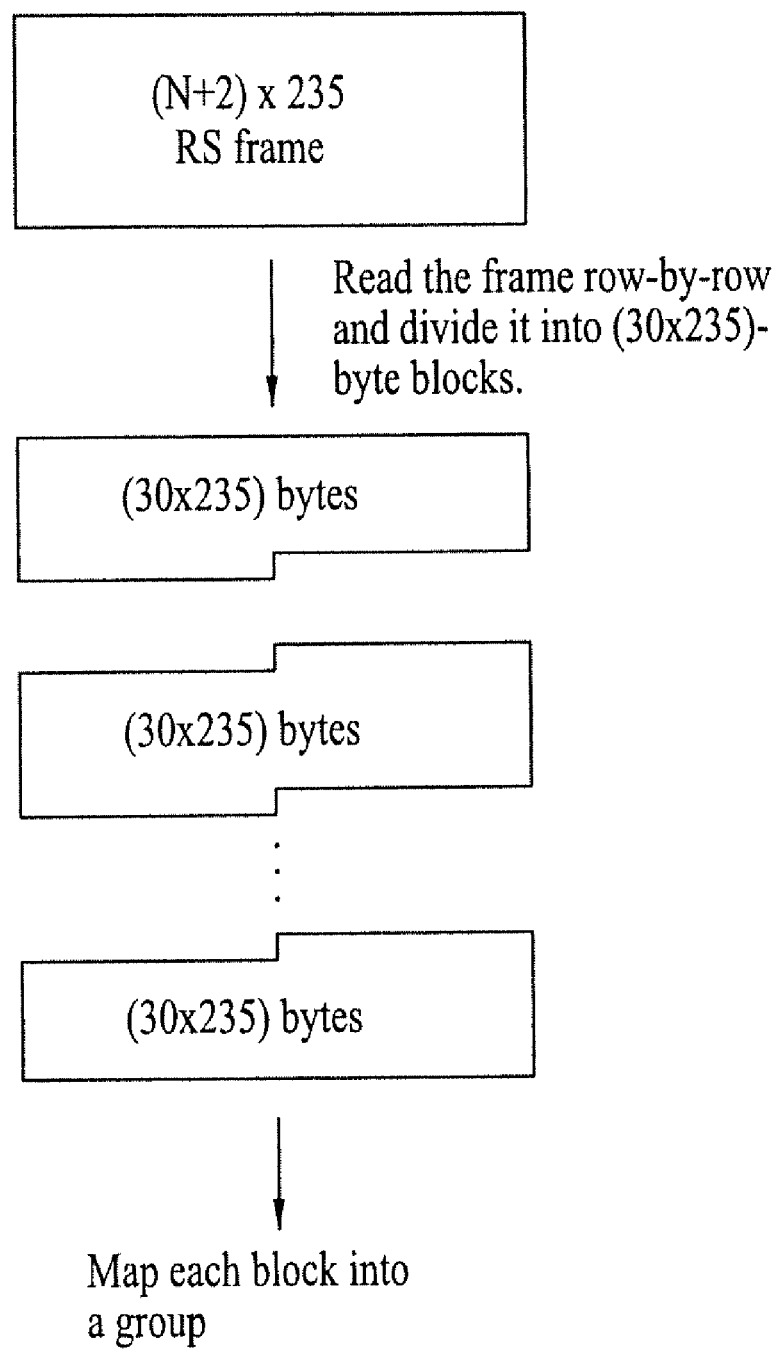
FIG. 7 illustrates a process of dividing a RS frame for configuring a data group according to the present invention.

FIG. 7 illustrates a process of dividing the RS frame according to the present invention. More specifically, the RS frame having the size of (N+2)*235 is divided into 30*235 byte blocks. Then, the divided blocks are mapped to a single group. In other words, the data of a block having the size of 30*235 bytes are processed with one of a ½-rate encoding process and a ¼-rate encoding process and are, then, inserted in a data group. Thereafter, the data group having corresponding data and place holders inserted in each hierarchical region divided by the group formatter 304 passes through the data deinterleaver 305 and the packet formatter 306 so as to be inputted to the packet multiplexer 240.

Figure 8:
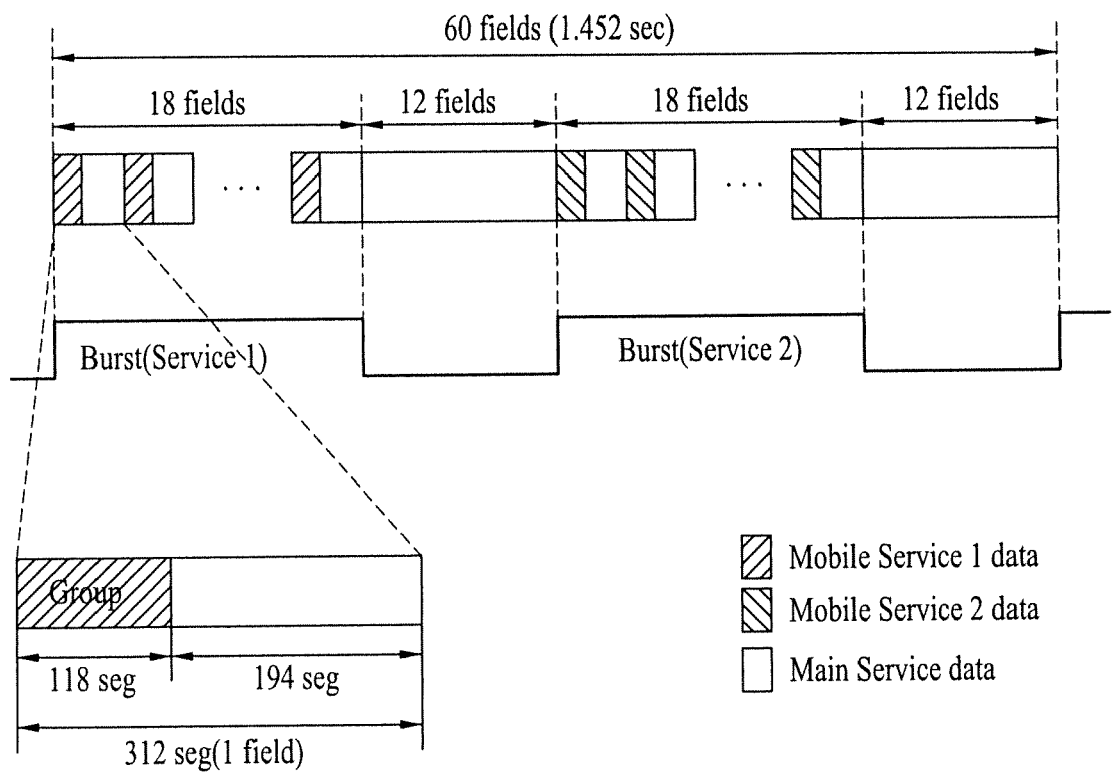
FIG. 8 illustrates exemplary operations of a packet multiplexer for transmitting the data group according to the present invention.

FIG. 8 illustrates exemplary operations of a packet multiplexer for transmitting the data group according to the present invention. More specifically, the packet multiplexer 240 multiplexes a field including a data group, in which the mobile service data and main service data are mixed with one another, and a field including only the main service data. Thereafter, the packet multiplexer 240 outputs the multiplexed fields to the data randomizer 251. At this point, in order to transmit the RS frame having the size of 540*235 bytes, 18 data groups should be transmitted. Herein, each data group includes field synchronization data, as shown in FIG. 6A. Therefore, the 18 data groups are transmitted during 18 field sections, and the section during which the 18 data groups are being transmitted corresponds to the burst-on section.

In each field within the burst-on section, a data group including field synchronization data is multiplexed with main service data, which are then outputted. For example, in the embodiment of the present invention, in each field within the burst-on section, a data group having the size of 118 segments is multiplexed with a set of main service data having the size of 194 segments. Referring to FIG. 8, during the burst-on section (i.e., during the 18 field sections), a field including 18 data groups is transmitted. Then, during the burst-off section that follows (i.e., during the 12 field sections), a field consisting only of the main service data is transmitted. Subsequently, during a subsequent burst-on section, 18 fields including 18 data groups are transmitted. And, during the following burst-off section, 12 fields consisting only of the main service data are transmitted.

Furthermore, in the present invention, the same type of data service may be provided in the first burst-on section including the first 18 data groups and in the second burst-on section including the next 18 data groups. Alternatively, different types of data service may be provided in each burst-on section. For example, when it is assumed that different data service types are provided to each of the first burst-on section and the second burst-on section, and that the receiving system wishes to receive only one type of data service, the receiving system turns the power on only during the corresponding burst-on section including the desired data service type so as to receive the corresponding 18 data fields. Then, the receiving system turns the power off during the remaining 42 field sections so as to prevent other data service types from being received. Thus, the amount of power consumption of the receiving system may be reduced. In addition, the receiving system according to the present invention is advantageous in that one RS frame may be configured from the 18 data groups that are received during a single burst-on section.

According to the present invention, the number of data groups included in a burst-on section may vary based upon the size of the RS frame, and the size of the RS frame varies in accordance with the value N. More specifically, by adjusting the value N, the number of data groups within the burst section may be adjusted. Herein, in an example of the present invention, the (235,187)-RS encoding process adjusts the value N during a fixed state. Furthermore, the size of the mobile service data that can be inserted in the data group may vary based upon the sizes of the trellis initialization data or known data, the MPEG header, and the RS parity, which are inserted in the corresponding data group.

Meanwhile, since a data group including mobile service data in-between the data bytes of the main service data during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet. Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data is relatively small, the packet jitter may cause considerable problem. More specifically, due to the packet jitter, an overflow or underflow may occur in the buffer for the main service data of the receiving system (e.g., the buffer for the audio data). Therefore, the packet jitter mitigator 220 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible. The standard for repositioning the audio data packets in the main service data performed by the packet jitter mitigator 220 will now be described. Herein, it is assumed that the packet jitter mitigator 220 knows the same multiplexing information as that of the packet multiplexer 240, which is placed further behind the packet jitter mitigator 220.

Firstly, if one audio data packet exists in the main service data section (e.g., the main service data section positioned between two data groups) within the burst-on section, the audio data packet is positioned at the very beginning of the main service data section. Alternatively, if two audio data packets exist in the corresponding data section, one audio data packet is positioned at the very beginning and the other audio data packet is positioned at the very end of the main service data section. Further, if more than three audio data packets exist, one audio data packet is positioned at the very beginning of the main service data section, another is positioned at the very end of the main service data section, and the remaining audio data packets are equally positioned between the first and last audio data packets. Secondly, during the main service data section placed immediately before the beginning of a burst-on section (i.e., during a burst-off section), the audio data packet is placed at the very end of the corresponding section.

Thirdly, during a main service data section within the burst-off section after the burst-on section, the audio data packet is positioned at the very end of the main service data section. Finally, the data packets other than audio data packets are positioned in accordance with the inputted order in vacant spaces (i.e., spaces that are not designated for the audio data packets). Meanwhile, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 220 also performs the operation of modifying the PCR value. The output of the packet jitter mitigator 220 is inputted to the packet multiplexer 240. As described above, the packet multiplexer 240 multiplexes the main service data packet outputted from the packet jitter mitigator 220 with the mobile service data packet outputted from the pre-processor 230 into a burst structure in accordance with a pre-determined multiplexing rule. Then, the packet multiplexer 240 outputs the multiplexed data packets to the data randomizer 251 of the post-processor 250.

If the inputted data correspond to the main service data packet, the data randomizer 251 performs the same randomizing process as that of the conventional randomizer. More specifically, the synchronization byte within the main service data packet is deleted. Then, the remaining 187 data bytes are randomized by using a pseudo random byte generated from the data randomizer 251. Thereafter, the randomized data are outputted to the RS encoder/non-systematic RS encoder 252.

On the other hand, if the inputted data correspond to the mobile service data packet, the data randomizer 251 may randomize only a portion of the data packet. For example, if it is assumed that a randomizing process has already been performed in advance on the mobile service data packet by the pre-processor 230, the data randomizer 251 deletes the synchronization byte from the 4-byte MPEG header included in the mobile service data packet and, then, performs the randomizing process only on the remaining 3 data bytes of the MPEG header. Thereafter, the randomized data bytes are outputted to the RS encoder/non-systematic RS encoder 252. More specifically, the randomizing process is not performed on the remaining portion of the mobile service data excluding the MPEG header. In other words, the remaining portion of the mobile service data packet is directly outputted to the RS encoder/non-systematic RS encoder 252 without being randomized. Also, the data randomizer 251 may or may not perform a randomizing process on the known data (or known data place holders) and the initialization data place holders included in the mobile service data packet.

The RS encoder/non-systematic RS encoder 252 performs an RS encoding process on the data being randomized by the data randomizer 251 or on the data bypassing the data randomizer 251, so as to add 20 bytes of RS parity data. Thereafter, the processed data are outputted to the data interleaver 253. Herein, if the inputted data correspond to the main service data packet, the RS encoder/non-systematic RS encoder 252 performs the same systematic RS encoding process as that of the conventional broadcasting system, thereby adding the 20-byte RS parity data at the end of the 187-byte data. Alternatively, if the inputted data correspond to the mobile service data packet, the RS encoder/non-systematic RS encoder 252 performs a non-systematic RS encoding process. At this point, the 20-byte RS parity data obtained from the non-systematic RS encoding process are inserted in a pre-decided parity byte place within the mobile service data packet.

The data interleaver 253 corresponds to a byte unit convolutional interleaver. The output of the data interleaver 253 is inputted to the parity replacer 254 and to the non-systematic RS encoder 255. Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system. More specifically, the memory of the trellis encoding module 256 should first be initialized before the received known data sequence is trellis-encoded. At this point, the beginning portion of the known data sequence that is received corresponds to the initialization data place holder and not to the actual known data. Herein, the initialization data place holder has been included in the data by the group formatter within the pre-processor 230 in an earlier process. Therefore, the process of generating initialization data and replacing the initialization data place holder of the corresponding memory with the generated initialization data are required to be performed immediately before the inputted known data sequence is trellis-encoded.

Additionally, a value of the trellis memory initialization data is decided and generated based upon a memory status of the trellis encoding module 256. Further, due to the newly replaced initialization data, a process of newly calculating the RS parity and replacing the RS parity, which is outputted from the data interleaver 253, with the newly calculated RS parity is required. Therefore, the non-systematic RS encoder 255 receives the mobile service data packet including the initialization data place holders, which are to be replaced with the actual initialization data, from the data interleaver 253 and also receives the initialization data from the trellis encoding module 256.

Among the inputted mobile service data packet, the initialization data place holders are replaced with the initialization data, and the RS parity data that are added to the mobile service data packet are removed and processed with non-systematic RS encoding. Thereafter, the new RS parity obtained by performing the non-systematic RS encoding process is outputted to the parity replacer 255. Accordingly, the parity replacer 255 selects the output of the data interleaver 253 as the data within the mobile service data packet, and the parity replacer 255 selects the output of the non-systematic RS encoder 255 as the RS parity. The selected data are then outputted to the trellis encoding module 256.

Meanwhile, if the main service data packet is inputted or if the mobile service data packet, which does not include any initialization data place holders that are to be replaced, is inputted, the parity replacer 254 selects the data and RS parity that are outputted from the data interleaver 253. Then, the parity replacer 254 directly outputs the selected data to the trellis encoding module 256 without any modification. The trellis encoding module 256 converts the byte-unit data to symbol units and performs a 12-way interleaving process so as to trellis-encode the received data. Thereafter, the processed data are outputted to the synchronization multiplexer 260.

The synchronization multiplexer 260 inserts a field synchronization signal and a segment synchronization signal to the data outputted from the trellis encoding module 256 and, then, outputs the processed data to the pilot inserter 271 of the transmission unit 270. Herein, the data having a pilot inserted therein by the pilot inserter 271 are modulated by the modulator 272 in accordance with a pre-determined modulating method (e.g., a VSB method). Thereafter, the modulated data are transmitted to each receiving system though the radio frequency (RF) up-converter 273.

Block Processor

Figure 9:
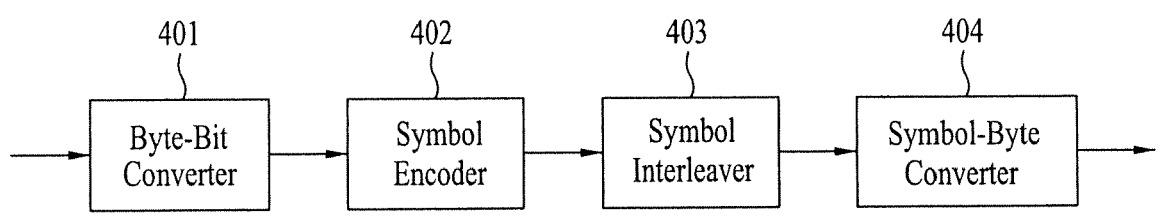
FIG. 9 illustrates a block diagram showing a structure of a block processor according to the present invention.

FIG. 9 illustrates a block diagram showing a structure of a block processor according to the present invention. Herein, the block processor includes a byte-bit converter 401, a symbol encoder 402, a symbol interleaver 403, and a symbol-byte converter 404. The byte-bit converter 401 divides the mobile service data bytes that are inputted from the RS frame encoder 112 into bits, which are then outputted to the symbol encoder 402. The byte-bit converter 401 may also receive signaling information including transmission parameters. The signaling information data bytes are also divided into bits so as to be outputted to the symbol encoder 402. Herein, the signaling information including transmission parameters may be processed with the same data processing step as that of the mobile service data. More specifically, the signaling information may be inputted to the block processor 303 by passing through the data randomizer 301 and the RS frame encoder 302. Alternatively, the signaling information may also be directly outputted to the block processor 303 without passing though the data randomizer 301 and the RS frame encoder 302.

The symbol encoder 402 corresponds to a G/H-rate encoder encoding the inputted data from G bits to H bits and outputting the data encoded at the coding rate of G/H. According to the embodiment of the present invention, it is assumed that the symbol encoder 402 performs either a coding rate of ½ (also referred to as a ½-rate encoding process) or an encoding process at a coding rate of ¼ (also referred to as a ¼-rate encoding process). The symbol encoder 402 performs one of ½-rate encoding and ¼-rate encoding on the inputted mobile service data and signaling information. Thereafter, the signaling information is also recognized as the mobile service data and processed accordingly.

In case of performing the ½-rate coding process, the symbol encoder 402 receives 1 bit and encodes the received 1 bit to 2 bits (i.e., 1 symbol). Then, the symbol encoder 402 outputs the processed 2 bits (or 1 symbol). On the other hand, in case of performing the ¼-rate encoding process, the symbol encoder 402 receives 1 bit and encodes the received 1 bit to 4 bits (i.e., 2 symbols). Then, the symbol encoder 402 outputs the processed 4 bits (or 2 symbols).

Figure 10:
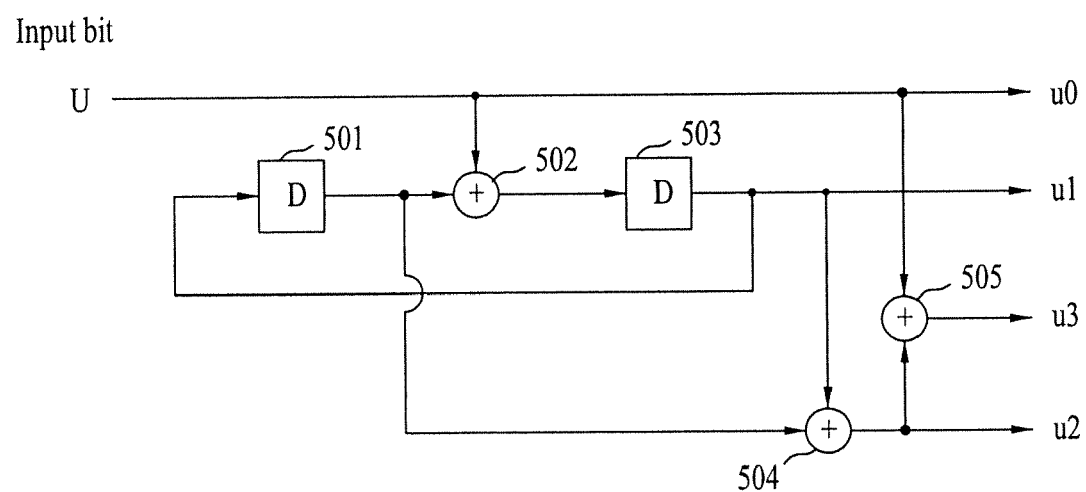
FIG. 10 illustrates a detailed block diagram of a symbol encoder shown in FIG. 9.

FIG. 10 illustrates a detailed block diagram of the symbol encoder 402 shown in FIG. 9. The symbol encoder 402 includes two delay units 501 and 503 and three adders 502, 504, and 505. Herein, the symbol encoder 402 encodes an input data bit U and outputs the coded bit U to 4 bits (u0 to u4). At this point, the data bit U is directly outputted as uppermost bit u0 and simultaneously encoded as lower bit u1u2u3 and then outputted. More specifically, the input data bit U is directly outputted as the uppermost bit u0 and simultaneously outputted to the first and third adders 502 and 505. The first adder 502 adds the input data bit U and the output bit of the first delay unit 501 and, then, outputs the added bit to the second delay unit 503. Then, the data bit delayed by a pre-determined time (e.g., by 1 clock) in the second delay unit 503 is outputted as lower bit u1 and simultaneously fed-back to the first delay unit 501. The first delay unit 501 delays the data bit fed-back from the second delay unit 503 by a pre-determined time (e.g., by 1 clock). Then, the first delay unit 501 outputs the delayed data bit to the first adder 502 and the second adder 504. The second adder 504 adds the data bits outputted from the first and second delay units 501 and 503 as a lower bit u2. The third adder 505 adds the input data bit U and the output of the second delay unit 503 and outputs the added data bit as a lower bit u3.

At this point, if the input data bit U corresponds to data encoded at a ½-coding rate, the symbol encoder 402 configures a symbol with u1u0 bits from the 4 output bits u0u1u2u3. Then, the symbol encoder 402 outputs the newly configured symbol. Alternatively, if the input data bit U corresponds to data encoded at a ¼-coding rate, the symbol encoder 402 configures and outputs a symbol with bits u1u0 and, then, configures and outputs another symbol with bits u2u3. According to another embodiment of the present invention, if the input data bit U corresponds to data encoded at a ¼-coding rate, the symbol encoder 402 may also configure and output a symbol with bits u1u0, and then repeat the process once again and output the corresponding bits. According to yet another embodiment of the present invention, the symbol encoder outputs all four output bits U u0u1u2u3. Then, when using the ½-coding rate, the symbol interleaver 403 located behind the symbol encoder 402 selects only the symbol configured of bits u1u0 from the four output bits u0u1u2u3. Alternatively, when using the ¼-coding rate, the symbol interleaver 403 may select the symbol configured of bits u1u0 and then select another symbol configured of bits u2u3. According to another embodiment, when using the ¼-coding rate, the symbol interleaver 403 may repeatedly select the symbol configured of bits u1u0.

The output of the symbol encoder 402 is inputted to the symbol interleaver 403. Then, the symbol interleaver 403 performs block interleaving in symbol units on the data outputted from the symbol encoder 402. Any interleaver performing structural rearrangement (or realignment) may be applied as the symbol interleaver 403 of the block processor. However, in the present invention, a variable length symbol interleaver that can be applied even when a plurality of lengths is provided for the symbol, so that its order may be rearranged, may also be used.

Figure 11:
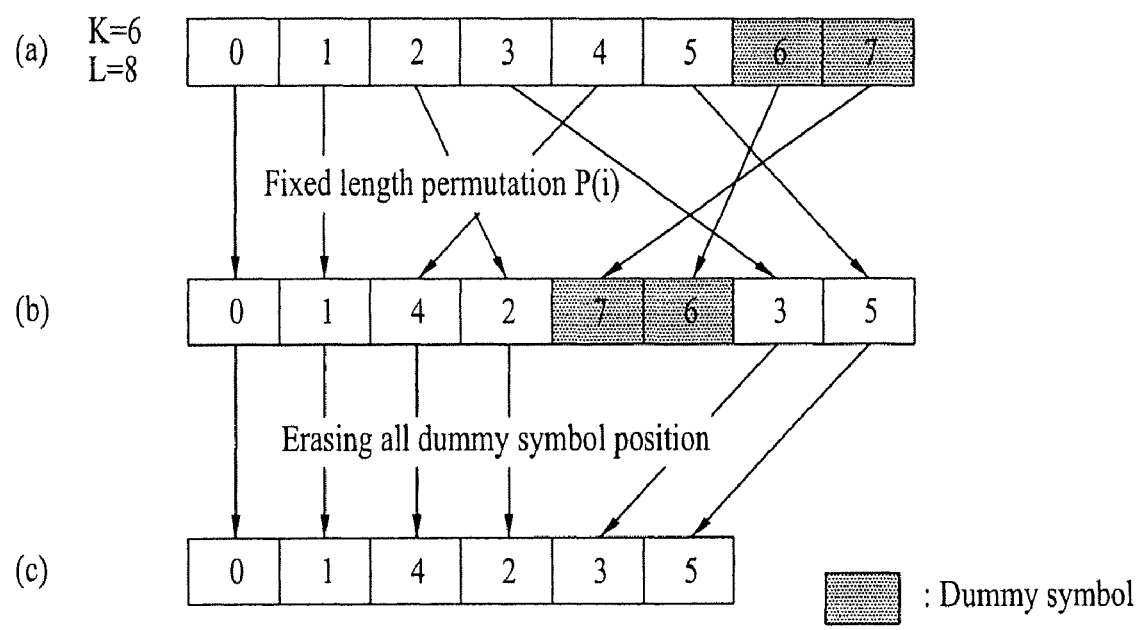
FIG. 11(a) to FIG. 11(c) illustrate a variable length interleaving process of a symbol interleaver shown in FIG. 9.

FIG. 11 illustrates a symbol interleaver according to an embodiment of the present invention. Herein, the symbol interleaver according to the embodiment of the present invention corresponds to a variable length symbol interleaver that may be applied even when a plurality of lengths is provided for the symbol, so that its order may be rearranged. Particularly, FIG. 11 illustrates an example of the symbol interleaver when K=6 and L=8. Herein, K indicates a number of symbols that are outputted for symbol interleaving from the symbol encoder 402. And, L represents a number of symbols that are actually interleaved by the symbol interleaver 403.

In the present invention, the symbol interleaver 403 should satisfy the conditions of L=2ⁿ (wherein n is an integer) and of L≧K. If there is a difference in value between K and L, (L−K) number of null (or dummy) symbols is added, thereby creating an interleaving pattern. Therefore, K becomes a block size of the actual symbols that are inputted to the symbol interleaver 403 in order to be interleaved. L becomes an interleaving unit when the interleaving process is performed by an interleaving pattern created from the symbol interleaver 403. The example of what is described above is illustrated in FIG. 11.

More specifically, FIG. 11(*a*) to FIG. 11(*c*) illustrate a variable length interleaving process of a symbol interleaver shown in FIG. 9. The number of symbols outputted from the symbol encoder 402 in order to be interleaved is equal to 6 (i.e., K=6). In other words, 6 symbols are outputted from the symbol encoder 402 in order to be interleaved. And, the actual interleaving unit (L) is equal to 8 symbols. Therefore, as shown in FIG. 11(*a*), 2 symbols are added to the null (or dummy) symbol, thereby creating the interleaving pattern. Equation 2 shown below described the process of sequentially receiving K number of symbols, the order of which is to be rearranged, and obtaining an L value satisfying the conditions of L=2ⁿ (wherein n is an integer) and of L≧K, thereby creating the interleaving so as to realign (or rearrange) the symbol order.

In relation to all places, wherein 0≦i≦L−1, $$P(i) = \{S \times i \times (i+1)/2\} \bmod L \quad \text{Equation 2}$$

Herein, L≧K, L=2ⁿ and n and S are integers. Referring to FIG. 11, it is assumed that S is equal to 89, and that L is equal to 8, and FIG. 11 illustrates the created interleaving pattern and an example of the interleaving process. As shown in FIG. 11(*b*), the order of K number of input symbols and (L−K) number of null symbols is rearranged by using the above-mentioned Equation 2. Then, as shown in FIG. 11(*c*), the null byte places are removed, so as to rearrange the order, by using Equation 3 shown below. Thereafter, the symbol that is interleaved by the rearranged order is then outputted to the symbol-byte converter.

$$\text{if } P(i) > K-1, \text{then } P(i) \text{place is removed and rearranged} \quad \text{Equation 3}$$

Subsequently, the symbol-byte converter 404 converts to bytes the mobile service data symbols, having the rearranging of the symbol order completed and then outputted in accordance with the rearranged order, and thereafter outputs the converted bytes to the group formatter 304.

Figure 12A:
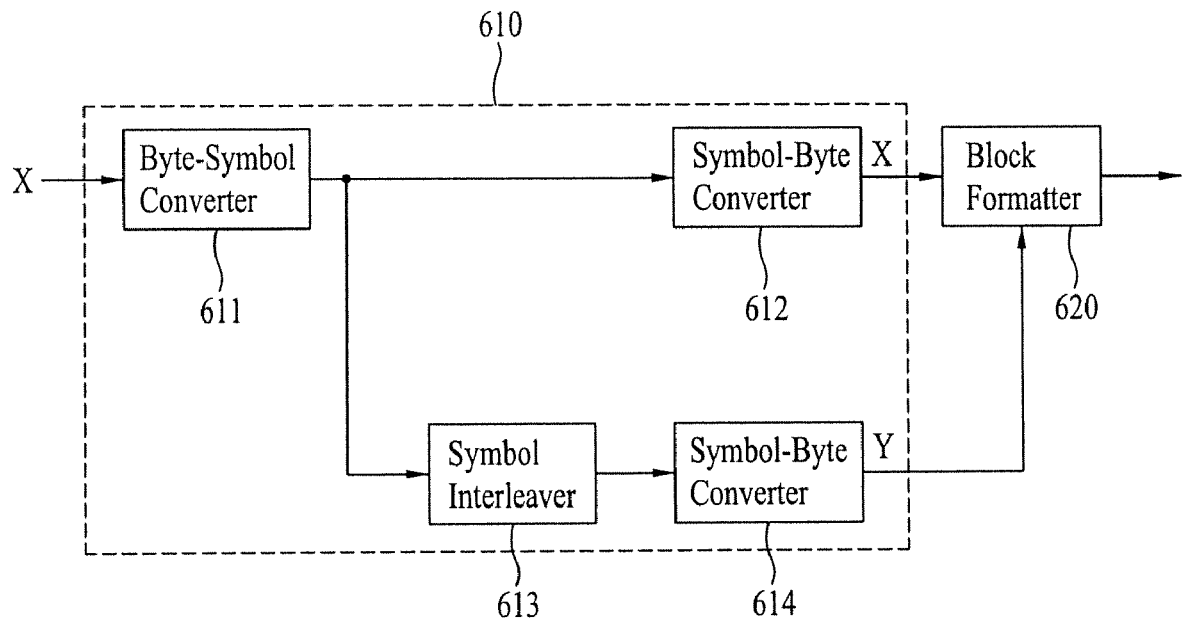
FIG. 12A and FIG. 12B illustrate block diagrams showing structures of a block processor according to another embodiment of the present invention.

FIG. 12A illustrates a block diagram showing the structure of a block processor according to another embodiment of the present invention. Herein, the block processor includes an interleaving unit 610 and a block formatter 620. The interleaving unit 610 may include a byte-symbol converter 611, a symbol-byte converter 612, a symbol interleaver 613, and a symbol-byte converter 614. Herein, the symbol interleaver 613 may also be referred to as a block interleaver.

The byte-symbol converter 611 of the interleaving unit 610 converts the mobile service data X outputted in byte units from the RS frame encoder 302 to symbol units. Then, the byte-symbol converter 611 outputs the converted mobile service data symbols to the symbol-byte converter 612 and the symbol interleaver 613. More specifically, the byte-symbol converter 611 converts each 2 bits of the inputted mobile service data byte (=8 bits) to 1 symbol and outputs the converted symbols. This is because the input data of the trellis encoding module 256 consist of symbol units configured of 2 bits. The relationship between the block processor 303 and the trellis encoding module 256 will be described in detail in a later process. At this point, the byte-symbol converter 611 may also receive signaling information including transmission parameters. Furthermore, the signaling information bytes may also be divided into symbol units and then outputted to the symbol-byte converter 612 and the symbol interleaver 613.

Figure 12B:
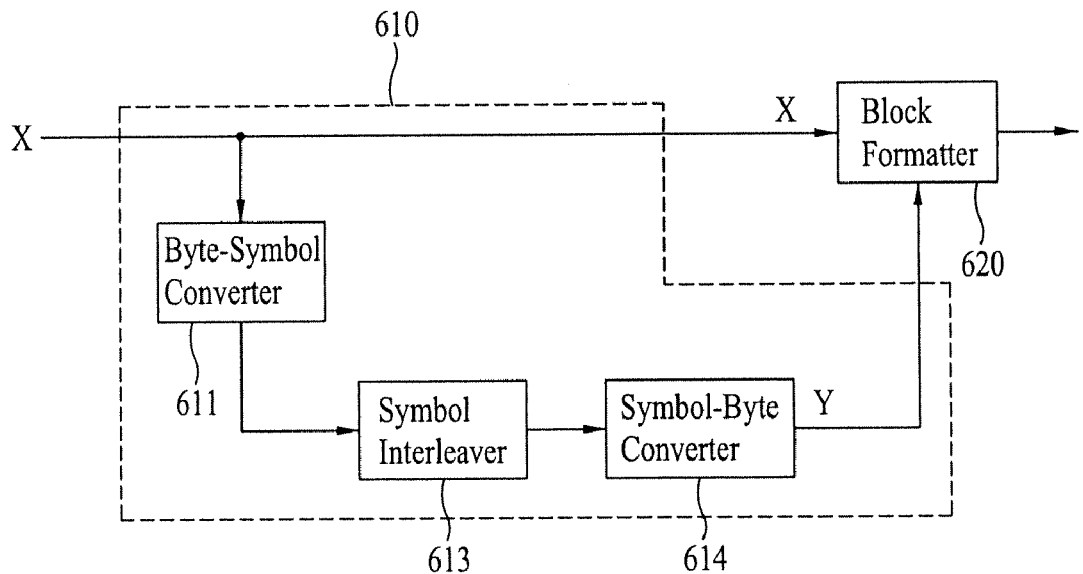

The symbol-byte converter 612 groups 4 symbols outputted from the byte-symbol converter 611 so as to configure a byte. Thereafter, the converted data bytes are outputted to the block formatter 620. Herein, each of the symbol-byte converter 612 and the byte-symbol converter 611 respectively performs an inverse process on one another. Therefore, the yield of these two blocks is offset. Accordingly, as shown in FIG. 12B, the input data X bypass the byte-symbol converter 611 and the symbol-byte converter 612 and are directly inputted to the block formatter 620. More specifically, the interleaving unit 610 of FIG. 12B has a structure equivalent to that of the interleaving unit shown in FIG. 12A. Therefore, the same reference numerals will be used in FIG. 12A and FIG. 12B.

The symbol interleaver 613 performs block interleaving in symbol units on the data that are outputted from the byte-symbol converter 611. Subsequently, the symbol interleaver 613 outputs the interleaved data to the symbol-byte converter 614. Herein, any type of interleaver that can rearrange the structural order may be used as the symbol interleaver 613 of the present invention. In the example given in the present invention, a variable length interleaver that may be applied for symbols having a wide range of lengths, the order of which is to be rearranged. For example, the symbol interleaver of FIG. 11 may also be used in the block processor shown in FIG. 12A and FIG. 12B.

Figure 13:
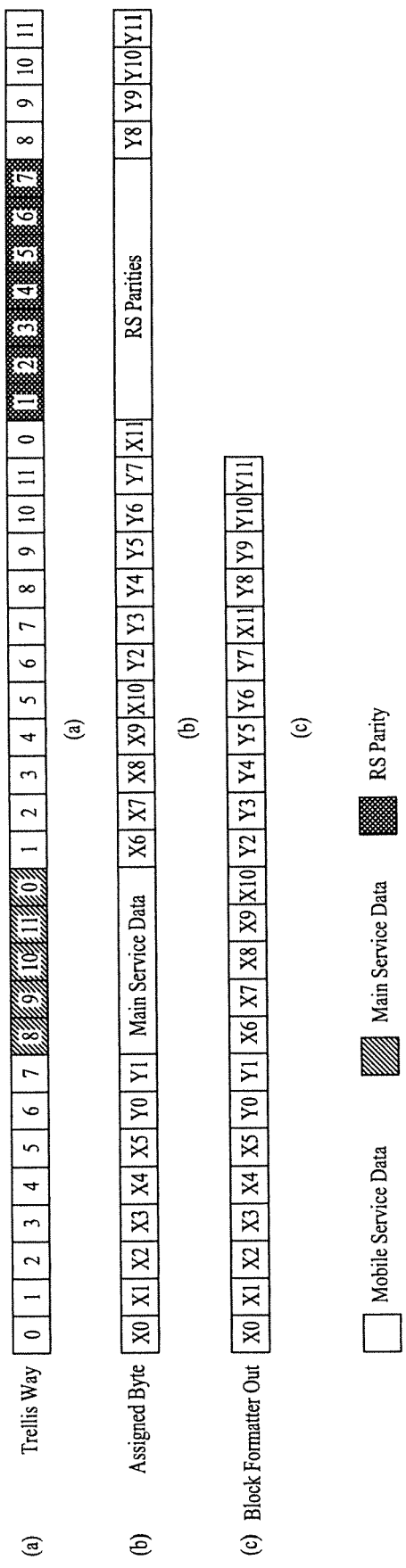
FIG. 13(a) to FIG. 13(c) illustrate block encoding and trellis encoding processes according to the present invention.

The symbol-byte converter 614 outputs the symbols having the rearranging of the symbol order completed, in accordance with the rearranged order. Thereafter, the symbols are grouped to be configured in byte units, which are then outputted to the block formatter 620. More specifically, the symbol-byte converter 614 groups 4 symbols outputted from the symbol interleaver 613 so as to configure a data byte. As shown in FIG. 13, the block formatter 620 performs the process of aligning the output of each symbol-byte converter 612 and 614 within the block in accordance with a set standard. Herein, the block formatter 620 operates in association with the trellis encoding module 256.

More specifically, the block formatter 620 decides the output order of the mobile service data outputted from each symbol-byte converter 612 and 614 while taking into consideration the place (or order) of the data excluding the mobile service data that are being inputted, wherein the mobile service data include main service data, known data, RS parity data, and MPEG header data.

Figure 14:
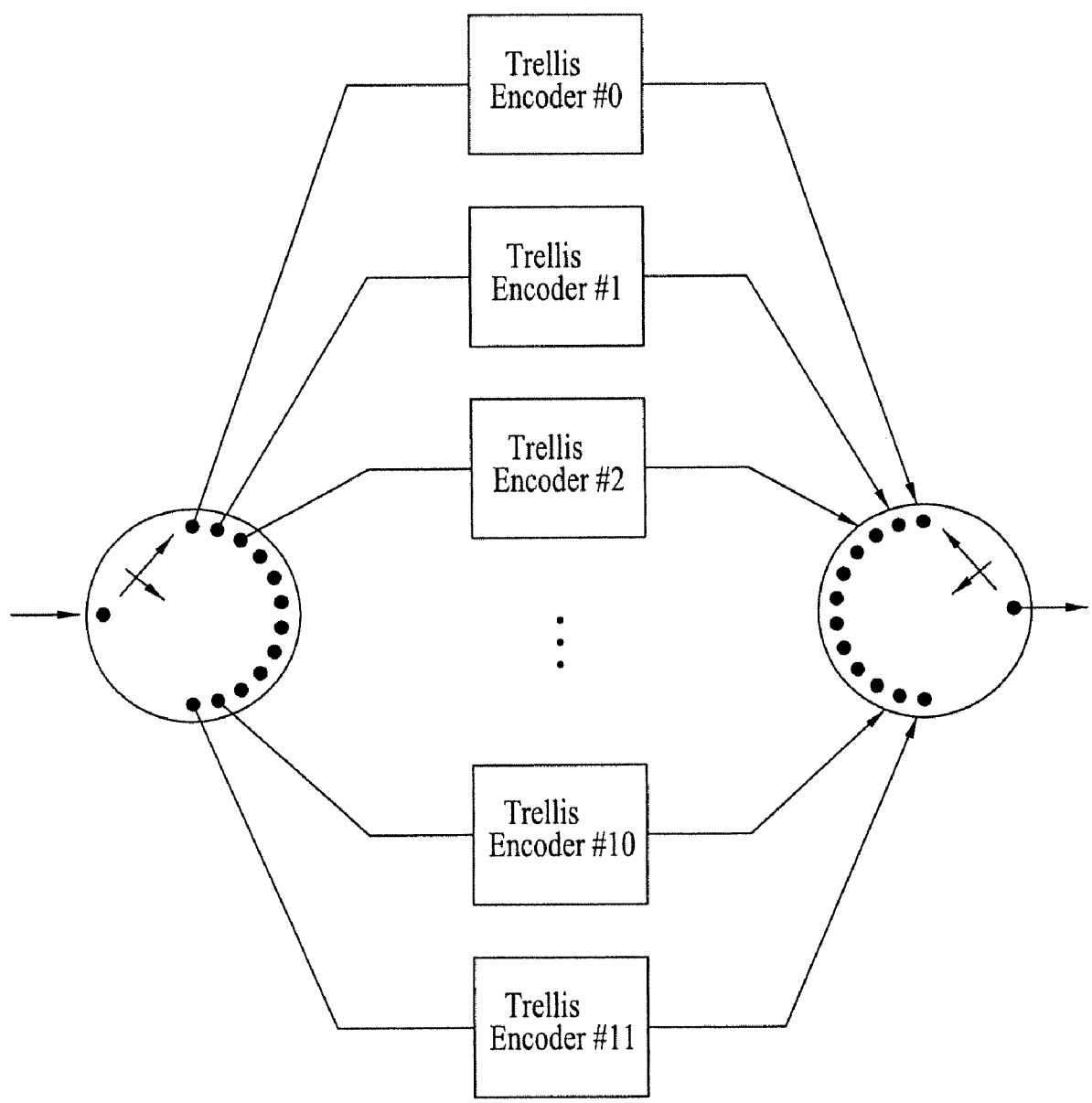
FIG. 14 illustrates a block diagram showing a trellis encoding module according to the present invention.

According to the embodiment of the present invention, the trellis encoding module 256 is provided with 12 trellis encoders. FIG. 14 illustrates a block diagram showing the trellis encoding module 256 according to the present invention. In the example shown in FIG. 14, 12 identical trellis encoders are combined to the interleaver in order to disperse noise. Herein, each trellis encoder may be provided with a pre-coder.

Figure 15A:
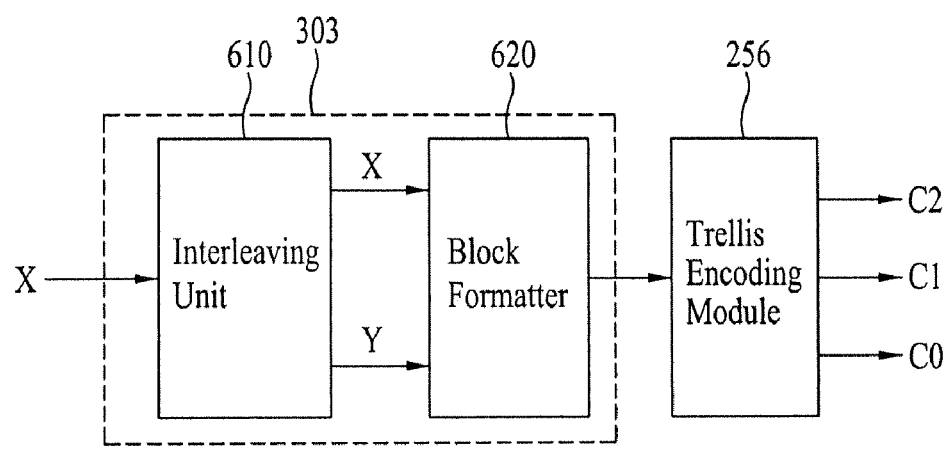
FIG. 15A and FIG. 15B a block processor and a trellis encoding module connected to one another according to the present invention.
Figure 15B:
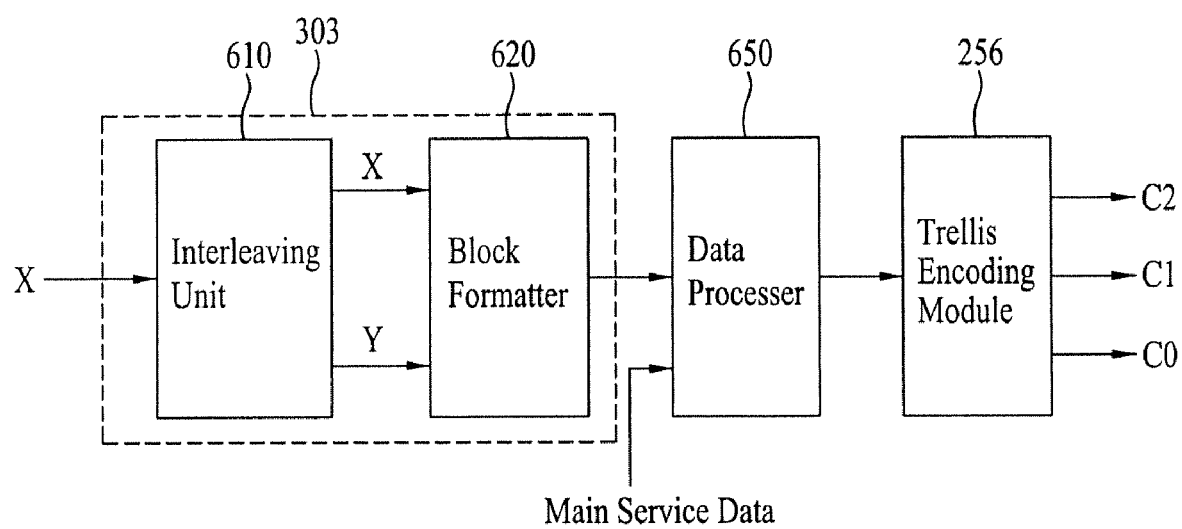

FIG. 15A illustrates the block processor 303 being concatenated with the trellis encoding module 256. In the transmitting system, a plurality of blocks actually exists between the pre-processor 230 including the block processor 303 and the trellis encoding module 256, as shown in FIG. 3. Conversely, the receiving system considers the pre-processor 230 to be concatenated with the trellis encoding module 256, thereby performing the decoding process accordingly. However, the data excluding the mobile service data that are being inputted to the trellis encoding module 256, wherein the mobile service data include main service data, known data, RS parity data, and MPEG header data, correspond to data that are added to the blocks existing between the block processor 303 and the trellis encoding module 256. FIG. 15B illustrates an example of a data processor 650 being positioned between the block processor 303 and the trellis encoding module 256, while taking the above-described instance into consideration.

Herein, when the interleaving unit 610 of the block processor 303 performs a ½-rate encoding process, the interleaving unit 610 may be configured as shown in FIG. 12A (or FIG. 12B). Referring to FIG. 3, for example, the data processor 650 may include a group formatter 304, a data deinterleaver 305, a packet formatter 306, a packet multiplexer 240, and a post-processor 250, wherein the post-processor 250 includes a data randomizer 251, a RS encoder/non-systematic RS encoder 252, a data interleaver 253, a parity replacer 254, and a non-systematic RS encoder 255.

At this point, the trellis encoding module 256 symbolizes the data that are being inputted so as to divide the symbolized data and to send the divided data to each trellis encoder in accordance with a pre-defined method. Herein, one byte is converted into 4 symbols, each being configured of 2 bits. Also, the symbols created from the single data byte are all transmitted to the same trellis encoder. Accordingly, each trellis encoder pre-codes an upper bit of the input symbol, which is then outputted as the uppermost output bit C2. Alternatively, each trellis encoder trellis-encodes a lower bit of the input symbol, which is then outputted as two output bits C1 and C0. The block formatter 620 is controlled so that the data byte outputted from each symbol-byte converter can be transmitted to different trellis encoders.

Hereinafter, the operation of the block formatter 620 will now be described in detail with reference to FIG. 9 to FIG. 12. Referring to FIG. 12A, for example, the data byte outputted from the symbol-byte converter 612 and the data byte outputted from the symbol-byte converter 614 are inputted to different trellis encoders of the trellis encoding module 256 in accordance with the control of the block formatter 620. Hereinafter, the data byte outputted from the symbol-byte converter 612 will be referred to as X, and the data byte outputted from the symbol-byte converter 614 will be referred to as Y, for simplicity. Referring to FIG. 13($a$), each number (i.e., 0 to 11) indicates the first to twelfth trellis encoders of the trellis encoding module 256, respectively.

In addition, the output order of both symbol-byte converters are arranged (or aligned) so that the data bytes outputted from the symbol-byte converter 612 are respectively inputted to the $0^{th}$ to $5^{th}$ trellis encoders (0 to 5) of the trellis encoding module 256, and that the data bytes outputted from the symbol-byte converter 614 are respectively inputted to the $6^{th}$ to $11^{th}$ trellis encoders (6 to 11) of the trellis encoding module 256. Herein, the trellis encoders having the data bytes outputted from the symbol-byte converter 612 allocated therein, and the trellis encoders having the data bytes outputted from the symbol-byte converter 614 allocated therein are merely examples given to simplify the understanding of the present invention. Furthermore, according to an embodiment of the present invention, and assuming that the input data of the block processor 303 correspond to a block configured of 12 bytes, the symbol-byte converter 612 outputs 12 data bytes from X0 to X11, and the symbol-byte converter 614 outputs 12 data bytes from Y0 to Y11.

FIG. 13($b$) illustrates an example of data being inputted to the trellis encoding module 256. Particularly, FIG. 13($b$) illustrates an example of not only the mobile service data but also the main service data and RS parity data being inputted to the trellis encoding module 256, so as to be distributed to each trellis encoder. More specifically, the mobile service data outputted from the block processor 303 pass through the group formatter 304, from which the mobile service data are mixed with the main service data and RS parity data and then outputted, as shown in FIG. 13(a). Accordingly, each data byte is respectively inputted to the 12 trellis encoders in accordance with the positions (or places) within the data group after being data-interleaved.

Herein, when the output data bytes X and Y of the symbol-byte converters 612 and 614 are allocated to each respective trellis encoder, the input of each trellis encoder may be configured as shown in FIG. 13(b). More specifically, referring to FIG. 13(b), the six mobile service data bytes (X0 to X5) outputted from the symbol-byte converter 612 are sequentially allocated (or distributed) to the first to sixth trellis encoders (0 to 5) of the trellis encoding module 256. Also, the 2 mobile service data bytes Y0 and Y1 outputted from the symbol-byte converter 614 are sequentially allocated to the $7^{th}$ and $8^{th}$ trellis encoders (6 and 7) of the trellis encoding module 256. Thereafter, among the 5 main service data bytes, 4 data bytes are sequentially allocated to the $9^{th}$ and $12^{th}$ trellis encoders (8 to 11) of the trellis encoding module 256. Finally, the remaining 1 byte of the main service data byte is allocated once again to the first trellis encoder (0).

It is assumed that the mobile service data, the main service data, and the RS parity data are allocated to each trellis encoder, as shown in FIG. 13(b). It is also assumed that, as described above, the input of the block processor 303 is configured of 12 bytes, and that 12 bytes from X0 to X11 are outputted from the symbol-byte converter 612, and that 12 bytes from Y0 to Y11 are outputted from the symbol-byte converter 614. In this case, as shown in FIG. 13(c), the block formatter 620 arranges the data bytes that are to be outputted from the symbol-byte converters 612 and 614 by the order of X0 to X5, Y0, Y1, X6 to X10, Y2 to Y7, X11, and Y8 to Y11. More specifically, the trellis encoder that is to perform the encoding process is decided based upon the position (or place) within the transmission frame in which each data byte is inserted. At this point, not only the mobile service data but also the main service data, the MPEG header data, and the RS parity data are also inputted to the trellis encoding module 256. Herein, it is assumed that, in order to perform the above-described operation, the block formatter 620 is informed of (or knows) the information on the data group format after the data-interleaving process.

Figure 16:
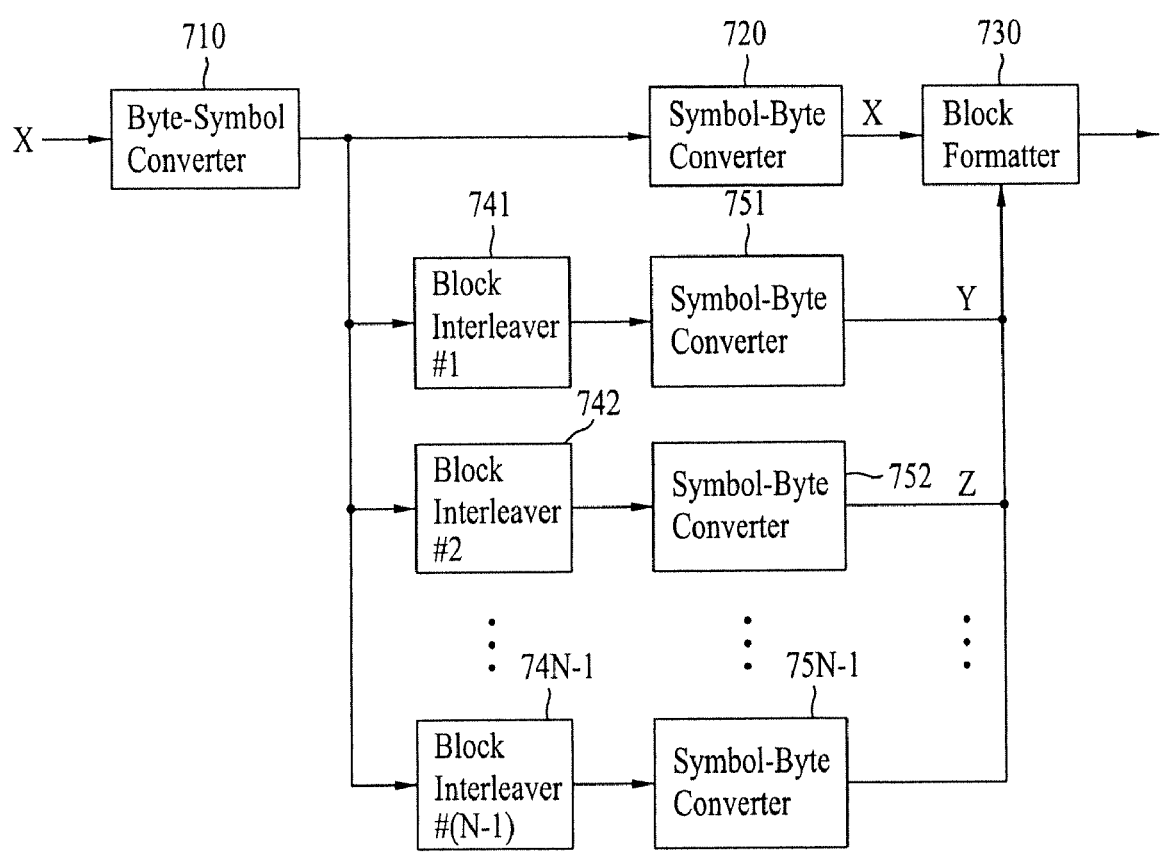
FIG. 16 illustrates a block processor according to another embodiment of the present invention.

FIG. 16 illustrates a block diagram of the block processor performing an encoding process at a coding rate of 1/N according to an embodiment of the present invention. Herein, the block processor includes (N−1) number of symbol interleavers 741 to 74N−1, which are configured in a parallel structure. More specifically, the block processor having the coding rate of 1/N consists of a total of N number of branches (or paths) including a branch (or path), which is directly transmitted to the block formatter 730. In addition, the symbol interleaver 741 to 74N−1 of each branch may each be configured of a different symbol interleaver. Furthermore, (N−1) number of symbol-byte converter 751 to 75N−1 each corresponding to each (N−1) number of symbol interleavers 741 to 74N−1 may be included at the end of each symbol interleaver, respectively. Herein, the output data of the (N−1) number of symbol-byte converter 751 to 75N−1 are also inputted to the block formatter 730.

In the example of the present invention, N is equal to or smaller than 12. If N is equal to 12, the block formatter 730 may align the output data so that the output byte of the $12^{th}$ symbol-byte converter 75N−1 is inputted to the $12^{th}$ trellis encoder. Alternatively, if N is equal to 3, the block formatter 730 may arranged the output order, so that the data bytes outputted from the symbol-byte converter 720 are inputted to the $1^{st}$ to $4^{th}$ trellis encoders of the trellis encoding module 256, and that the data bytes outputted from the symbol-byte converter 751 are inputted to the $5^{th}$ to $8^{th}$ trellis encoders, and that the data bytes outputted from the symbol-byte converter 752 are inputted to the $9^{th}$ to $12^{th}$ trellis encoders. At this point, the order of the data bytes outputted from each symbol-byte converter may vary in accordance with the position within the data group of the data other than the mobile service data, which are mixed with the mobile service data that are outputted from each symbol-byte converter.

Figure 17:
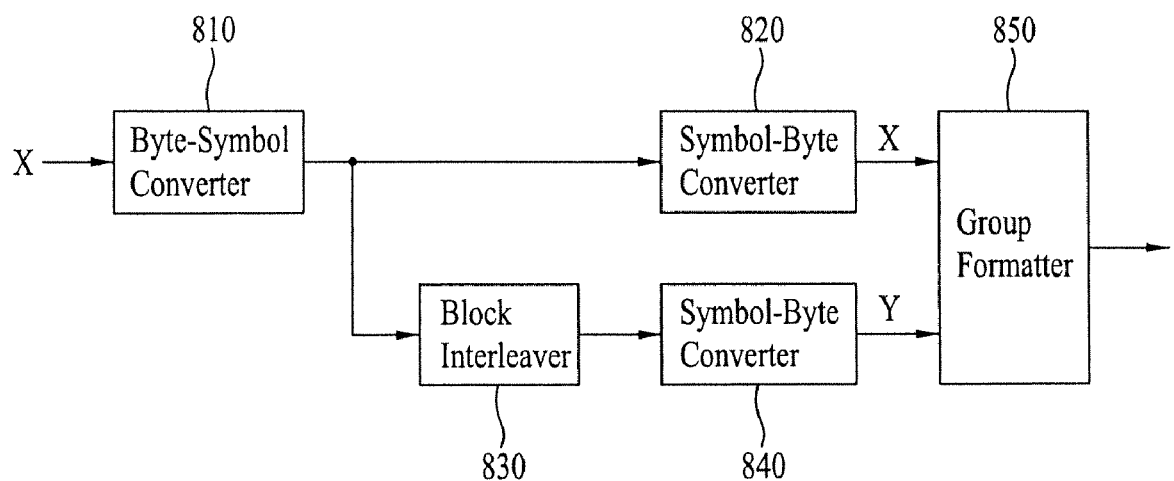
FIG. 17 illustrates a block processor according to yet another embodiment of the present invention.

FIG. 17 illustrates a detailed block diagram showing the structure of a block processor according to another embodiment of the present invention. Herein, the block formatter is removed from the block processor so that the operation of the block formatter may be performed by a group formatter. More specifically, the block processor of FIG. 17 may include a byte-symbol converter 810, symbol-byte converters 820 and 840, and a symbol interleaver 830. In this case, the output of each symbol-byte converter 820 and 840 is inputted to the group formatter 850.

Also, the block processor may obtain a desired coding rate by adding symbol interleavers and symbol-byte converters. If the system designer wishes a coding rate of 1/N, the block processor needs to be provided with a total of N number of branches (or paths) including a branch (or path), which is directly transmitted to the block formatter 850, and (N−1) number of symbol interleavers and symbol-byte converters configured in a parallel structure with (N−1) number of branches. At this point, the group formatter 850 inserts place holders ensuring the positions (or places) for the MPEG header, the non-systematic RS parity, and the main service data. And, at the same time, the group formatter 850 positions the data bytes outputted from each branch of the block processor.

The number of trellis encoders, the number of symbol-byte converters, and the number of symbol interleavers proposed in the present invention are merely exemplary. And, therefore, the corresponding numbers do not limit the spirit or scope of the present invention. It is apparent to those skilled in the art that the type and position of each data byte being allocated to each trellis encoder of the trellis encoding module 256 may vary in accordance with the data group format. Therefore, the present invention should not be understood merely by the examples given in the description set forth herein. The mobile service data that are encoded at a coding rate of 1/N and outputted from the block processor 303 are inputted to the group formatter 304. Herein, in the example of the present invention, the order of the output data outputted from the block formatter of the block processor 303 are aligned and outputted in accordance with the position of the data bytes within the data group.

Signaling Information Processing

The transmitter 200 according to the present invention may insert transmission parameters by using a plurality of methods and in a plurality of positions (or places), which are then transmitted to the receiving system. For simplicity, the definition of a transmission parameter that is to be transmitted from the transmitter to the receiving system will now be described. The transmission parameter includes data group information, region information within a data group, the number of RS frames configuring a super frame (i.e., a super frame size (SFS)), the number of RS parity data bytes (P) for each column within the RS frame, whether or not a checksum, which is added to determine the presence of an error in a row direction within the RS frame, has been used, the type and size of the checksum if the checksum is used (presently, 2 bytes are added to the CRC), the number of data groups configuring one RS frame—since the RS frame is transmitted to one burst section, the number of data groups configuring the one RS frame is identical to the number of data groups within one burst (i.e., burst size (BS)), a turbo code mode, and a RS code mode.

Also, the transmission parameter required for receiving a burst includes a burst period—herein, one burst period corresponds to a value obtained by counting the number of fields starting from the beginning of a current burst until the beginning of a next burst, a positioning order of the RS frames that are currently being transmitted within a super frame (i.e., a permuted frame index (PFI)) or a positioning order of groups that are currently being transmitted within a RS frame (burst) (i.e., a group index (GI)), and a burst size. Depending upon the method of managing a burst, the transmission parameter also includes the number of fields remaining until the beginning of the next burst (i.e., time to next burst (TNB)). And, by transmitting such information as the transmission parameter, each data group being transmitted to the receiving system may indicate a relative distance (or number of fields) between a current position and the beginning of a next burst.

The information included in the transmission parameter corresponds to examples given to facilitate the understanding of the present invention. Therefore, the proposed examples do not limit the scope or spirit of the present invention and may be easily varied or modified by anyone skilled in the art. According to the first embodiment of the present invention, the transmission parameter may be inserted by allocating a predetermined region of the mobile service data packet or the data group. In this case, the receiving system performs synchronization and equalization on a received signal, which is then decoded by symbol units. Thereafter, the packet deformatter may separate the mobile service data and the transmission parameter so as to detect the transmission parameter. According to the first embodiment, the transmission parameter may be inserted from the group formatter 304 and then transmitted.

According to the second embodiment of the present invention, the transmission parameter may be multiplexed with another type of data. For example, when known data are multiplexed with the mobile service data, a transmission parameter may be inserted, instead of the known data, in a place (or position) where a known data byte is to be inserted. Alternatively, the transmission parameter may be mixed with the known data and then inserted in the place where the known data byte is to be inserted. According to the second embodiment, the transmission parameter may be inserted from the group formatter 304 or from the packet formatter 306 and then transmitted.

According to a third embodiment of the present invention, the transmission parameter may be inserted by allocating a portion of a reserved region within a field synchronization segment of a transmission frame. In this case, since the receiving system may perform decoding on a receiving signal by symbol units before detecting the transmission parameter, the transmission parameter having information on the processing methods of the block processor 303 and the group formatter 304 may be inserted in a reserved field of a field synchronization signal. More specifically, the receiving system obtains field synchronization by using a field synchronization segment so as to detect the transmission parameter from a pre-decided position. According to the third embodiment, the transmission parameter may be inserted from the synchronization multiplexer 240 and then transmitted.

According to the fourth embodiment of the present invention, the transmission parameter may be inserted in a layer (or hierarchical region) higher than a transport stream (TS) packet. In this case, the receiving system should be able to receive a signal and process the received signal to a layer higher than the TS packet in advance. At this point, the transmission parameter may be used to certify the transmission parameter of a currently received signal and to provide the transmission parameter of a signal that is to be received in a later process.

In the present invention, the variety of transmission parameters associated with the transmission signal may be inserted and transmitted by using the above-described methods according to the first to fourth embodiment of the present invention. At this point, the transmission parameter may be inserted and transmitted by using only one of the four embodiments described above, or by using a selection of the above-described embodiments, or by using all of the above-described embodiments. Furthermore, the information included in the transmission parameter may be duplicated and inserted in each embodiment. Alternatively, only the required information may be inserted in the corresponding position of the corresponding embodiment and then transmitted. Furthermore, in order to ensure robustness of the transmission parameter, a block encoding process of a short cycle (or period) may be performed on the transmission parameter and, then, inserted in a corresponding region. The method for performing a short-period block encoding process on the transmission parameter may include, for example, Kerdock encoding, BCH encoding, RS encoding, and repetition encoding of the transmission parameter. Also, a combination of a plurality of block encoding methods may also be performed on the transmission parameter.

The transmission parameters may be grouped to create a block code of a small size, so as to be inserted in a byte place allocated within the data group for signaling and then transmitted. However, in this case, the block code passes through the block decoded from the receiving end so as to obtain a transmission parameter value. Therefore, the transmission parameters of the turbo code mode and the RS code mode, which are required for block decoding, should first be obtained. Accordingly, the transmission parameters associated with a particular mode may be inserted in a specific section of a known data region. And, in this case, a correlation of with a symbol may be used for a faster decoding process. The receiving system refers to the correlation between each sequence and the currently received sequences, thereby determining the encoding mode and the combination mode.

Meanwhile, when the transmission parameter is inserted in the field synchronization segment region or the known data region and then transmitted, and when the transmission parameter has passed through the transmission channel, the reliability of the transmission parameter is deteriorated. Therefore, one of a plurality of pre-defined patterns may also be inserted in accordance with the corresponding transmission parameter. Herein, the receiving system performs a correlation calculation between the received signal and the pre-defined patterns so as to recognize the transmission parameter. For example, it is assumed that a burst including 5 data groups is pre-decided as pattern A based upon an agreement between the transmitting system and the receiving system. In this case, the transmitting system inserts and transmits pattern A, when the number of groups within the burst is equal to 5. Thereafter, the receiving system calculates a correlation between the received data and a plurality of reference patterns including pattern A, which was created in advance. At this point, if the correlation value between the received data and pattern A is the greatest, the received data indicates the corresponding parameter, and most particularly, the number of groups within the burst. At this point, the number of groups may be acknowledged as 5. Hereinafter, the process of inserting and transmitting the transmission parameter will now be described according to first, second, and third embodiments of the present invention.

First Embodiment

Figure 18:
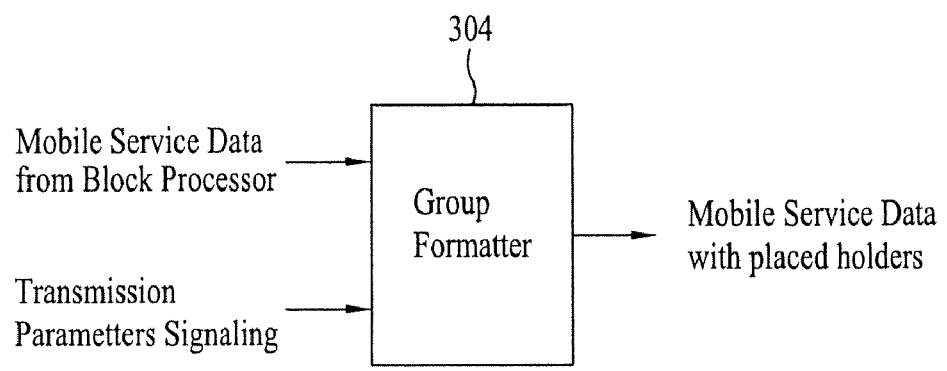
FIG. 18 illustrates an example of a group formatter inserting and transmitting a transmission parameter.

FIG. 18 illustrates a schematic diagram of the group formatter 304 receiving the transmission parameter and inserting the received transmission parameter in region A of the data group according to the present invention. Herein, the group formatter 304 receives mobile service data from the block processor 303. Conversely, the transmission parameter is processed with at least one of a data randomizing process, a RS frame encoding process, and a block processing process, and may then be inputted to the group formatter 304. Alternatively, the transmission parameter may be directly inputted to the group formatter 304 without being processed with any of the above-mentioned processes. In addition, the transmission parameter may be provided from the service multiplexer 100. Alternatively, the transmission parameter may also be generated and provided from within the transmitter 200. The transmission parameter may also include information required by the receiving system in order to receive and process the data included in the data group. For example, the transmission parameter may include data group information, and multiplexing information.

The group formatter 304 inserts the mobile service data and transmission parameter which are to be inputted to corresponding regions within the data group in accordance with a rule for configuring a data group. For example, the transmission parameter passes through a block encoding process of a short period and is, then, inserted in region A of the data group. Particularly, the transmission parameter may be inserted in a pre-arranged and arbitrary position (or place) within region A. If it is assumed that the transmission parameter has been block encoded by the block processor 303, the block processor 303 performs the same data processing operation as the mobile service data, more specifically, either a ½-rate encoding or ¼-rate encoding process on the signaling information including the transmission parameter. Thereafter, the block processor 303 outputs the processed transmission parameter to the group formatter 304. Thereafter, the signaling information is also recognized as the mobile service data and processed accordingly.

Figure 19:
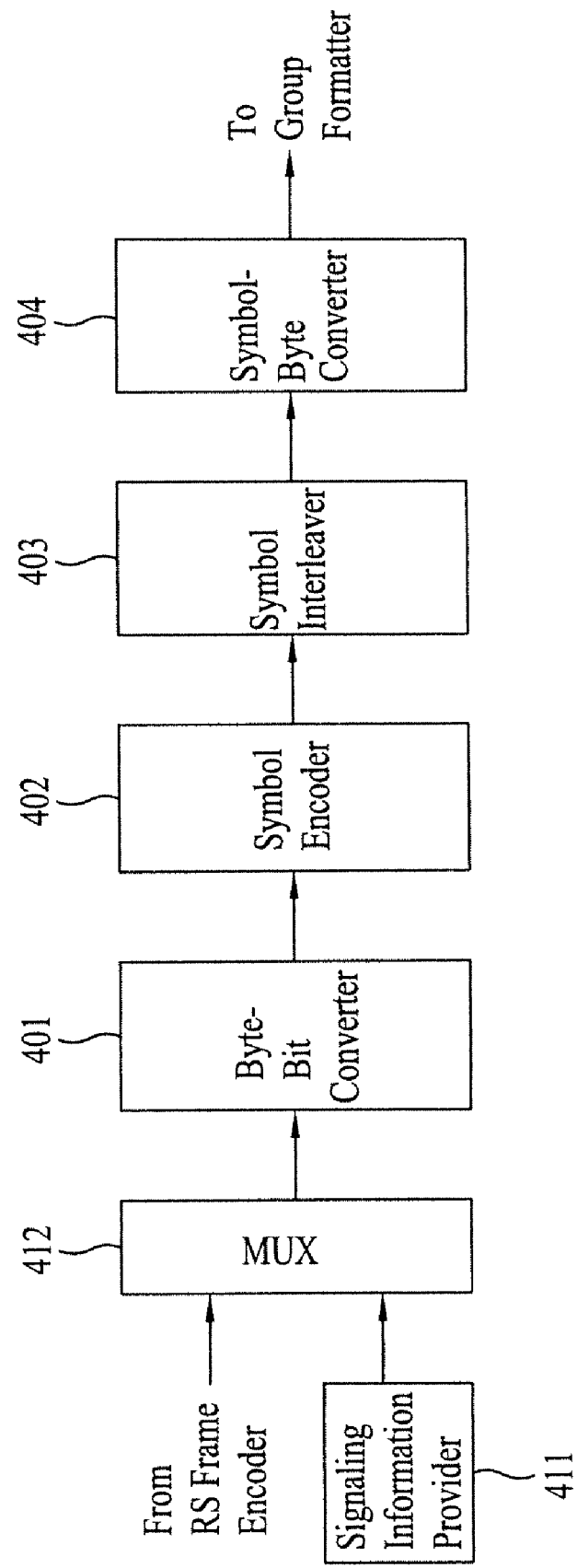
FIG. 19 illustrates an example of a block processor inserting and transmitting a transmission parameter.

FIG. 19 illustrates a block diagram showing an example of the block processor receiving the transmission parameter and processing the received transmission parameter with the same process as the mobile service data. Particularly, FIG. 19 illustrates an example showing the structure of FIG. 9 further including a signaling information provider 411 and multiplexer 412. More specifically, the signaling information provider 411 outputs the signaling information including the transmission parameter to the multiplexer 412. The multiplexer 412 multiplexes the signaling information and the output of the RS frame encoder 302. Then, the multiplexer 412 outputs the multiplexed data to the byte-bit converter 401.

The byte-bit converter 401 divides the mobile service data bytes or signaling information byte outputted from the multiplexer 412 into bits, which are then outputted to the symbol encoder 402. The subsequent operations are identical to those described in FIG. 9. Therefore, a detailed description of the same will be omitted for simplicity. If any of the detailed structures of the block processor 303 shown in FIG. 12, FIG. 15, FIG. 16, and FIG. 17, the signaling information provider 411 and the multiplexer 412 may be provided behind the byte-symbol converter.

Second Embodiment

Meanwhile, when known data generated from the group formatter in accordance with a pre-decided rule are inserted in a corresponding region within the data group, a transmission parameter may be inserted in at least a portion of a region, where known data may be inserted, instead of the known data. For example, when a long known data sequence is inserted at the beginning of region A within the data group, a transmission parameter may be inserted in at least a portion of the beginning of region A instead of the known data. A portion of the known data sequence that is inserted in the remaining portion of region A, excluding the portion in which the transmission parameter is inserted, may be used to detect a starting point of the data group by the receiving system. Alternatively, another portion of region A may be used for channel equalization by the receiving system.

In addition, when the transmission parameter is inserted in the known data region instead of the actual known data. The transmission parameter may be block encoded in short periods and then inserted. Also, as described above, the transmission parameter may also be inserted based upon a pre-defined pattern in accordance with the transmission parameter. If the group formatter 304 inserts known data place holders in a region within the data group, wherein known data may be inserted, instead of the actual known data, the transmission parameter may be inserted by the packet formatter 306. More specifically, when the group formatter 304 inserts the known data place holders, the packet formatter 306 may insert the known data instead of the known data place holders. Alternatively, when the group formatter 304 inserts the known data, the known data may be directly outputted without modification.

Figure 20:
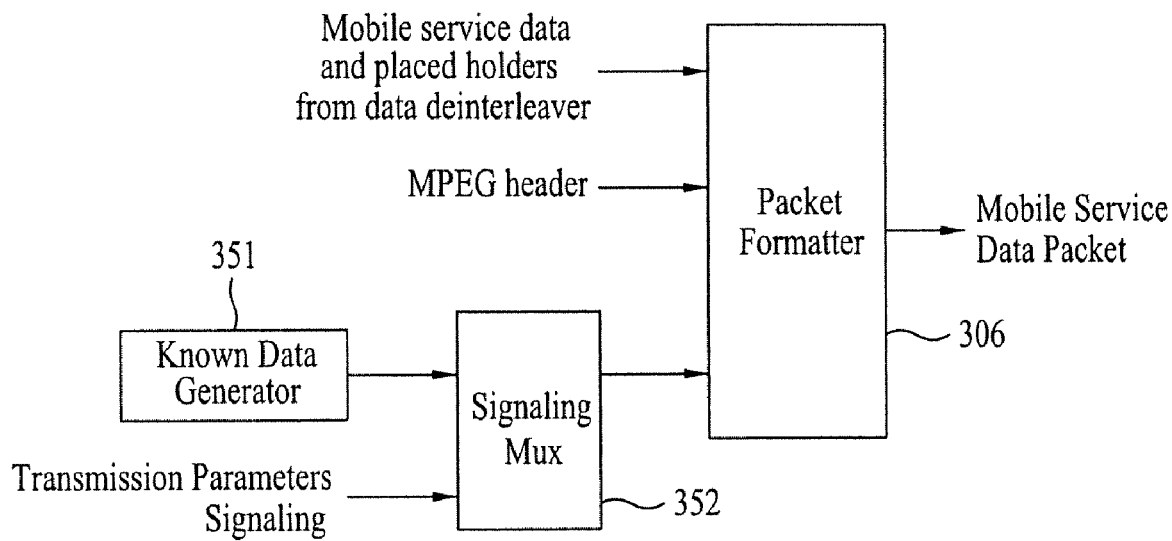
FIG. 20 illustrates an example of a packet formatter inserting and transmitting a transmission parameter.

FIG. 20 illustrates a block diagram showing the structure of a packet formatter 306 being expanded so that the packet formatter 306 can insert the transmission parameter according to an embodiment of the present invention. More specifically, the structure of the packet formatter 306 further includes a known data generator 351 and a signaling multiplexer 352. Herein, the transmission parameter that is inputted to the signaling multiplexer 352 may include information on the length of a current burst, information indicating a starting point of a next burst, positions in which the groups within the burst exist and the lengths of the groups, information on the time from the current group and the next group within the burst, and information on known data.

The signaling multiplexer 352 selects one of the transmission parameter and the known data generated from the known data generator 351 and, then, outputs the selected data to the packet formatter 306. The packet formatter 306 inserts the known data or transmission parameter outputted from the signaling multiplexer 352 into the known data place holders outputted from the data interleaver 305. Then, the packet formatter 306 outputs the processed data. More specifically, the packet formatter 306 inserts a transmission parameter in at least a portion of the known data region instead of the known data, which is then outputted. For example, when a known data place holder is inserted at a beginning portion of region A within the data group, a transmission parameter may be inserted in a portion of the known data place holder instead of the actual known data.

Also, when the transmission parameter is inserted in the known data place holder instead of the known data, the transmission parameter may be block encoded in short periods and inserted. Alternatively, a pre-defined pattern may be inserted in accordance with the transmission parameter. More specifically, the signaling multiplexer 352 multiplexes the known data and the transmission parameter (or the pattern defined by the transmission parameter) so as to configure a new known data sequence. Then, the signaling multiplexer 352 outputs the newly configured known data sequence to the packet formatter 306. The packet formatter 306 deletes the main service data place holder and RS parity place holder from the output of the data interleaver 305, and creates a mobile service data packet of 188 bytes by using the mobile service data, MPEG header, and the output of the signaling multiplexer. Then, the packet formatter 306 outputs the newly created mobile service data packet to the packet multiplexer 240.

In this case, the region A of each data group has a different known data pattern. Therefore, the receiving system separates only the symbol in a pre-arranged section of the known data sequence and recognizes the separated symbol as the transmission parameter. Herein, depending upon the design of the transmitting system, the known data may be inserted in different blocks, such as the packet formatter 306, the group formatter 304, or the block processor 303. Therefore, a transmission parameter may be inserted instead of the known data in the block wherein the known data are to be inserted.

According to the second embodiment of the present invention, a transmission parameter including information on the processing method of the block processor 303 may be inserted in a portion of the known data region and then transmitted. In this case, a symbol processing method and position of the symbol for the actual transmission parameter symbol are already decided. Also, the position of the transmission parameter symbol should be positioned so as to be transmitted or received earlier than any other data symbols that are to be decoded. Accordingly, the receiving system may detect the transmission symbol before the data symbol decoding process, so as to use the detected transmission symbol for the decoding process.

Third Embodiment

Figure 21:
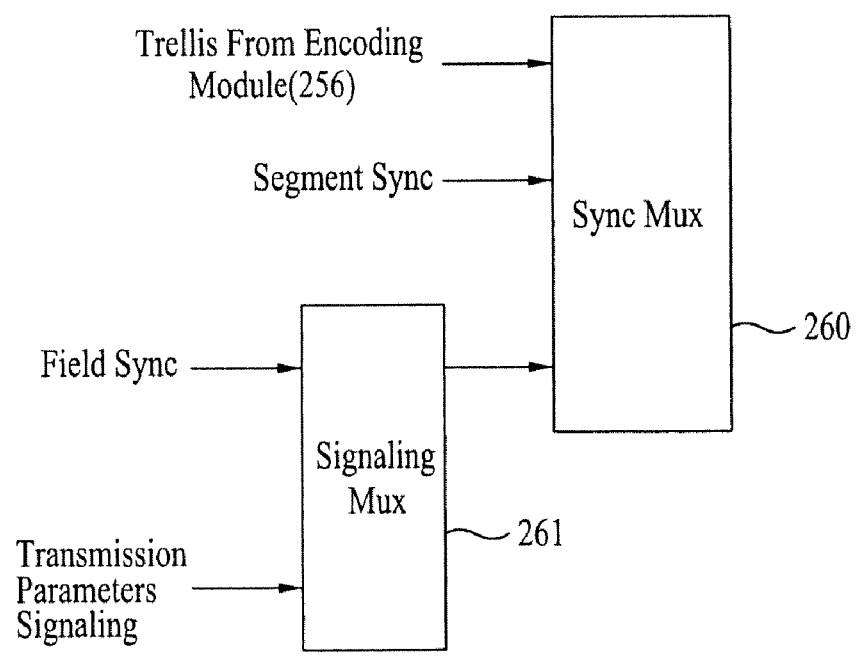
FIG. 21 illustrates an example for inserting and transmitting the transmission parameter in a field synchronization segment area.

Meanwhile, the transmission parameter may also be inserted in the field synchronization segment region and then transmitted. FIG. 21 illustrates a block diagram showing the synchronization multiplexer being expanded in order to allow the transmission parameter to be inserted in the field synchronization segment region. Herein, a signaling multiplexer 261 is further included in the synchronization multiplexer 260. The transmission parameter of the general VSB method is configured of 2 fields. More specifically, each field is configured of one field synchronization segment and 312 data segments. Herein, the first 4 symbols of a data segment correspond to the segment synchronization portion, and the first data segment of each field corresponds to the field synchronization portion.

One field synchronization signal is configured to have the length of one data segment. The data segment synchronization pattern exists in the first 4 symbols, which are then followed by pseudo random sequences PN 511, PN 63, PN 63, and PN 63. The next 24 symbols include information associated with the VSB mode. Additionally, the 24 symbols that include information associated with the VSB mode are followed by the remaining 104 symbols, which are reserved symbols. Herein, the last 12 symbols of a previous segment are copied and positioned as the last 12 symbols in the reserved region. In other words, only the 92 symbols in the field synchronization segment are the symbols that correspond to the actual reserved region.

Therefore, the signaling multiplexer 261 multiplexes the transmission parameter with an already-existing field synchronization segment symbol, so that the transmission parameter can be inserted in the reserved region of the field synchronization segment. Then, the signaling multiplexer 261 outputs the multiplexed transmission parameter to the synchronization multiplexer 260. The synchronization multiplexer 260 multiplexes the segment synchronization symbol, the data symbols, and the new field synchronization segment outputted from the signaling multiplexer 261, thereby configuring a new transmission frame. The transmission frame including the field synchronization segment, wherein the transmission parameter is inserted, is outputted to the transmission unit 270. At this point, the reserved region within the field synchronization segment for inserting the transmission parameter may correspond to a portion of or the entire 92 symbols of the reserved region. Herein, the transmission parameter being inserted in the reserved region may, for example, include information identifying the transmission parameter as the main service data, the mobile service data, or a different type of mobile service data.

If the information on the processing method of the block processor 303 is transmitted as a portion of the transmission parameter, and when the receiving system wishes to perform a decoding process corresponding to the block processor 303, the receiving system should be informed of such information on the block processing method in order to perform the decoding process. Therefore, the information on the processing method of the block processor 303 should already be known prior to the block decoding process. Accordingly, as described in the third embodiment of the present invention, when the transmission parameter having the information on the processing method of the block processor 303 (and/or the group formatter 304) is inserted in the reserved region of the field synchronization signal and then transmitted, the receiving system is capable of detecting the transmission parameter prior to performing the block decoding process on the received signal.

Receiving System

Figure 22:
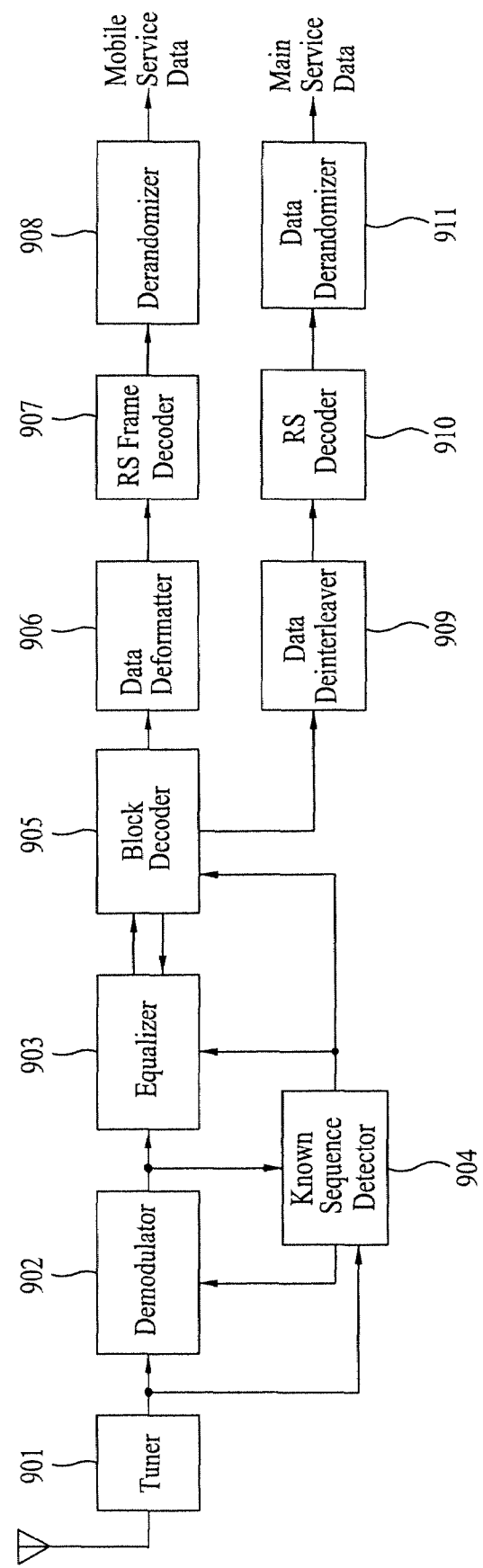
FIG. 22 illustrates a block diagram showing a structure of a digital broadcast receiving system according to the present invention.

FIG. 22 illustrates a block diagram showing a structure of a digital broadcast receiving system according to the present invention. The digital broadcast receiving system of FIG. 22 uses known data information, which is inserted in the mobile service data section and, then, transmitted by the transmitting system, so as to perform carrier synchronization recovery, frame synchronization recovery, and channel equalization, thereby enhancing the receiving performance. Referring to FIG. 22, the digital broadcast receiving system includes a tuner 901, a demodulator 902, an equalizer 903, a known sequence detector 904, a block decoder 905, a data deformatter 906, a RS frame decoder 907, a derandomizer 908, a data deinterleaver 909, a RS decoder 910, and a data derandomizer 911. Herein, for simplicity of the description of the present invention, the data deformatter 906, the RS frame decoder 907, and the derandomizer 908 will be collectively referred to as a mobile service data processing unit. And, the data deinterleaver 909, the RS decoder 910, and the data derandomizer 911 will be collectively referred to as a main service data processing unit.

More specifically, the tuner 901 tunes a frequency of a particular channel and down-converts the tuned frequency to an intermediate frequency (IF) signal. Then, the tuner 901 outputs the down-converted IF signal to the demodulator 902 and the known sequence detector 904. The demodulator 902 performs self gain control, carrier recovery, and timing recovery processes on the inputted IF signal, thereby modifying the IF signal to a baseband signal. Then, the demodulator 902 outputs the newly created baseband signal to the equalizer 903 and the known sequence detector 904. The equalizer 903 compensates the distortion of the channel included in the demodulated signal and then outputs the error-compensated signal to the block decoder 905.

At this point, the known sequence detector 904 detects the known sequence place inserted by the transmitting end from the input/output data of the demodulator 902 (i.e., the data prior to the demodulation process or the data after the demodulation process). Thereafter, the place information along with the symbol sequence of the known data, which are generated from the detected place, is outputted to the demodulator 902 and the equalizer 903. Also, the known sequence detector 904 outputs a set of information to the block decoder 905. This set of information is used to allow the block decoder 905 of the receiving system to identify the mobile service data that are processed with additional encoding from the transmitting system and the main service data that are not processed with additional encoding. In addition, although the connection status is not shown in FIG. 22, the information detected from the known sequence detector 904 may be used throughout the entire receiving system and may also be used in the data deformatter 906 and the RS frame decoder 907. The demodulator 902 uses the known data symbol sequence during the timing and/or carrier recovery, thereby enhancing the demodulating performance. Similarly, the equalizer 903 uses the known data so as to enhance the equalizing performance. Moreover, the decoding result of the block decoder 905 may be fed-back to the equalizer 903, thereby enhancing the equalizing performance.

The equalizer 903 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 6A. More specifically, in the example of the present invention, each region A, B, and C are further divided into regions A1 to A5, regions B1 and B2, and regions C1 to C3, respectively. Referring to FIG. 6A, the CIR that is estimated from the field synchronization data in the data structure is referred to as CIR_FS. Alternatively, the CIRs that are estimated from each of the 5 known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(A) of a function F(x) at a particular point A and a value F(B) of the function F(x) at another particular point B are known, interpolation refers to estimating a function value of a point within the section between points A and B. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(A) of a function F(x) at a particular point A and a value F(B) of the function F(x) at another particular point B are known, extrapolation refers to estimating a function value of a point outside of the section between points A and B. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions B2, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being inputted to the block decoder 905 after being channel equalized from the equalizer 903 correspond to the mobile service data having additional encoding and trellis encoding performed thereon by the transmitting system, trellis decoding and additional decoding processes are performed on the inputted data as inverse processes of the transmitting system. Alternatively, if the data being inputted to the block decoder 905 correspond to the main service data having only trellis encoding performed thereon, and not the additional encoding, only the trellis decoding process is performed on the inputted data as the inverse process of the transmitting system.

The data group decoded by the block decoder 905 is inputted to the data deformatter 906, and the main service data are inputted to the data deinterleaver 909. According to another embodiment, the main service data may also bypass the block decoder 905 so as to be directly inputted to the data deinterleaver 909. In this case, a trellis decoder for the main service data should be provided before the data deinterleaver 909. When the block decoder 905 outputs the data group to the data deformatter 906, the known data, trellis initialization data, and MPEG header, which are inserted in the data group, and the RS parity, which is added by the RS encoder/non-systematic RS encoder or non-systematic RS encoder of the transmitting system, are removed. Then, the processed data are outputted to the data deformatter 906. Herein, the removal of the data may be performed before the block decoding process, or may be performed during or after the block decoding process. If the transmitting system includes signaling information in the data group upon transmission, the signaling information is outputted to the data deformatter 906.

More specifically, if the inputted data correspond to the main service data, the block decoder 905 performs Viterbi decoding on the inputted data so as to output a hard decision value or to perform a hard-decision on a soft decision value, thereby outputting the result. Meanwhile, if the inputted data correspond to the mobile service data, the block decoder 905 outputs a hard decision value or a soft decision value with respect to the inputted mobile service data. In other words, if the inputted data correspond to the mobile service data, the block decoder 905 performs a decoding process on the data encoded by the block processor and trellis encoding module of the transmitting system.

At this point, the RS frame encoder of the pre-processor included in the transmitting system may be viewed as an external code. And, the block processor and the trellis encoder may be viewed as an internal code. In order to maximize the performance of the external code when decoding such concatenated codes, the decoder of the internal code should output a soft decision value. Therefore, the block decoder 905 may output a hard decision value on the mobile service data. However, when required, it may be more preferable for the block decoder 905 to output a soft decision value.

Meanwhile, the data deinterleaver 909, the RS decoder 910, and the derandomizer 911 are blocks required for receiving the main service data. Therefore, the above-mentioned blocks may not be required in the structure of a digital broadcast receiving system that only receives the mobile service data. The data deinterleaver 909 performs an inverse process of the data interleaver included in the transmitting system. In other words, the data deinterleaver 909 deinterleaves the main service data outputted from the block decoder 905 and outputs the deinterleaved main service data to the RS decoder 910. The RS decoder 910 performs a systematic RS decoding process on the deinterleaved data and outputs the processed data to the derandomizer 911. The derandomizer 911 receives the output of the RS decoder 910 and generates a pseudo random data byte identical to that of the randomizer included in the digital broadcast transmitting system. Thereafter, the derandomizer 911 performs a bitwise exclusive OR (XOR) operation on the generated pseudo random data byte, thereby inserting the MPEG synchronization bytes to the beginning of each packet so as to output the data in 188-byte main service data packet units.

Meanwhile, the data being outputted from the block decoder 905 to the data deformatter 906 are inputted in the form of a data group. At this point, the data deformatter 906 already knows the structure of the data that are to be inputted and is, therefore, capable of identifying the signaling information, which includes the system information, and the mobile service data from the data group. Thereafter, the data deformatter 906 outputs the identified signaling information to a block for processing signaling information (not shown) and outputs the identified mobile service data to the RS frame decoder 907. More specifically, the RS frame decoder 907 receives only the RS encoded and CRC encoded mobile service data that are transmitted from the data deformatter 906.

The RS frame encoder 907 performs an inverse process of the RS frame encoder included in the transmitting system so as to correct the error within the RS frame. Then, the RS frame decoder 907 adds the 1-byte MPEG synchronization service data packet, which had been removed during the RS frame encoding process, to the error-corrected mobile service data packet. Thereafter, the processed data packet is outputted to the derandomizer 908. The operation of the RS frame decoder 907 will be described in detail in a later process. The derandomizer 908 performs a derandomizing process, which corresponds to the inverse process of the randomizer included in the transmitting system, on the received mobile service data. Thereafter, the derandomized data are outputted, thereby obtaining the mobile service data transmitted from the transmitting system. Hereinafter, detailed operations of the RS frame decoder 907 will now be described.

Figure 23:
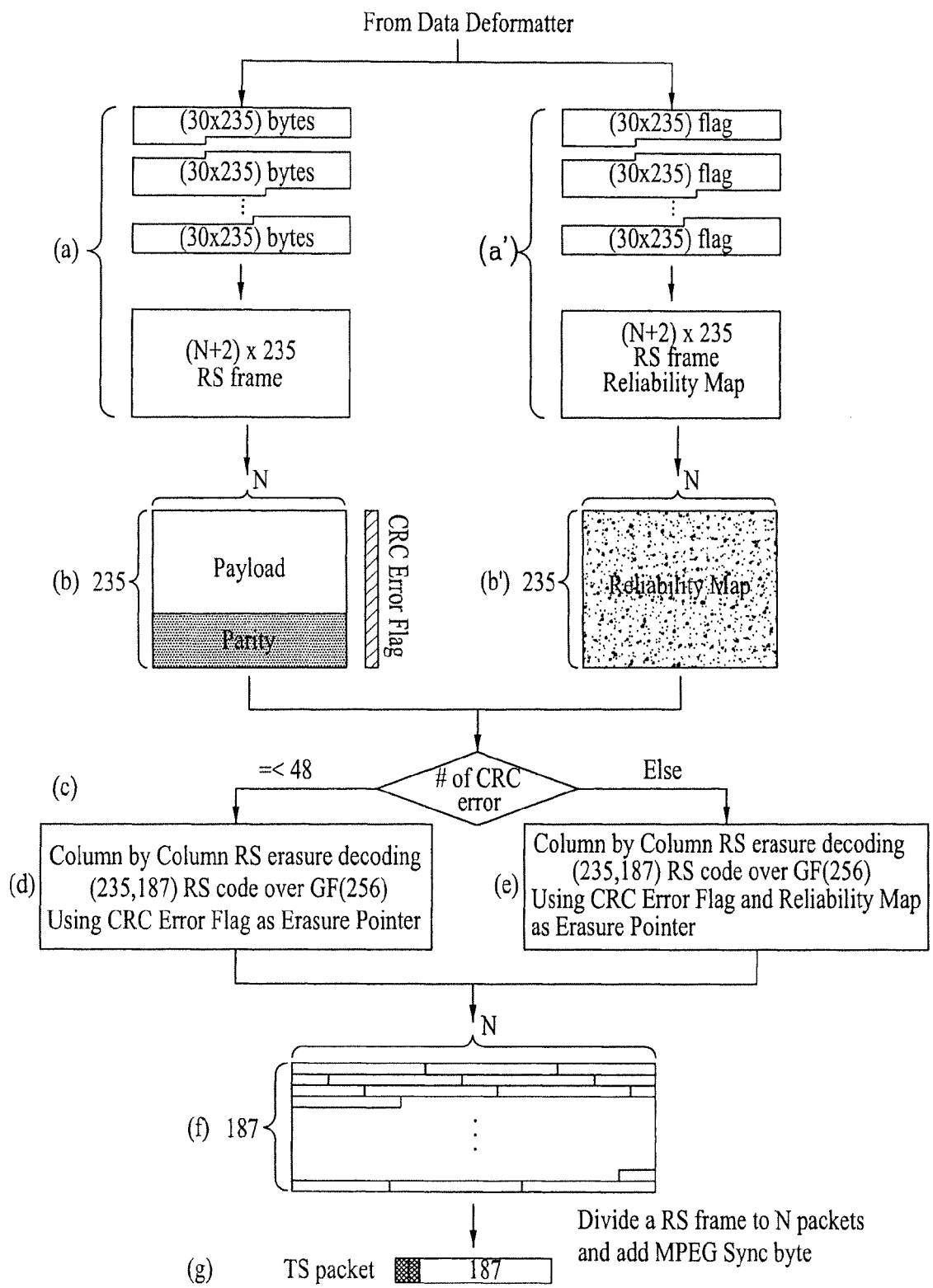
FIG. 23 illustrates an example of an error correction decoding process according to the present invention.

FIG. 23 illustrates a series of exemplary step of an error correction decoding process of the RS frame decoder 907 according to the present invention. More specifically, the RS frame decoder 907 groups mobile service data bytes received from the data deformatter 906 so as to configure an RS frame. The mobile service data correspond to data RS encoded and CRC encoded from the transmitting system. FIG. 23(*a*) illustrates an example of configuring the RS frame. More specifically, the transmitting system divided the RS frame having the size of (N+2)*235 to 30*235 byte blocks. When it is assumed that each of the divided mobile service data byte blocks is inserted in each data group and then transmitted, the receiving system also groups the 30*235 mobile service data byte blocks respectively inserted in each data group, thereby configuring an RS frame having the size of (N+2)*235. For example, when it is assumed that an RS frame is divided into 18 30*235 byte blocks and transmitted from a burst section, the receiving system also groups the mobile service data bytes of 18 data groups within the corresponding burst section, so as to configure the RS frame. Furthermore, when it is assumed that N is equal to 538 (i.e., N=538), the RS frame decoder 907 may group the mobile service data bytes within the 18 data groups included in a burst so as to configure a RS frame having the size of 540*235 bytes.

Herein, when it is assumed that the block decoder 905 outputs a soft decision value for the decoding result, the RS frame decoder 907 may decide the '0' and '1' of the corresponding bit by using the codes of the soft decision value. 8 bits that are each decided as described above are grouped to create 1 data byte. If the above-described process is performed on all soft decision values of the 18 data groups included in a single burst, the RS frame having the size of 540*235 bytes may be configured. Additionally, the present invention uses the soft decision value not only to configure the RS frame but also to configure a reliability map. Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure 1 data byte, is determined to be unreliable, the corresponding data byte is marked on the reliability map as an unreliable data byte.

Herein, determining the reliability of 1 data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the 1 data byte are determined to be reliable (i.e., when the absolute value of the soft decision values of all 8 bits included in the 1 data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of 540*235 bytes, the reliability map is also configured to have the size of 540*235 bytes. FIG. 23($a'$) illustrates the process steps of configuring the reliability map according to the present invention. Meanwhile, if a RS frame is configured to have the size of (N+2)*235 bytes, the RS frame decoder 907 performs a CRC syndrome checking process on the corresponding RS frame, thereby verifying whether any error has occurred in each row. Subsequently, as shown in FIG. 23($b$), a 2-byte checksum is removed to configure an RS frame having the size of N*235 bytes. Herein, the presence (or existence) of an error is indicated on an error flag corresponding to each row. Similarly, since the portion of the reliability map corresponding to the CRC checksum has hardly any applicability, this portion is removed so that only N*235 number of the reliability information bytes remain, as shown in FIG. 23($b'$).

After performing the CRC syndrome checking process, the RS frame decoder 907 performs RS decoding in a column direction. Herein, a RS erasure correction process may be performed in accordance with the number of CRC error flags. More specifically, as shown in FIG. 23($c$), the CRC error flag corresponding to each row within the RS frame is verified. Thereafter, the RS frame decoder 907 determines whether the number of rows having a CRC error occurring therein is equal to or smaller than the maximum number of errors on which the RS erasure correction may be performed, when performing the RS decoding process in a column direction. The maximum number of errors corresponds to a number of parity bytes inserted when performing the RS encoding process. In the embodiment of the present invention, it is assumed that 48 parity bytes have been added to each column.

If the number of rows having the CRC errors occurring therein is smaller than or equal to the maximum number of errors (i.e., 48 errors according to this embodiment) that can be corrected by the RS erasure decoding process, a (235,187)-RS erasure decoding process is performed in a column direction on the RS frame having 235 N-byte rows, as shown in FIG. 23($d$). Thereafter, as shown in FIG. 23($f$), the 48-byte parity data that have been added at the end of each column are removed. Conversely, however, if the number of rows having the CRC errors occurring therein is greater than the maximum number of errors (i.e., 48 errors) that can be corrected by the RS erasure decoding process, the RS erasure decoding process cannot be performed. In this case, the error may be corrected by performing a general RS decoding process. In addition, the reliability map, which has been created based upon the soft decision value along with the RS frame, may be used to further enhance the error correction ability (or performance) of the present invention.

More specifically, the RS frame decoder 907 compares the absolute value of the soft decision value of the block decoder 905 with the pre-determined threshold value, so as to determine the reliability of the bit value decided by the code of the corresponding soft decision value. Also, 8 bits, each being determined by the code of the soft decision value, are grouped to form 1 data byte. Accordingly, the reliability information on this 1 data byte is indicated on the reliability map. Therefore, as shown in FIG. 23($e$), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points. Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column. When error correction decoding is performed on all column directions within the RS frame by using the above-described process, the 48-byte parity data which were added at the end of each column are removed, as shown in FIG. 23(f).

As described above, even though the total number of CRC errors corresponding to each row within the RS frame is greater than the maximum number of errors that can be corrected by the RS erasure decoding process, when the number of bytes determined to have a low reliability level, based upon the reliability information on the reliability map within a particular column, while performing error correction decoding on the particular column. Herein, the difference between the general RS decoding process and the RS erasure decoding process is the number of errors that can be corrected. More specifically, when performing the general RS decoding process, the number of errors corresponding to half of the number of parity bytes (i.e., (number of parity bytes)/2) that are inserted during the RS encoding process may be error corrected (e.g., 24 errors may be corrected). Alternatively, when performing the RS erasure decoding process, the number of errors corresponding to the number of parity bytes that are inserted during the RS encoding process may be error corrected (e.g., 48 errors may be corrected).

After performing the error correction decoding process, as described above, a RS frame configured of 187 N-byte rows (or packets) maybe obtained, as shown in FIG. 23(f). Furthermore, the RS frame having the size of N*187 bytes is sequentially outputted in N number of 187-byte units. Herein, as shown in FIG. 23(g), the 1-byte MPEG synchronization byte that was removed by the transmitting system is added at the end of each 187-byte packet, thereby outputting 188-byte mobile service data packets.

Hereinafter, an example of acquiring signaling information included in the broadcast signal and an example of managing a burst will be described in detailed in accordance with the example of the broadcast system given herein. The data included in the field sync region (field sync data) and the data in the known data region of the signal frame structure shown in FIG. 6A are pre-known to a broadcast receiving system. Therefore, the receiving system performs a reliability test on the field sync data and the known data in order to obtain the signaling information, thereby obtaining synchronization domain data and known data. In addition, the broadcast receiving system may receive transmission parameters including burst information through the signaling information.

Figure 24:
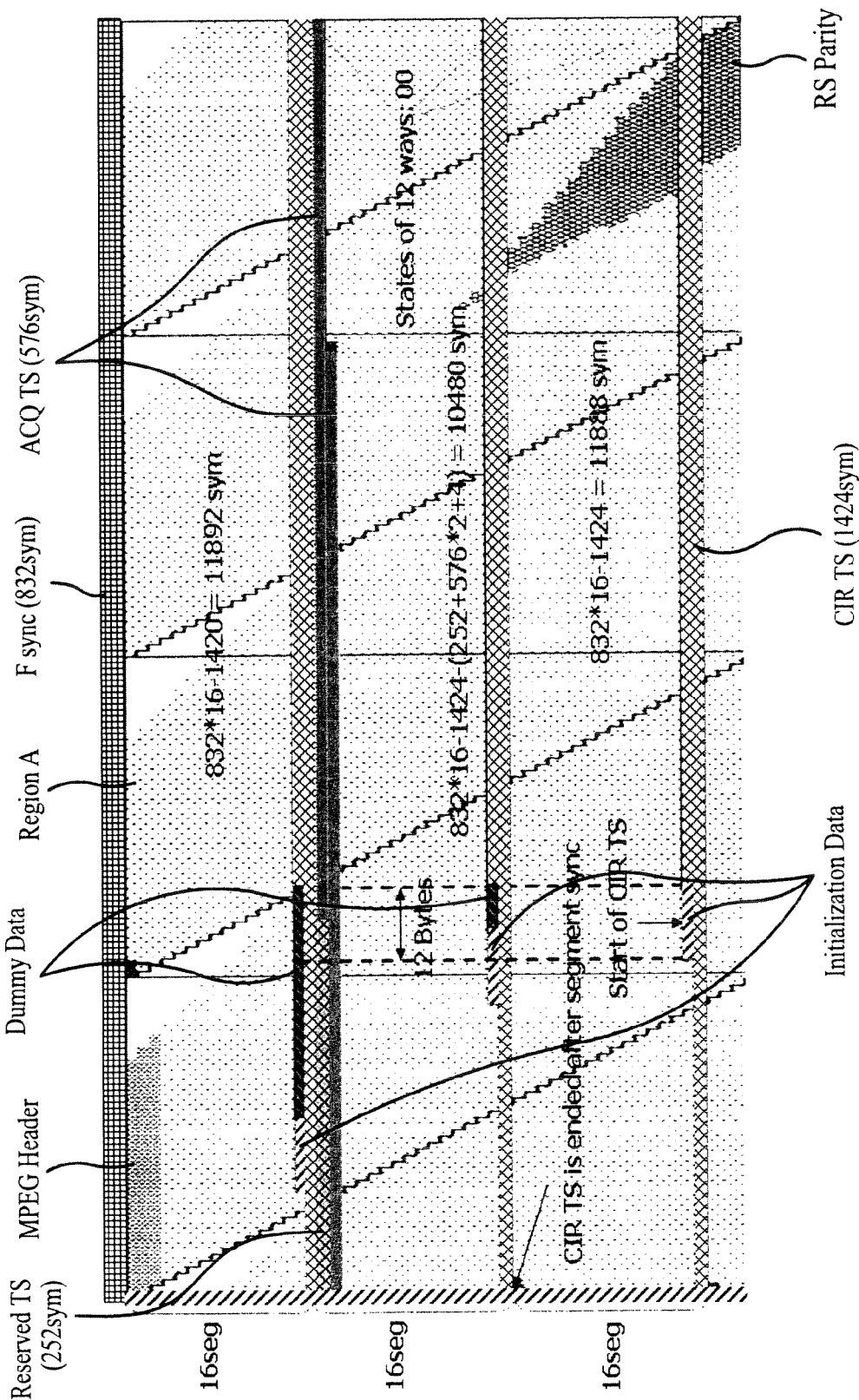
FIG. 24 illustrates a part of data region A of the signal frame shown in FIG. 6A.

FIG. 24 illustrates a part of data region A of the signal frame shown in FIG. 6A. Various data symbol regions are shown FIG. 24. The top segment is a field sync segment having a length of 832 symbols. The known data are included in first, second, and third known data areas as shown in FIG. 24. The first known data area is located 16 segments below the field sync signal (top segment in FIG. 24). The second known data area is located 16 segments below the first known data area, and the third known data area is located 16 segments below the second known data area.

Each of the first, second, and third known data areas includes an initialization data region including data (4 symbols) required to initialize trellis decoding. Furthermore, each of the first and second known data regions further includes a dummy data region next to the initialization data region, and a known data region next to the dummy data region. The known data region includes known data symbols which may be used to compensate channel distortion of a channel equalizer or to transmit an error correction coding mode. In addition, they can be used for initial carrier recovery. The dummy data region includes dummy known data symbols which can be combined with the known data symbols in the known data region to form a total of 1424 known data symbols required for trellis decoding.

The known data region (1424 symbols) included in the first known data area may include a training sequence which can be used to obtain a channel impulse response (CIR) required for channel equalization. The first known data region further includes a reserved data region (252 symbols) which may be used to transmit an error correction code mode. For example, the reserved data region may include information identifying a Serial Concatenated Convolution Code (SCCC) mode which is an example of the error correction code mode. If such identification information is included, the broadcast receiving system may use the identified SCCC mode during SCCC decoding. The first known data region further includes two 576-symbol ACQ data regions including data required to acquire initial carrier frequency synchronization.

Referring back to FIG. 24, the second known data area located 32 segments below the field sync segment includes an initialization data region including data required to initialize trellis decoding, a dummy data region, and a known data region including known data to be used for channel equalization. Similarly, the third known data area includes an initialization data region including data required to initialize trellis decoding, and a known data region including known data to be used for channel equalization. A part of the initialization data region may be used to estimate a channel impulse response (CIR) as shown in FIG. 24 in which a start of CIR TS is located in the initialization data region.

The data region between the field sync segment and the first known data region includes 11892 valid data symbols, the data region between the first and second known data regions includes 10480 valid data symbols, and the data region between the second and third known data regions includes 11888 valid data symbols. The size of each data region shown in FIG. 24 can be altered. The known data can be used for channel equalization, or they can be used for transmit various signaling information. The field sync segment can also include signaling information.

Figure 25:
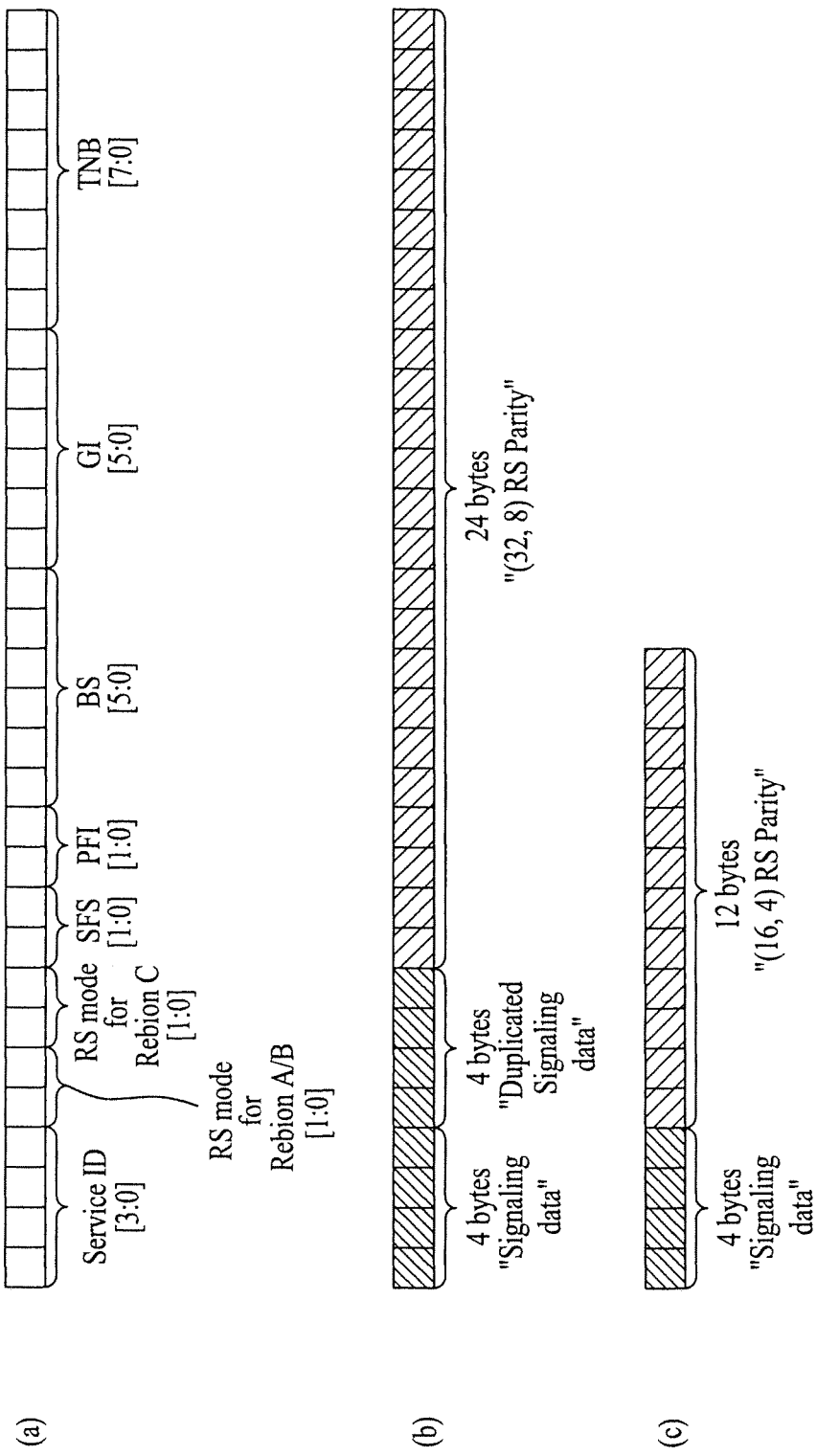
FIG. 25 illustrates a data structure (arrangement) of transmission (Tx) parameters included in a mobile service data region as signaling data.

FIGS. 25(a) to 25(c) illustrate a data structure (arrangement) of transmission (Tx) parameters included in a mobile service data region as signaling data. FIG. 25(a) illustrates signaling data having a length of 4 bytes. The signaling data include various information specifying a service identifier (ID), an RS mode for regions A and B shown in FIG. 6A, an RS mode for region C shown in FIG. 6A, a super frame size (SFS), a permuted frame index (PFI) indicating a location of an RS frame in a super frame, a burst size, a group index (GI) indicating an index of a data group, and a time to a next burst (TNB). The sizes of such information are shown in FIG. 25(a). FIGS. 25(b) and 25(c) illustrate arrangements of the signaling data in the signal frame shown in FIG. 6A. If an error correction mode for region A in the signal frame is a ½ rate SCCC mode (hereinafter, error correction mode 1), region A may include a first data region having 4-byte signaling data, a second data region having 4-byte duplicated signaling data, and a third data region having 32-byte RS parity data, as shown in FIG. 25(b). Alternatively, if the error correction mode for region A is a ¼ rate SCCC mode (hereinafter, error correction mode 2), region A may include a first data region having 4-byte signaling data and a second data region having 16-byte RS parity data.

In the broadcast system, prior to performing a decoding process according to the SCCC mode, the broadcast receiving system obtains the known data shown in FIG. 24 or the signaling information pre-determined in the field synchronization section, thereby performing the SCCC decoding process. In addition, the broadcast receiving system may also obtain information related to the burst from the signaling information shown in FIG. 25 so as to receive only the signals included in the burst. Hereinafter, an example of allowing the broadcast receiving system to reduce power consumption by obtaining the burst information from the signaling information shown in FIG. 24 and FIG. 25, so as to receive only the mobile service data included in the burst.

FIG. 26 illustrates an example of acquiring mobile service data included in a particular data group within a burst according to the present invention. For simplicity, it will be assumed that the mobile service data of FIG. 26 include a program associated with a particular service. Depending upon the data group, mobile service data and main service data may be multiplexed in a single burst (as shown in FIG. 8). When the mobile service data group is included and transmitted in a group being included in a burst, the broadcast receiving system turns the power on only during the burst that is included in a burst so as to receive a broadcast signal (i.e., on-time). Also, the broadcast receiving system may decode and output the mobile service data included in the data group within the burst that is being received. Furthermore, the broadcast receiving system may obtain a time to a next burst (TNB) from the signaling information. Then, by turning the power off until the next burst is received, the broadcast receiving system does not receive any broadcast signal (i.e., off-time). The broadcast receiving system turns the power back on during the next burst (burst 2), thereby receiving the mobile service data included in the newly received burst (i.e., on-time).

FIG. 27 illustrates an example of mobile service data associated to a plurality of services within one burst being multiplexed. Referring to FIG. 27, the mobile service data providing a first service will be indicated as mo1, and the mobile service data providing a second service will be indicated as mo2. In this example, a burst represents a signal section (or block) wherein the mobile service data are multiplexed. More specifically, the signal block including the mobile service data associated to the first service may become a first burst section, and the signal block including the mobile service data associated to the second service may become a second burst section. When the broadcast receiving system wishes to receive the program associated to the first service, a data block including data groups G1 and G3 in which the data corresponding to the first service is determined as the burst section. Thus, the power is turned on during the burst section. The broadcast receiving system obtains the next burst in which the data group corresponding to the first service from the signaling information indicated as $TNB_{G1}$ and $TNB_{G2}$. Therefore, the power is turned off until the next burst. Then, the power is turned back on at the point the next burst is being received.

Alternatively, when the broadcast receiving system wishes to receive the program associated to the second service, the power may be turned on and off only during the burst section corresponding to a signal section including the data on the second service. More specifically, the power is turned on during the burst section having the data group corresponding to the second service included therein. Then, the broadcast receiving system obtains the next burst in which the data group corresponding to the second service from the signaling information indicated as $TNB_{G2}$ and $TNB_{G4}$. Therefore, the power is turned off until the next burst. Then, the power is turned back on at the point the next burst is being received.

Figure 28:
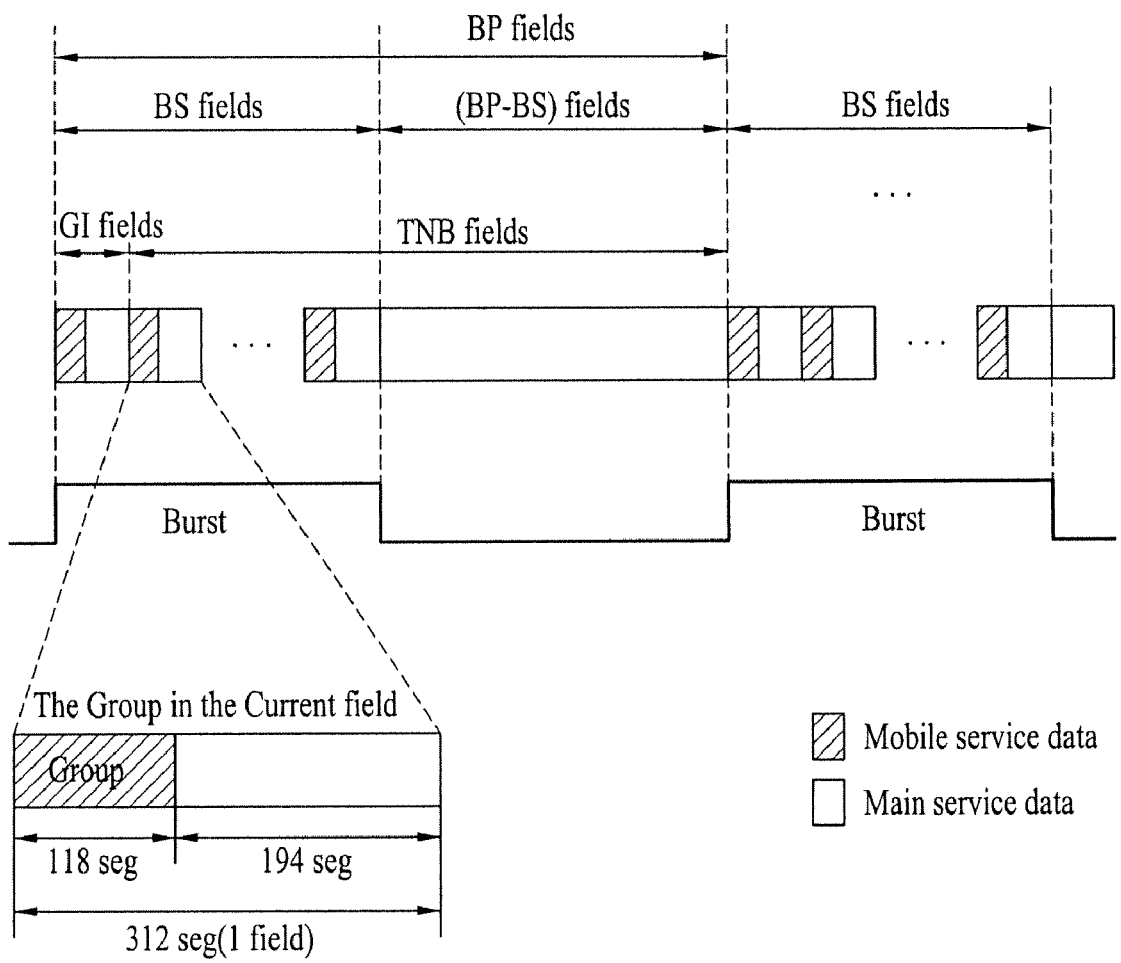
FIG. 28 illustrates a general example of managing a burst using the information shown in FIG. 26 and FIG. 27.

FIG. 28 illustrates a general example of managing a burst using the information shown in FIG. 26 and FIG. 27. Referring to FIG. 28, a burst section is indicated as BP, a burst section is indicated as BS, and a data group index within the burst is indicated as GI. Furthermore, the section from each data group to the next burst section, i.e., the time to the next burst is indicated as TNB. Herein, a burst includes a plurality of data groups including the mobile service data. In order to reduce any possible confusion, as shown in the example of FIG. 8, it will be assumed that in FIG. 28, a data group includes 312 segments (1 field), wherein 118 segments correspond to the mobile service data, and wherein 194 segments correspond to the main service data. Herein, one burst section (BS) includes 18 data fields. The data section in which the data group corresponding to the mobile service data is not included may be indicated as a (BP-BS) field. The TNB may include the number of fields starting from a data group (GI) including the current mobile service data within a burst section to the starting point of a next burst. Finally, the TNB value may be updated by the signaling information based upon the current data group (GI).

Figure 29:
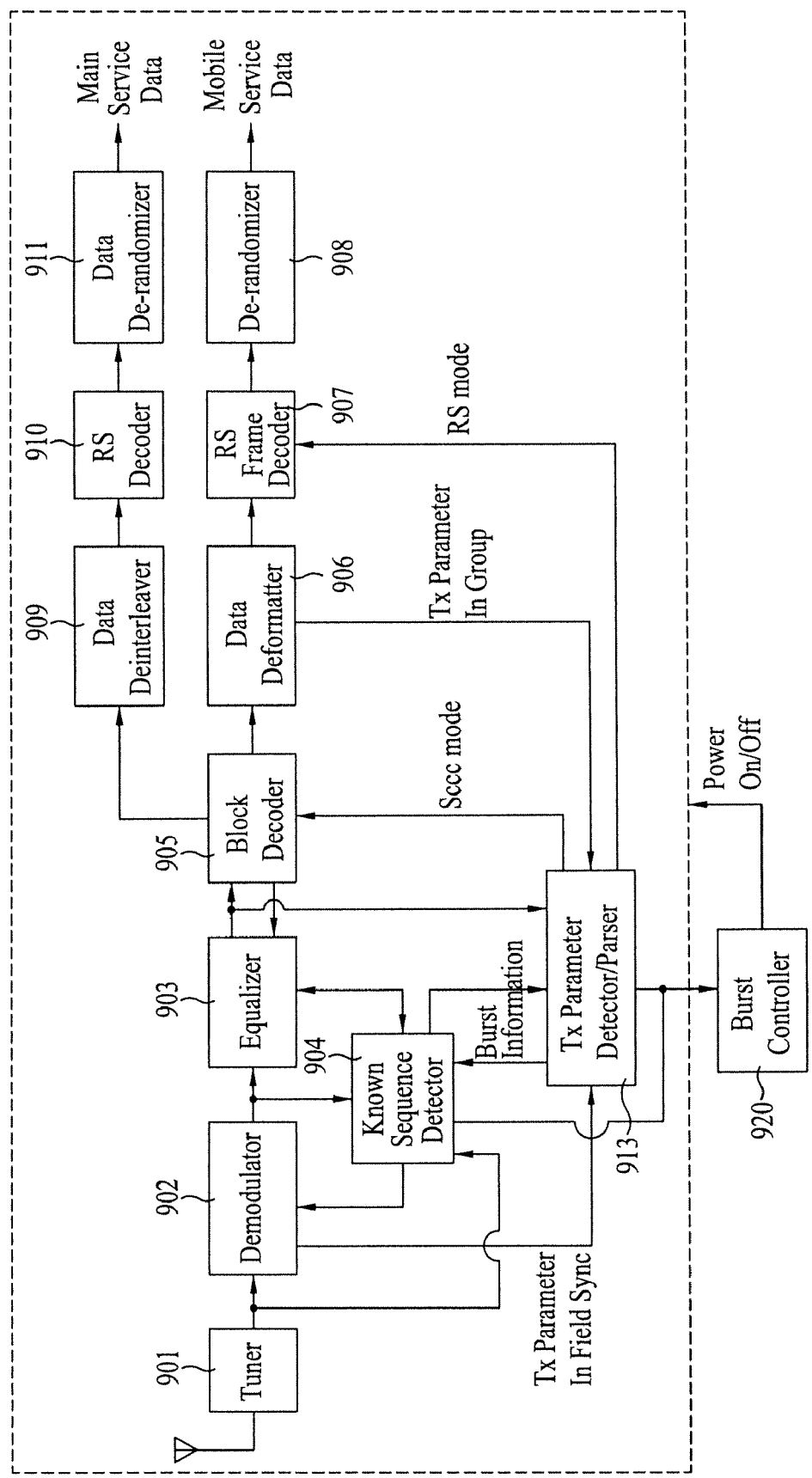
FIG. 29 illustrates another example of a digital broadcast receiving system according to the present invention.

FIG. 29 illustrates another example of a digital broadcast receiving system according to the present invention. As above-described, the signaling information may be included in at least one of field synchronization region, known data region, and mobile service data region. The signaling information may transmit the variety of transmission parameter therein.

Referring to FIG. 29, the digital broadcast receiving system includes a tuner 901, a demodulator 902, an equalizer 903, a known sequence detector 904, a block decoder 905, a data deformatter 906, a RS frame decoder 907, a derandomizer 908, a data deinterleaver 909, a RS decoder 910, a data derandomizer 911, and a transmission parameter detector/parser 913.

More specifically, the tuner 901 tunes a frequency of a particular channel and down-converts the tuned frequency to an intermediate frequency (IF) signal. Then, the tuner 901 outputs the down-converted IF signal to the demodulator 902 and the known sequence detector 904.

The demodulator 902 performs self gain control, carrier recovery, and timing recovery processes on the inputted IF signal, thereby modifying the IF signal to a baseband signal. Then, the demodulator 902 outputs the newly created baseband signal to the equalizer 903 and the known sequence detector 904. The demodulator 902 further outputs field sync data or known data including transmission parameters to a transmission parameter detector/parser 913.

The equalizer 903 performs channel equalization on the demodulated signal and outputs the equalized signal to the known sequence detector 904, the block decoder, and the transmission parameter detector/parser 913. The known sequence detector 904 detects the transmission parameter information included in the known sequence section, thereby outputting the detected information to the transmission parameter detector/parser 913.

The data deformatter 906 outputs the transmission parameter set as the mobile service data among the valid data, shown in FIG. 6A, from the block decoder 905 to the transmission parameter detector/parser 913. The data deformatter 906 removes the known data, trellis initialization data, and MPEG header that were inserted in the main service data and data group. The data deformatter 906 also removes the RS parity that was added by the RS encoder/non-systematic RS encoder or the non-systematic RS encoder of the transmitting system. Thereafter, the processed data are outputted to the RS frame decoder 907.

The transmission parameter detector/parser 913 detects transmission parameters from the signal(s) outputted from the demodulator 902, the equalizer 903, the known sequence detector 904, and/or the data deformatter 906. For example, the transmission parameter detector/parser 913 obtains the location information of the known data and detects a SCCC mode and an error correction decoding information from the signal outputted from the demodulator 902 or the equalizer 903, or the known sequence detector 904, and provides the detected SCCC mode to the block decoder 905. The block decoder 905 performs error correction decoding on the signal using the SCCC mode provided from the transmission parameter detector/parser 913. Furthermore, the known sequence detector 904 obtains burst information (e.g., burst size, time to next burst (TNB), etc.) from the transmission parameter received from the transmission parameter detector/parser 913. Thereafter, the known sequence detector 904 may then provide burst time information of the received signal to a burst controller 920.

The burst controller 920 receives the burst time information, thereby being able to turn the power on/off only during burst sections including desired services, as shown in FIG. 26 and FIG. 27. The example of the digital broadcast receiving system shown in FIG. 29 discloses a receiving system that can receive both main service data and mobile service data. Herein, the burst controller 920 may control the power supply (i.e., on/off state) of all functional blocks included in the portion of the system marked by a dotted line. Accordingly, even when the broadcast receiving system is used for receiving broadcast signals while the user is in a mobile state (i.e., traveling), the amount of power consumption of the receiving system may be reduced. Hereinafter, a method for detecting burst information corresponding to the broadcast signal received from the known sequence detector 904 and for managing power on/off state with respect to the corresponding burst section by using the burst controller 920 will now be described in detail.

Figure 30:
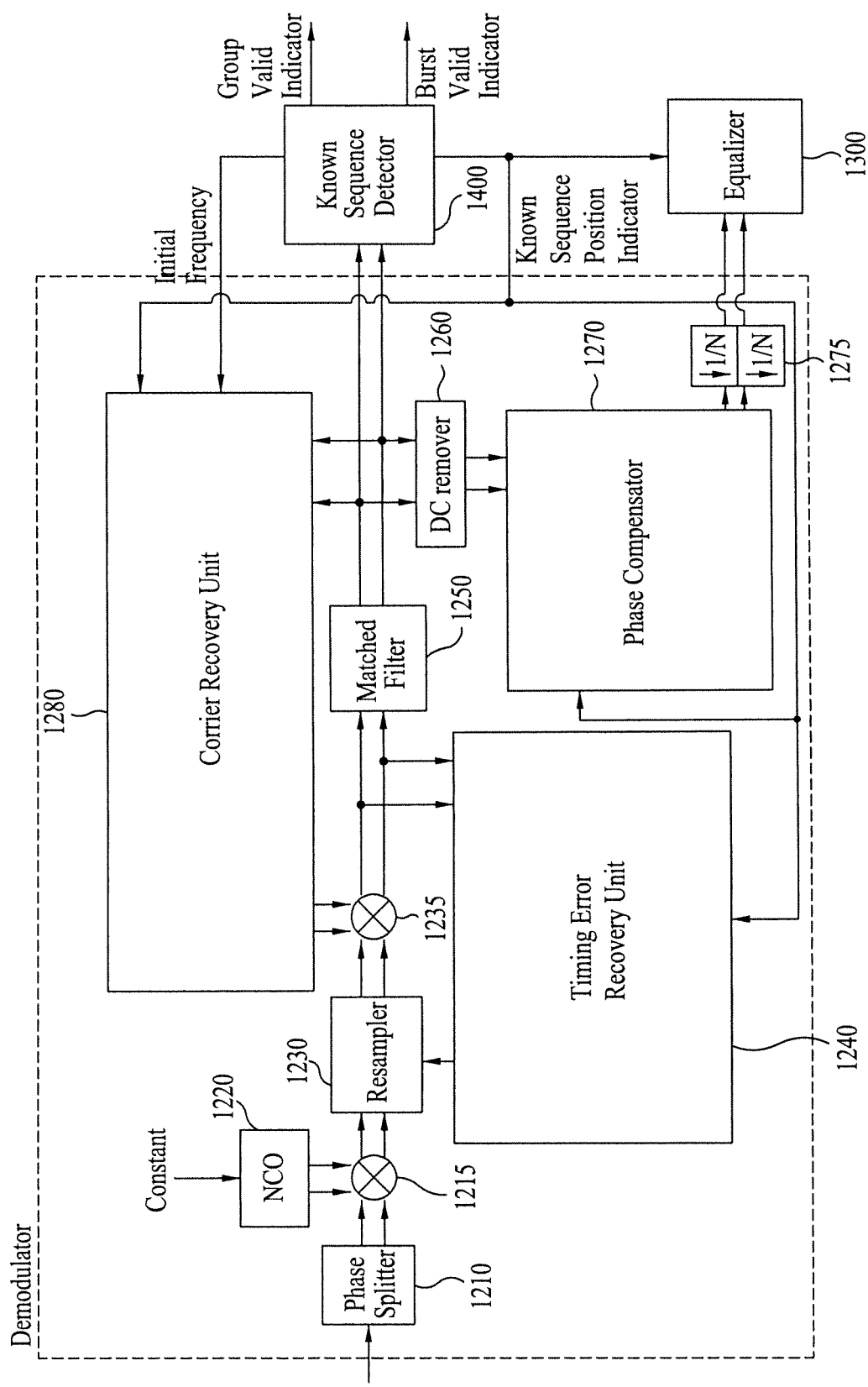
FIG. 30 illustrates a detailed diagram of the demodulator, equalizer, and known sequence detector shown in FIG. 29.

FIG. 30 illustrates a detailed diagram of the demodulator, equalizer, and known sequence detector shown in FIG. 29. Referring to FIG. 30, the operation of the demodulator 1200, the equalizer 1300, and the known sequence detector 1400 will now be described in detail. Referring to FIG. 30, the demodulator 1200 includes a phase splitter 1210, a numerically controlled oscillator (NCO) 1220, a first multiplier 1215, a resampler 1230, a second multiplier 1235, a timing recovery unit 1240, a matched filter 1250, a DC remover 1260, a phase compensator 1270, a carrier recovery unit 1280, and a decimator 1275. Also referring to FIG. 30, the phase splitter 1210 receives a pass band digital signal from the analog/digital converter (ADC) (not shown) and splits the received signal into a pass band digital signal of a real number element and a pass band digital signal of an imaginary number element both having a phase of 90 degrees between one another. In other words, the pass band digital signal is split into complex signals. The split portions of the pass band digital signal are then outputted to the first multiplier 1215. Herein, the real number signal outputted from the phase splitter 1210 will be referred to as an 'I' signal, and the imaginary number signal outputted from the phase splitter 1210 will be referred to as a 'Q' signal, for simplicity of the description of the present invention.

The first multiplier 1215 multiplies the I and Q pass band digital signals, which are outputted from the phase splitter 1210, to a complex signal having a frequency proportional to a constant being outputted from the NCO 1220, thereby changing the I and Q pass band digital signals to baseband digital complex signals. Then, the baseband digital signals of the first multiplier 1215 are inputted to the resampler 1230. The resampler 1230 resamples the signals being outputted from the first multiplier 1215 so that the signal corresponds to the timing clock provided by the timing recovery unit 1240. Thereafter, the resampler 1230 outputs the resampled signals to the second multiplier 1235.

For example, when the ADC uses a 25 MHz fixed oscillator, the baseband digital signal having a frequency of 25 MHz, which is created by passing through the ADC, the phase splitter 1210, and the first multiplier 1215, is processed with an interpolation process by the resampler 1230. Thus, the interpolated signal is recovered to a baseband digital signal having a frequency twice that of the receiving signal of a symbol clock (i.e., a frequency of 21.524476 MHz). Alternatively, if the analog/digital converter uses the output frequency of the timing recovery unit 1240 as the sampling frequency (i.e., if the ADC uses a variable frequency) in order to perform an A/D conversion process, the resampler 1230 is not required and may be omitted from the demodulator 1200.

The second multiplier 1235 multiplies an output frequency of the carrier recovery unit 1280 with the output of the resampler 1230 so as to compensate any remaining carrier included in the output signal of the resampler 1230. Thereafter, the compensated carrier is outputted to the matched filter 1250 and the timing recovery unit 1240. The signal matched-filtered by the matched filter 1250 is inputted to the DC remover 1260, the known sequence detector 1400, and the carrier recovery unit 1280. The known sequence detector 1400 detects the place (or position) of the known data sequences that are being periodically or non-periodically transmitted. Simultaneously, the known sequence detector 1400 estimates an initial frequency offset during the known data detection process. Accordingly, a frame synchronization signal may be obtained.

More specifically, while the VSB data frame is being received, the known sequence detector 1400 detects the position (or place) of the known data included in the VSB data frame. Then, the known sequence detector 1400 outputs the detected information on the known data place (i.e., a known sequence position indicator) to the timing recovery unit 1240, the carrier recovery unit 1280, and the phase compensator 1270 of the demodulator 1200. Furthermore, the known sequence detector 1400 estimates the initial frequency offset, which is then outputted to the carrier recovery unit 1280. The timing recovery unit 1240 receives and uses the output signal of resampler 1230 or the output signal of the resampler 1230 that is recovered by the carrier recovery unit 1280. The known sequence detector 1400 obtains the frame synchronization signal and transmits the group valid indicator and burst valid indicator, each corresponding to the data group, to the burst controller. The burst controller then uses the received group valid indicator and burst valid indicator to control the corresponding burst.

Figure 31:
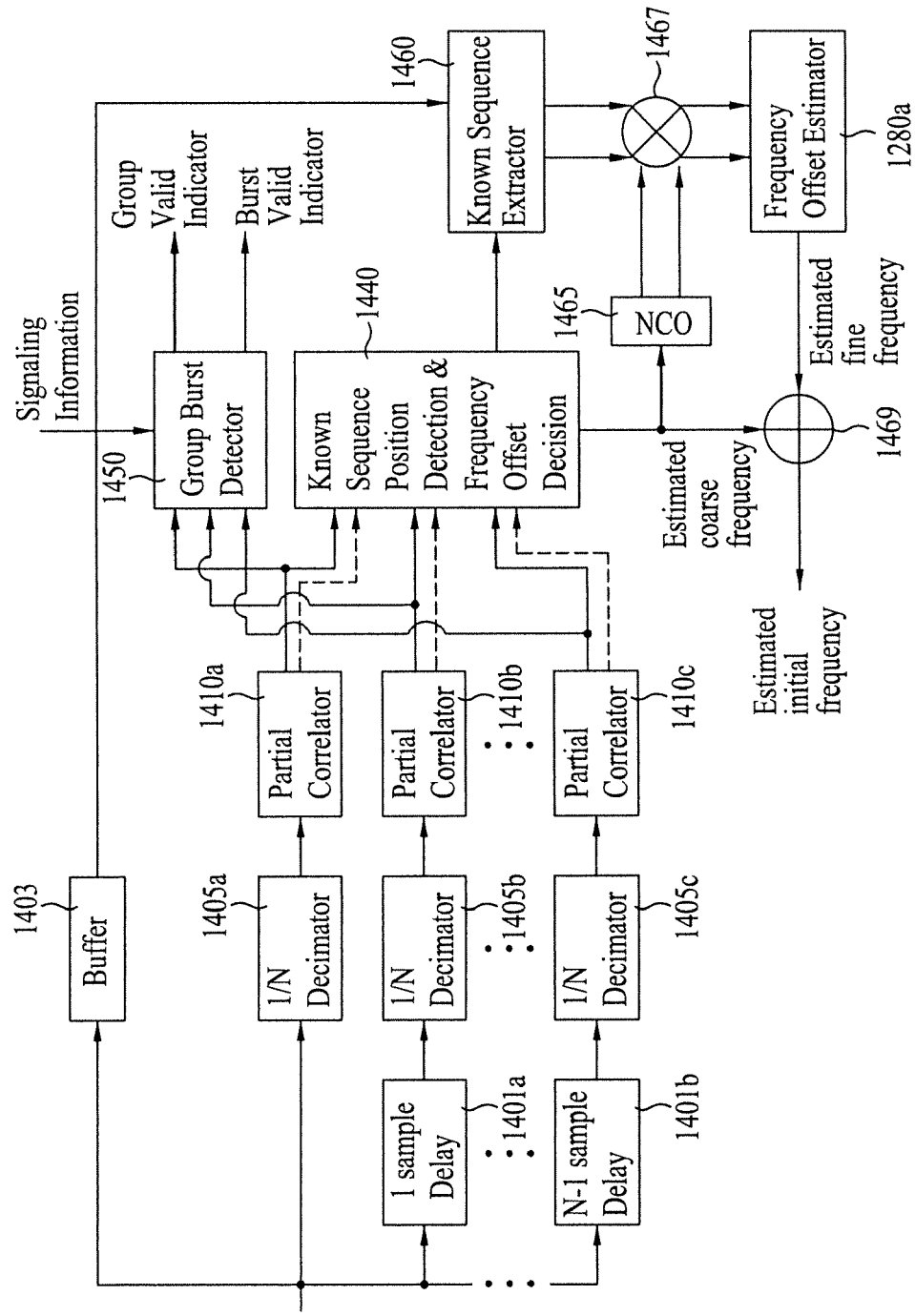
FIG. 31 illustrates an example of the known sequence detector shown in FIG. 30.

FIG. 31 illustrates an example of the known sequence detector shown in FIG. 30. The known sequence detector may extract burst information (i.e., data group valid indicator, burst valid indicator, etc.). Herein, FIG. 31 shows an example of an inputted signal being oversampled to N times of its initial state. In other words, N represents the sampling rate of a received signal. Referring to FIG. 31, the known sequence detector includes a plurality of delays $1401a, \ldots, 1401b$ delaying the input data, and a plurality of decimators $1405a, 1405b, \ldots, 1405c$ decimating the delayed data at a rate of 1/N times.

Particularly, the known sequence detector 1400 includes N number of partial correlators 1410*a*, 1410*b*, ..., 1410*c* configured in parallel, a known sequence position detector and frequency offset decider 1440, a group burst detector 1450, and a known sequence extractor 1460.

Herein, the first partial correlator consists of a 1/N decimator 1405*a*, and a partial correlator 1410*a*. The second partial correlator consists of a 1 sample delay 1401*a*, a 1/N decimator 1405*b*, and a partial correlator 1410*b*. And, the $N^{th}$ partial correlator consists of a N−1 sample delay 1401*b*, a 1/N decimator 1405*c*, and a partial correlator 1410*c*.

Each partial correlator matches (or identifies) the phase of each of the samples within the oversampled symbol with the phase of the original (or initial) symbol, and decimates the samples of the remaining phases, thereby performing partial correlation on each sample. More specifically, the input signal of the partial correlator is decimated at a rate of 1/N for each sampling phase, so as to pass through each partial correlator. For example, when the input signal is oversampled to 2 times (i.e., when N=2), this indicates that two samples are included in one signal. In this case, two partial correlators are required, and each 1/N decimator becomes a ½ decimator. At this point, the 1/N decimator 1405*a* of the first partial correlator decimates (or removes), among the input samples, the samples located in-between symbol places (or positions). Then, the corresponding 1/N decimator outputs the decimated sample to the partial correlator 1410*a*.

Furthermore, the 1 sample delay 1401*a* of the second partial correlator delays the input sample by 1 sample (i.e., performs a 1 sample delay on the input sample) and outputs the delayed input sample to the 1/N decimator 1405*b*. Subsequently, among the samples inputted from the 1 sample delay 1401*a*, the 1/N decimator 1405*b* of the second partial correlator decimates (or removes) the samples located in-between symbol places (or positions). Thereafter, the corresponding 1/N decimator 1405*b* outputs the decimated sample to the partial correlator 1410*b*.

After each predetermined period of the VSB symbol, each of the partial correlators outputs a correlation value and an estimation value of the coarse frequency offset estimated at that particular moment to the known sequence position detector and frequency offset decider 1440.

The known sequence position detector and frequency offset decider 1440 stores the output of the partial correlators corresponding to each sampling phase during a data group cycle or a pre-decided cycle. Thereafter, the known sequence position detector and frequency offset decider 1440 decides a position (or place) corresponding to the highest correlation value, among the stored values, as the place (or position) for receiving the known data. Simultaneously, the known sequence position detector and frequency offset decider 1440 finally decides the estimation value of the frequency offset estimated at the moment corresponding to the highest correlation value as the coarse frequency offset value of the receiving system. Then, the known sequence position indicator is inputted to the known sequence extractor 1460, the timing recovery unit, the carrier recovery unit, the phase compensator, and the equalizer, and the coarse frequency offset is inputted to the adder 1469 and the NCO 1465. In the meantime, while the N number of partial correlators detects the known data place (or known sequence position) and estimate the coarse frequency offset, the buffer 1403 temporarily stores the received data and outputs the temporarily stored data to the known sequence extractor 1460.

The known sequence extractor 1460 uses the known sequence position indicator, which is outputted from the known sequence position detector and frequency offset decider 1440, so as to extract the known data from the output of the buffer 1403. Thereafter, the known sequence extractor 1460 outputs the extracted data to the multiplier 1467. The NCO 1465 generates a complex signal corresponding to the coarse frequency offset being outputted from the known sequence position detector and frequency offset decider 1440. Then, the NCO 1465 outputs the generated complex signal to the multiplier 1467.

The multiplier 1467 multiplies the complex signal of the NCO 1465 to the known data being outputted from the known sequence extractor 1460, thereby outputting the known data having the coarse frequency offset compensated to the frequency offset estimator 1280*a*. The frequency offset estimator 1280*a* estimates a fine frequency offset from the known data having the coarse frequency offset compensated. Subsequently, the frequency offset estimator 1280*a* outputs the estimated fine frequency offset to the adder 1469. The adder 1469 adds the coarse frequency offset to the fine frequency offset. Thereafter, the adder 1469 decides the added result as a final initial frequency offset, which is then outputted to the carrier recovery unit 1280 included in the demodulator 1200.

It is assumed that the known data is inserted within the mobile service data group and then transmitted, as shown in FIG. 6A. Then, the known sequence position detector and frequency offset decider 1440 may use the known data that have been additionally inserted between region A1 and region A2, so as to estimate the initial frequency offset. The known position information, which was periodically inserted within region A estimated by the known sequence position detector and frequency offset decider 1440, is inputted to the timing error recovery unit 1240, the carrier recovery unit 1280, the phase compensator 1270, and the equalizer 903.

Meanwhile, the group burst detector 1450 receives partially correlated values from each of the partial correlators. The group burst detector 1450 may also receive information on the burst cycle and burst length, which correspond to the signaling information, from the transmission parameter detector/parser 913. The group burst detector 1450 may be operated in accordance with a counter based upon an arbitrary (or random) input signal unit. For example, the group burst indicator 1450 may be operated at a cycle period of 260416 symbols of 1 VSB field.

If the partial correlation value being inputted from the corresponding partial correlator indicates a peak value exceeding the reference value during the cycle period of the counter, the group burst indicator 1450 may be able to locate the position of the mobile service data group. In other words, when a peak value of a correlation value corresponding to a data group is generated (or occurs), it may be assumed that a mobile service data group is being received.

A peak correlation value occurs when data having a predetermined pattern are being received. Particularly, in this case, the known data are located in a particular position within the mobile service data group. Therefore, a peak value of the partial correlation value is yielded (or generated) when the known data are being received. The group burst indicator 1450 may be able to determine a starting position and a final position of the mobile service data group based upon the peak value of the corresponding partial correlation value. Alternatively, if a peak value exceeding the reference value during the cycle period of the counter does not occur, the system may determine that the mobile service data are not included in the data configuring the corresponding section. More specifically, if the group burst indicator 1450 receives a peak value exceeding the reference value during the cycle period of the counter, the group burst indicator 1450 may be capable of outputting group valid indicator information corresponding to the peak value position at the reception point of the peak value.

The group burst indicator 1450 may receive signaling information on a burst cycle and burst length from the transmission parameter detector/parser 913. For example, the group burst indicator 1450 may receive information indicating that a burst cycle corresponds to 30 fields, and that a burst length corresponds to 18 fields. By using such information, the group burst indicator 1450 may be able to determine that a new burst section begins after 12 fields from the ending point of the previous burst section, and that the new burst section ends after 18 fields from its beginning (or starting) point. Therefore, the group burst indicator 1450 may output such information by generating and outputting a burst valid indicator based upon the starting point and ending point of the corresponding burst section. The burst controller then receives the burst control information, such as the group valid indicator and the burst valid indicator, and uses such information to reduce excessive power consumption of the digital broadcast receiving system.

Figure 32:
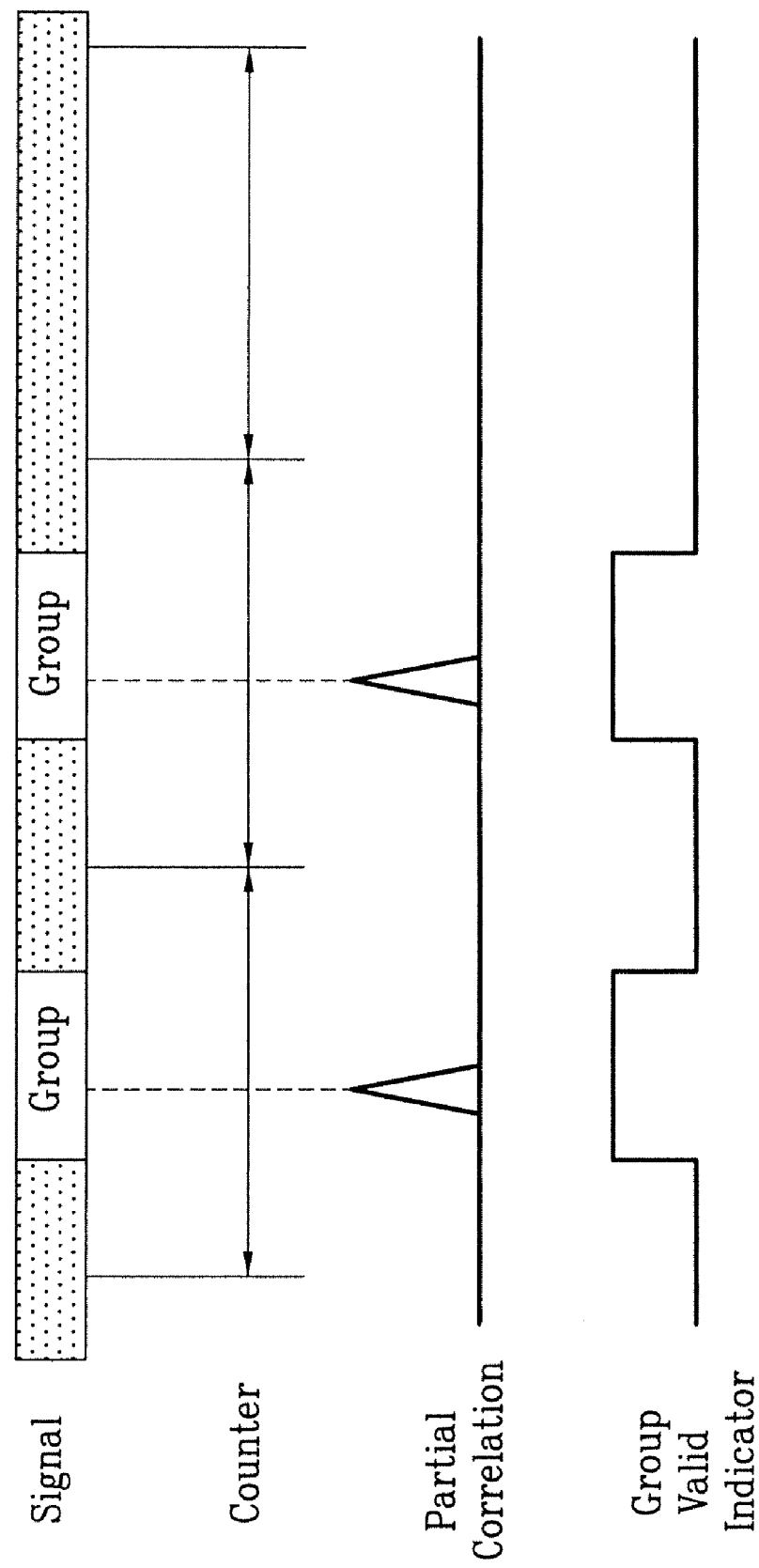
FIG. 32 illustrates an example of a burst information detector outputting a group indicator.

FIG. 32 illustrates an example of the group burst indicator outputting the group valid indicator. Referring to FIG. 32, when a partial correlation value of a broadcast signal is checked according to a cycle period of a counter, a peak value of the partial correlation value corresponding to a data group position (marked as a group) of the broadcast signal, wherein the data group includes known data, may be indicated. The group burst indicator may output a group valid indicator corresponding to the position where the partial correlation value occurs.

Figure 33:
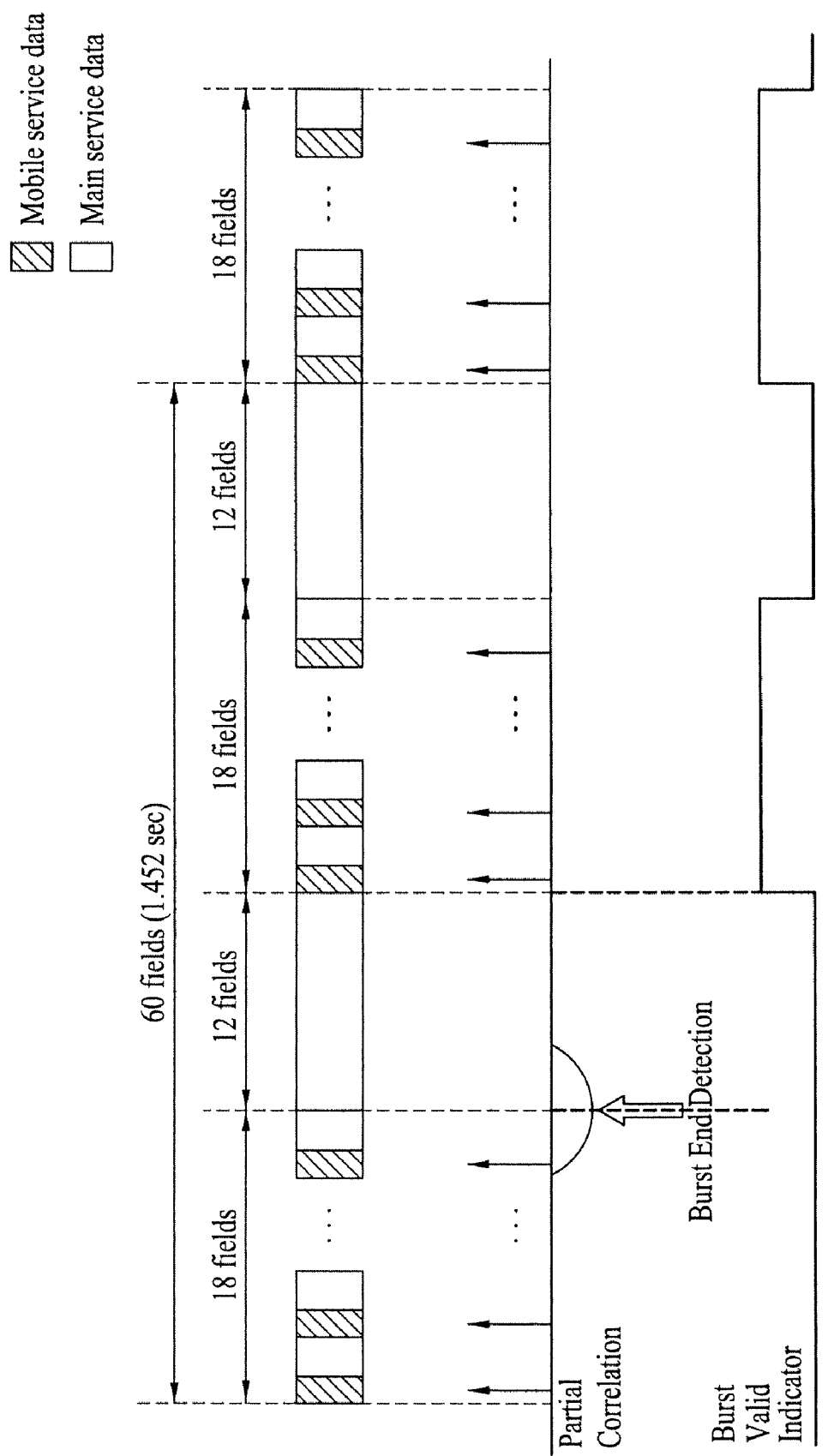
FIG. 33 illustrates an example of a burst information detector outputting a burst indicator.

FIG. 33 illustrates an example of the group burst indicator outputting the burst valid indicator. Herein, the group burst indicator may obtain burst information from the signaling information, wherein the burst information may include burst cycle information (i.e., one burst cycle corresponds to 30 fields in the example shown in FIG. 33) and burst length (i.e., one burst corresponds to 18 fields in the example shown in FIG. 33). In a data group corresponding to a data section including mobile service data, partial correlation values may periodically occur as shown in the example of FIG. 32.

The burst controller receives the group valid indicator and burst valid indicator and may use the received information to control power on/off states of the receiving system, so as to allow the system to process only the signal of the mobile service data section including the user-desired broadcast program. If the broadcast receiving system wishes (or desires) to receive only the mobile service data, the system considers only the mobile service data group included in the corresponding burst as the valid data. Accordingly, the receiving system does not receive data other than the mobile service data group of the corresponding burst. When data corresponding to the mobile service data group are being processed, even though the corresponding data are included in the burst section, the burst controller may use the group valid indicator, which is generated while the data that are being processed, so as to turn the power on or off.

Figure 34:
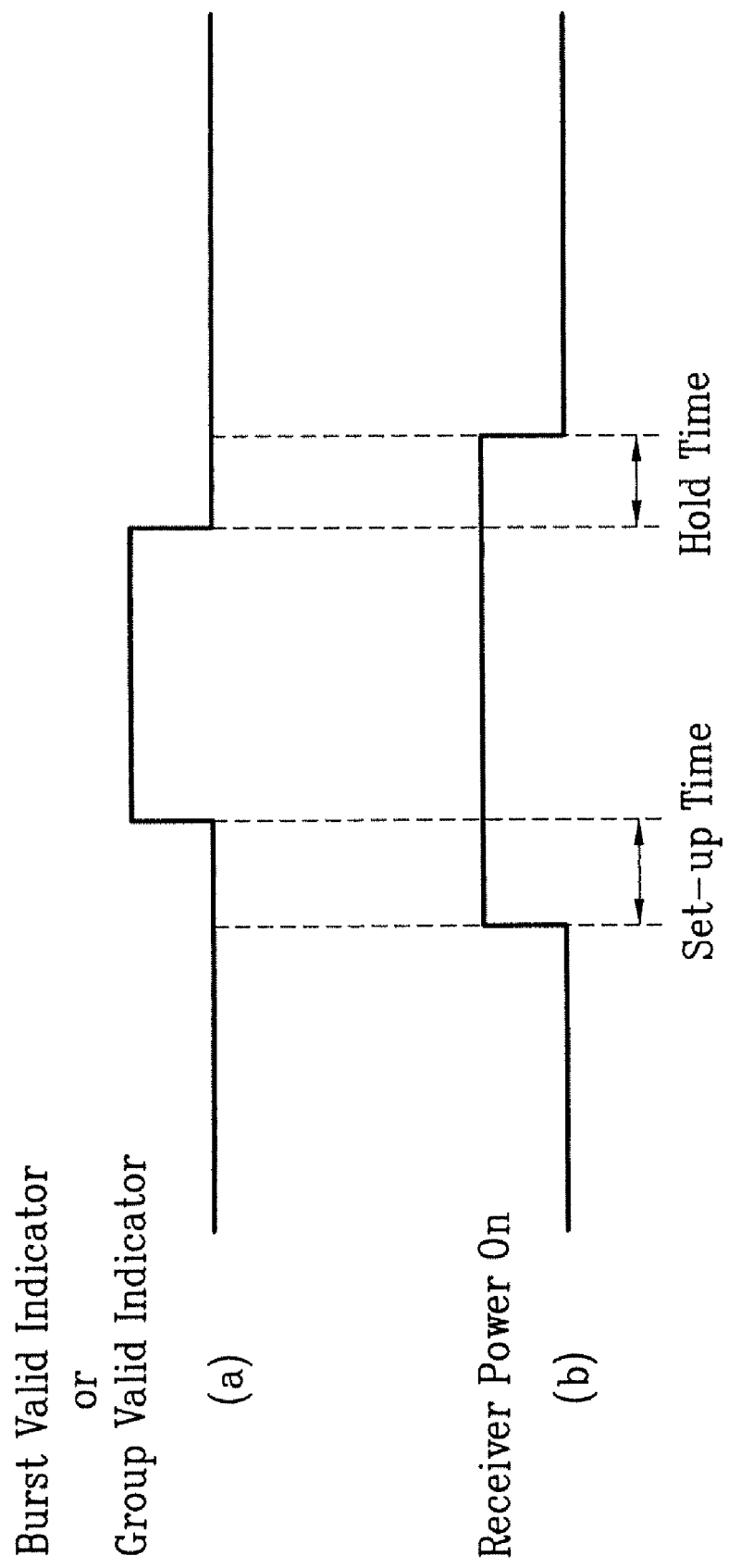
FIG. 34 illustrates an example of comparing actual on/off times and burst sections.

FIG. 34 illustrates an example of comparing actual on/off time and the burst section. Referring to FIG. 34, (a) represents a data receiving section based upon the burst valid indicator and the group valid indicator. The broadcast receiving system may turn the power on starting from an arbitrary (or random) time prior to a burst starting point or a data group starting point (i.e., set-up time). Alternatively, the broadcast receiving system may turn the power off starting from an arbitrary (or random) time after a burst ending point or a data group ending point (i.e., hold time). Herein, the set-up time or the hold time may be adjusted arbitrarily depending upon specific circumstances.

The digital broadcast system and method of processing data described above have the following advantages. First, they are robust to unexpected channel change or noise. Next, the performance of the broadcast receiving system is enhanced by additionally encoding the mobile service data for error correction, and by inserting known data into the mobile service data region. In addition, the transmission parameters such as bust information are inserted in the known data such that the power consumption of the broadcast receiving system is greatly reduced using the burst information.

More specifically, the present invention is highly protected against (or resistant to) any error that may occur when transmitting mobile service data through a channel. And, the present invention is also highly compatible to the conventional receiving system. Moreover, the present invention may also receive the mobile service data without any error even in channels having severe ghost effect and noise.

Additionally, by inserting known data in a particular position (or place) within a data region and transmitting the processed data, the receiving performance of the receiving system may be enhanced even in a channel environment that is liable to frequent changes. Also, by multiplexing mobile service data with main service data into a burst structure, the power consumption of the receiving system may be reduced. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A receiving system, comprising:
   a signal receiving unit for receiving a broadcast signal including a data group, the data group comprising mobile service data, transmission parameters related to the mobile service data, and a plurality of known data sequences;
   a known data detector for detecting the plurality of known data sequences from the data group, wherein at least two of the plurality of known data sequences have different lengths, wherein initialization data are positioned at a beginning portion of at least one known data sequence, and wherein the initialization data being used to initialize memories within a trellis encoder of a transmitting system are trellis-encoded;
   a transmission parameter decoder for decoding the received transmission parameters inserted between the plurality of known data sequences;
   an equalizer for compensating for channel distortion of the broadcast signal using at least one of the plurality of detected known data sequences;
   a first decoder for first decoding mobile service data in the channel distortion-compensated broadcast signal by block units based upon the decoded transmission parameters;
   a second decoder for building a Reed-Solomon (RS) frame by collecting the first-decoded mobile service data and correcting at least one error in the RS frame based upon the decoded transmission parameters, wherein the RS frame comprises an RS frame payload including the first-decoded mobile service data, RS parity data added at bottom ends of columns of the RS frame payload, and Cyclic Redundancy Check (CRC) data added at right ends of rows of the RS frame payload including the RS parity data; and a controller for controlling power supply of the receiving system to receive the data group including the mobile service data based on the decoded transmission parameters.

2. The receiving system of claim 1, wherein the controller controls the power supply of the receiving system by using identification information for identifying the data group.

3. The receiving system of claim 2, wherein the known data detector extracts the identification information to identify the data group from the broadcast signal by using a peak correlation value of the received data and outputs the extracted identification information to the controller.

4. The receiving system of claim 1, wherein the controller outputs power on/off information of the receiving system based on the decoded transmission parameters and controls power supply of the receiving system according to the outputted power on/off information.

5. The receiving system of claim 1, wherein the data group further comprises main service data, wherein the data group comprises a plurality of first segments including the mobile service data and the main service data, a plurality of second segments not including the main service data, and a plurality of third segments including the plurality of known data sequences, and wherein, among the plurality of first segments, an $N^{th}$ segment includes a maximum of y number of consecutive mobile service data bytes, and wherein an $N+m^{th}$ segment includes a maximum of x number of consecutive mobile service data bytes, and wherein $y \neq x$ and $m > 0$.

6. A method of processing data in a receiving system, the method comprising:

receiving, by a signal receiving unit, a broadcast signal including a data group, the data group comprising mobile service data, transmission parameters related to the mobile service data, and a plurality of known data sequences;

detecting, by a known data detector, the plurality of known data sequences from the data group, wherein at least two of the plurality of known data sequences have different lengths, wherein initialization data are positioned at a beginning portion of at least one known data sequence, and wherein the initialization data being used to initialize memories within a trellis encoder of a transmitting system are trellis-encoded;

decoding the received transmission parameters inserted between the plurality of known data sequences;

compensating for channel distortion of the broadcast signal using at least one of the plurality of detected known data sequences;

first decoding mobile service data in the channel distortion-compensated broadcast signal by block units based upon the decoded transmission parameters;

building a Reed-Solomon (RS) frame by collecting the first-decoded mobile service data and correcting at least one error in the RS frame based upon the decoded transmission parameters, wherein the RS frame comprises an RS frame payload including the first-decoded mobile service data, RS parity data added at bottom ends of columns of the RS frame payload, and Cyclic Redundancy Check (CRC) data added at right ends of rows of the RS frame payload including the RS parity data; and controlling power supply of the receiving system to receive the data group including the mobile service data based on the decoded transmission parameters.

7. The method of claim 6, wherein controlling the power comprises:

controlling the power supply of the receiving system by using identification information for identifying the data group.

8. The method of claim 7, wherein detecting the plurality of known data sequences comprises:

extracting the identification information to identify the data group from the broadcast signal by using a peak correlation value of the received data; and outputting the extracted identification information to control the power supply of the receiving system.

9. The method of claim 6, wherein controlling the power comprises:

outputting power on/off information of the receiving system based on the decoded transmission parameters; and controlling the power supply of the receiving system according to the outputted power on/off information.

10. The method of claim 6, wherein the data group further comprises main service data, wherein the data group comprises a plurality of first segments including the mobile service data and the main service data, a plurality of second segments not including the main service data, and a plurality of third segments including the known data sequences, and wherein, among the plurality of first segments, an $N^{th}$ segment includes a maximum of y number of consecutive mobile service data bytes, and wherein an $N+m^{th}$ segment includes a maximum of x number of consecutive mobile service data bytes, and wherein $y \neq x$ and $m > 0$.

* * * * *